(12) United States Patent
Bulucea

(10) Patent No.: US 7,579,642 B1
(45) Date of Patent: *Aug. 25, 2009

(54) GATE-ENHANCED JUNCTION VARACTOR

(75) Inventor: Constantin Bulucea, Milpitas, CA (US)

(73) Assignee: National Semiconductor Corporation, Santa Clara, CA (US)

(*) Notice: Subject to any disclaimer, the term of this patent is extended or adjusted under 35 U.S.C. 154(b) by 434 days.

This patent is subject to a terminal disclaimer.

(21) Appl. No.: 11/407,025

(22) Filed: Apr. 18, 2006

Related U.S. Application Data

(63) Continuation of application No. 09/903,059, filed on Jul. 10, 2001, now Pat. No. 7,235,862.

(51) Int. Cl.
*H01L 27/108* (2006.01)
*H01L 29/94* (2006.01)
(52) U.S. Cl. ............... 257/303; 257/595; 257/E27.049
(58) Field of Classification Search ............... 257/303, 257/595, E27.049
See application file for complete search history.

(56) References Cited

U.S. PATENT DOCUMENTS

| 4,003,009 | A | | 1/1977 | Watanabe | 334/15 |
|---|---|---|---|---|---|
| 4,529,994 | A | | 7/1985 | Sakai | 357/14 |
| 4,754,310 | A | * | 6/1988 | Coe | 257/287 |
| 5,399,893 | A | | 3/1995 | Weitzel et al. | 257/355 |
| 5,497,028 | A | | 3/1996 | Ikeda et al. | 257/531 |
| 5,504,376 | A | | 4/1996 | Sugahara et al. | 257/768 |
| 5,659,185 | A | | 8/1997 | Iwamuro | 257/138 |
| 5,977,591 | A | | 11/1999 | Fratin et al. | 257/344 |
| 6,100,770 | A | | 8/2000 | Litwin et al. | 331/117 |
| 6,165,902 | A | | 12/2000 | Pramanick et al. | 438/653 |
| 6,166,404 | A | | 12/2000 | Imoto et al. | 257/279 |
| 6,172,378 | B1 | * | 1/2001 | Hull et al. | 257/14 |
| 6,455,902 | B1 | | 9/2002 | Voldman | 257/378 |
| 6,521,506 | B1 | * | 2/2003 | Coolbaugh et al. | 438/379 |
| 6,667,506 | B1 | * | 12/2003 | Reedy et al. | 257/314 |
| 6,943,399 | B1 | * | 9/2005 | Gau | 257/312 |
| 6,949,440 | B2 | * | 9/2005 | Gau | 438/379 |
| 7,078,787 | B1 | * | 7/2006 | Bulucea | 257/595 |
| 7,081,663 | B2 | * | 7/2006 | Bulucea | 257/595 |
| 7,235,862 | B2 | * | 6/2007 | Bulucea | 257/595 |
| 2002/0036311 | A1 | | 3/2002 | Hattori | 257/302 |
| 2003/0052388 | A1 | * | 3/2003 | Mheen et al. | 257/595 |
| 2003/0085449 | A1 | * | 5/2003 | Adler | 257/595 |
| 2003/0178689 | A1 | | 9/2003 | Maszara et al. | 257/407 |

FOREIGN PATENT DOCUMENTS

| JP | 4-199682 | 7/1992 |
|---|---|---|
| JP | 6-61446 | 3/1994 |

(Continued)

OTHER PUBLICATIONS

Sedra et al., *Microelectronic Circuits* (4th ed., Oxford Univ. Press), 1998, p. 382.

(Continued)

*Primary Examiner*—Marcos D. Pizarro
*Assistant Examiner*—Igwe U. Anya
(74) *Attorney, Agent, or Firm*—Ronald J. Meetin

(57) ABSTRACT

A semiconductor junction varactor utilizes gate enhancement for enabling the varactor to achieve a high ratio of maximum capacitance to minimum capacitance.

50 Claims, 19 Drawing Sheets

FOREIGN PATENT DOCUMENTS

JP          7-226643         8/1995

OTHER PUBLICATIONS

Andreani et al., "A 1.8-GHZ CMOS VCO Tuned by an Accumulation-Mode MOS Varactor," IEEE Intl. Symposium on Circuits and Systems, May 28-31, 2000, pp. I-315-I-318.

Grove, *Physics and Technology of Semiconductor Devices* (John Wiley & Sons), 1967, pp. 263-305.

Grove et al., "Effect of Surface Fields on the Breakdown Voltage of Planar Silicon *p-n* Junction," *IEEE Trans. Electron Devices*, vol. ED-14, 1967, pp. 157-162.

Grove et al., "Surface Effects on *p-n* Junctions: Characteristics of Surface Space-Charge Regions Under Non-Equilibrium Conditions," *Solid-State Electronics*, vol. 9, 1966, pp. 783-806.

Kral et al., "RF-CMOS Oscillators with Switched Tuning," *Procs. IEEE Custom Integrated Circuits Conference*, 1998, pp. 555-558.

Lee, *The Design of CMOS Radio-Frequency Integrated Circuits* (Cambridge Univ. Press), 1998, p. 37-41 and 504-514.

McMahon et al., "Voltage-Sensitive Semiconductor Capacitors," *1958 IRE Wescon Conf. Rec.*, Part 3, Aug. 19-22, 1958, pp. 72-82.

Moll, "Variable Capacitance With Large Capacity Change," *IRE Wescon Conf. Rec.*, vol. 3, 1959, pp. 32-36.

Ng, *Complete Guide to Semiconductor Devices* (McGraw Hill), 1995, pp. 11-22.

Razavi, *Design of Analog CMOS Integrated Circuits* (McGraw Hill), 2001, pp. 495-525.

Rusu et al., "Deep-Depletion Breakdown Voltage of Silicon-Dioxide/Silicon MOS Capacitors," *IEEE Trans. Elec. Devs.*, Mar. 1979, pp. 201-205.

Rusu et al., "Reversible Breakdown Voltage Collapse in Silicon Gate-Controlled Diodes," *Solid-State Electronics*, vol. 23, 1980, pp. 473-480.

Svelto et al., "A Three Terminal Varactor for RF IC's in Standard CMOS Technology," *IEEE Transactions on Electron Devices*, vol. 47, 2000, pp. 893-895.

Warner et al., *Transistors—Fundamentals for the Integrated-Circuit Engineer* (John Wiley & Sons), 1983, pp. 320-321.

Wong et al., "A Wide Tuning Range Gated Varactor," *IEEE J. Solid State Circs*, May 2000, pp. 773-779.

\* cited by examiner

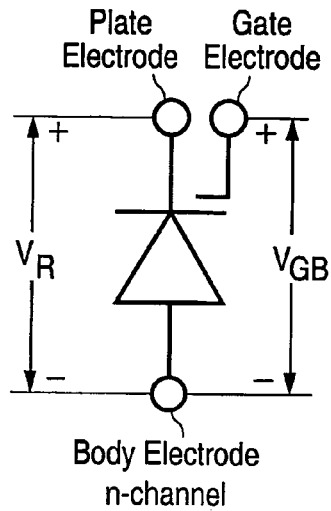
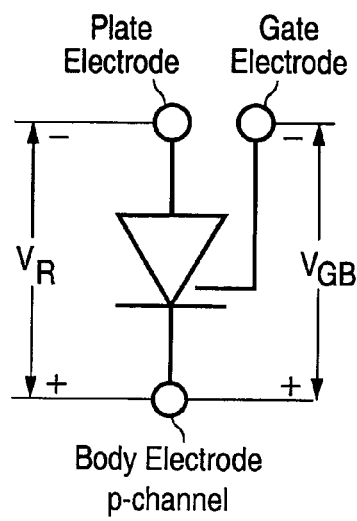
Fig. 11a
Fig. 11b
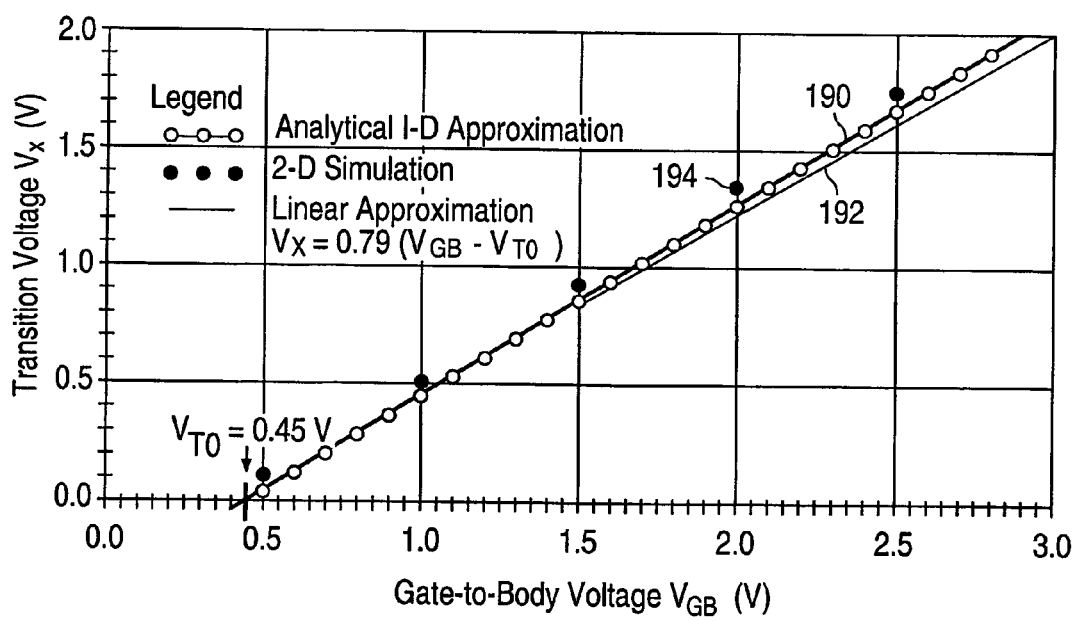
Fig. 12

GATE-ENHANCED JUNCTION VARACTOR

CROSS-REFERENCE TO RELATED APPLICATION

This is a continuation of U.S. patent application Ser. No. 09/903,059, filed 10 Jul. 2001, now U.S. Pat. No. 7,235,862 B2.

This invention relates to varactors. More particularly, this invention relates to varactors provided in, and/or utilized with, semiconductor integrated circuits.

BACKGROUND ART

A varactor is a variable capacitor, i.e., a capacitor whose capacitance can be changed as a function of one or more control signals. The term "varactor" is derived from "variable" and "reactor", and means a device whose reactance can be varied in a controlled manner. The term "varicap", derived from "variable" and "capacitor", is also used to describe such a device.

Varactors are employed in various parts of electronic systems. For example, varactors are utilized in voltage-controlled oscillators ("VCOs") of wireless communications systems. A VCO generates a local oscillator signal for use in performing heterodyne frequency conversion in transceiver circuitry of a wireless communication system. The frequency of the oscillator signal changes as a function of a control voltage. In a VCO, one or more varactors provide the variable capacitance of an inductive-capacitive combination that establishes the frequency of the oscillator signal.

FIG. 1 illustrates a conventional differential cross-coupled VCO connected between ground and a source of positive supply voltage $V_{DD}$. The VCO in FIG. 1 consists of identical cross-coupled n-channel enhancement-mode insulated-gate field-effect transistors ("FETs") QA and QB, identical fixed-value inductors LA and LB, current source IA, and identical varactors CA and CB. The VCO's oscillator signal, taken from the drain of FET QA or QB, is provided at variable oscillator frequency $f_O$ given as:

$$f_o = \frac{1}{2\pi\sqrt{L_o C_o}} \quad (1)$$

where $L_O$ is the fixed inductance of each of inductors LA and LB, and $C_O$ is the variable alternating-current ("AC") capacitance of each of varactors CA and CB. A control voltage (not shown) is applied to varactors CA and CB to control the value of capacitance $C_O$ and thus oscillator frequency $f_O$.

FIG. 2a depicts a conventional single-ended Colpitts VCO formed with n-channel enhancement-mode insulated-gate FET QC, fixed-value inductor LC, current source IC, fixed-value capacitor CC, and varactor CE. A differential version of the single-ended VCO of FIG. 2a is depicted in FIG. 2b. The VCO in FIG. 2b consists of identical common-gate n-channel insulated-gate FETs QC and QD, identical fixed-value inductors LC and LD, identical current sources IC and ID, identical fixed-value capacitors CC and CD, and varactor CF. Letting $L_O$ here represent the inductance of each of inductors LC and LD, the oscillator in each of FIGS. 2a and 2b provides an oscillator signal at variable frequency $f_O$ determined from Eq. 1 where capacitance $C_O$ is now the series combination of (a) the fixed capacitance of each of capacitors CC and CD and (b) either the variable capacitance of varactor CE or twice the variable capacitance of varactor CF. A control voltage (not shown) is applied to varactor CE or CF to control its AC capacitance and thus frequency $f_O$.

Varactors such as varactors CA, CB, CE, and CF can be implemented in various ways. A common varactor is a semiconductor junction varactor formed with a p-n diode having a reverse-biased p-n junction. A simplified example of a conventional junction varactor is shown in FIG. 3 where item 20 is a p-type body region of a semiconductor body. Moderately doped (p) material of body region 20 forms p-n junction 22 with heavily doped n-type region 24. Regions 20 and 24 respectively constitute the diode's anode and cathode.

Cathode electrode 26 contacts cathode region 24 along the upper semiconductor surface. Body electrode 28 contacts body region 20, typically through heavily doped p-type material (not separately indicated). Although body electrode 28 is illustrated as contacting body region 20 along the lower semiconductor surface in FIG. 3, electrode 28 can contact region 20 at other locations, e.g., along the upper semiconductor surface.

Reverse bias voltage $V_R$ is applied between electrodes 26 and 28 to reverse bias p-n junction 22. Since cathode region 24 is of n-type conductivity, cathode electrode 26 is at a higher voltage than body electrode 28. Junction depletion region 30 extends along p-n junction 22. Because cathode region 24 is heavily doped relative to body region 20, the thickness of body-side portion 32 of depletion region 30 is much greater, e.g., 100 times greater, than the thickness of cathode-side portion 34. As reverse voltage $V_R$ increases, the thickness of depletion region 30 increases. Only the thickness increase of body-side portion 32 is, for simplicity, indicated in FIG. 3.

Let $C_{VA}$ generally represent the AC areal capacitance, i.e., the AC capacitance per unit area, of a varactor. Junction depletion region 30, largely body-side portion 32, in the junction varactor of FIG. 3 functions as the dielectric for a capacitor in which the adjoining non-depleted p-type material of body region 20 serves as one of the capacitor's plates while the adjoining non-depleted n-type material of cathode region 24 serves as the capacitor's other plate. Areal capacitance $C_{VA}$ of the junction varactor is the AC areal junction depletion capacitance $C_{dJA}$ given as:

$$C_{VA} = C_{dJA} \quad (2)$$
$$= \frac{K_{SC}\varepsilon_0}{t_{dJ}}$$

where $\varepsilon_0$ is the permittivity of free space, $K_{SC}$ is the permittivity constant of the semiconductor material (typically silicon), and $t_{dJ}$ is the average thickness of junction depletion region 30. Inasmuch as junction depletion thickness $t_{dJ}$ increases with increasing reverse voltage $V_R$, varactor capacitance $C_{VA}$ varies as a function of voltage $V_R$ in the varactor of FIG. 3.

It is typically desirable that the ratio of the maximum value $C_{VAmax}$ of varactor capacitance $C_{VA}$ to the minimum value $C_{VAmin}$ of capacitance $C_{VA}$ be high. In cases where the p-type body material along p-n junction 22 is uniformly doped at concentration $N_B$ to at least the maximum achievable thickness of body-side depletion portion 32, junction depletion thickness $t_{dJ}$ is given approximately as:

$$t_{dJ} = \sqrt{\frac{2K_{SC}\varepsilon_0(V_R + V_{BI})}{qN_B}} \quad (3)$$

where $V_{BI}$ is the built-in voltage of p-n junction 22, and q is the electronic charge. The maximum-to-minimum varactor capacitance ratio for uniform doping in depletion portion 32 of body region 20 is thereby limited approximately to:

$$\frac{C_{VAmax}}{C_{VAmin}} = \sqrt{\frac{V_{Rmax} + V_{BI}}{V_{Rmin} + V_{BI}}} \quad (4)$$

where $V_{Rmax}$ and $V_{Rmin}$ respectively are the maximum and minimum bias values of reverse voltage $V_R$.

The varactor capacitance ratio can be increased to approximately the following value by doping the body material along p-n junction 22 in a non-uniform hyperabrupt manner so that the body dopant concentration decreases from a maximum value $N_{Bmax}$ along the bottom of depletion region 30 at its minimum thickness to a minimum value $N_{Bmin}$ along the bottom of region 30 at its maximum thickness:

$$\frac{C_{VAmax}}{C_{VAmin}} = \sqrt{\left(\frac{N_{Bmax}}{N_{Bmin}}\right)\left(\frac{V_{Rmax} + V_{BI}}{V_{Rmin} + V_{BI}}\right)} \quad (5)$$

However, improving the capacitance ratio in this way necessitates an additional masked ion implantation into the varactor area and complicates the process for manufacturing an integrated circuit containing components other than the varactor.

Another type of semiconductor varactor is a depletion insulated-gate varactor often referred to as a depletion metal-oxide semiconductor ("MOS") varactor. FIG. 4 illustrates a simplified example of a conventional depletion insulated-gate varactor created from a semiconductor body having p-type body region 40. Gate dielectric layer 42 extending along the upper semiconductor surface separates gate electrode 44 from moderately doped (p) material of body region 40. Body electrode 46, analogous to body electrode 28 in FIG. 3, contacts body region 40. Gate-to-body bias voltage $V_{GB}$, which varies across a voltage range extending from some negative value to some positive value, is applied between electrodes 44 and 46.

With gate-to-body voltage $V_{GB}$ being positive so that gate electrode 44 is at a higher voltage than body electrode 46, surface depletion region 48 forms in body region 40 along the upper semiconductor surface below gate electrode 44. The structure then functions as a capacitor having two dielectrics situated in series between gate electrode 44 and the non-depleted p-type body material underlying surface depletion region 48. One of the dielectrics is gate dielectric layer 42 having AC areal capacitance $C_{GDA}$ given as:

$$C_{GDA} = \frac{K_{GD}\varepsilon_0}{t_{GD}} \quad (6)$$

where $K_{GD}$ is the permittivity constant of dielectric layer 42, and $t_{GD}$ is the average thickness of dielectric layer 42 along electrode 44. The other dielectric is surface depletion region 48 having AC areal capacitance $C_{dsA}$ given as:

$$C_{dsA} = \frac{K_{SC}\varepsilon_0}{t_{ds}} \quad (7)$$

where $t_{ds}$ is the average thickness of surface depletion region 48. Areal capacitance $C_{VA}$ of the depletion insulated-gate varactor is the series combination of areal capacitances $C_{GDA}$ and $C_{dsA}$. Accordingly, capacitance $C_{VA}$ is given as:

$$C_{VA} = \frac{C_{GDA}}{1 + \left(\frac{K_{GD}}{K_{SC}}\right)\left(\frac{t_{ds}}{t_{GD}}\right)} \quad (8)$$

where gate dielectric capacitance $C_{GDA}$ is determined from Eq. 6. Surface depletion thickness $t_{ds}$ increases with increasing gate-to-body voltage $V_{GB}$ up to the point at which voltage $V_{GB}$ reaches a threshold value $V_{T0}$. Capacitance $C_{VA}$ thus decreases with increasing gate-to-body voltage $V_{GB}$ over the $V_{GB}$ range from zero to threshold value $V_{T0}$.

Inversion layer 50 forms in body region 40 along the upper semiconductor surface below gate electrode 44 when gate-to-body voltage $V_{GB}$ reaches threshold value $V_{T0}$. Further increase in voltage $V_{GB}$ causes the charge density in inversion layer 50 to increase. However, surface depletion thickness $t_{ds}$ remains substantially fixed at maximum value $t_{dsmax}$ in high-frequency AC operation because inversion layer 50 provides the additional charge necessitated by the $V_{GB}$ increase. Hence, varactor capacitance $C_{VA}$ remains approximately constant as voltage $V_{GB}$ rises above $V_{T0}$ in high-frequency operation. For low-frequency AC operation, recombination/regeneration effects actually cause capacitance $C_{VA}$ to rise toward gate dielectric capacitance $C_{GDA}$ as voltage $V_{GB}$ is progressively raised above $V_{T0}$. In either case, capacitance $C_{VA}$ is at minimum value $C_{VAmin}$ when voltage $V_{GB}$ is approximately $V_{T0}$.

FIG. 5 illustrates an example of how the ratio of varactor capacitance $C_{VA}$ to gate dielectric capacitance $C_{GDA}$ varies with gate-to-body bias voltage $V_{GB}$ for the depletion insulated-gate varactor of FIG. 4. Curve portions A and B in FIG. 5 respectively depict the high-frequency and low-frequency capacitance characteristics for the depletion varactor. Curve portion C represents the high-frequency capacitance characteristics for the deep depletion insulated-gate varactor of FIG. 6 discussed below.

When gate-to-body voltage $V_{GB}$ is negative in the depletion insulated-gate varactor of FIG. 4, majority carriers (holes) accumulate along the upper semiconductor surface below gate electrode 48. The thickness of surface depletion region 48 progressively decreases as voltage $V_{GB}$ is made progressively more negative, i.e., of progressively greater negative value. Varactor capacitance $C_{VA}$ becomes gate dielectric capacitance $C_{GDA}$ which is maximum varactor capacitance value $C_{VAmax}$. The maximum-to-minimum varactor capacitance ratio for the depletion varactor is approximately:

$$\frac{C_{VAmax}}{C_{VAmin}} = 1 + \frac{t_{dsmax}}{t_{GD}} \quad (9)$$

The maximum-to-minimum capacitance ratio given by Eq. 9 for the depletion varactor is considerably higher than that typically achievable with a junction varactor because maximum depletion thickness $t_{dsmax}$ which determines minimum capacitance value $C_{VAmin}$ is typically several times gate dielectric thickness $t_{GD}$ which determines maximum capacitance value $C_{VAmax}$. At state-of-the-art values for dielectric thickness $t_{GD}$, the maximum-to-minimum capacitance ratio for a depletion insulated-gate varactor can readily be 10.

A deep depletion insulated-gate varactor, often termed a deep depletion MOS varactor, is an extension of a depletion insulated-gate varactor to include a p-n junction which enables the maximum-to-minimum varactor capacitance ratio to be increased further. A simplified example of a deep depletion insulated-gate varactor is presented in FIG. 6. Except as indicated below, the deep depletion varactor in FIG. 6 contains components 40, 42, 44, and 46 arranged the same as in the depletion varactor of FIG. 4: With variable gate-to-body bias voltage $V_{GB}$ applied between electrodes 44 and 46, the capacitance of the deep depletion varactor is taken between electrodes 44 and 46 as in the depletion varactor.

In addition to components 40, 42, 44, and 46, the deep depletion insulated-gate varactor includes one or two heavily doped n-type junction regions 52. Each n+ junction region 52 forms a p-n junction 54 with body region 40 and is contacted by a junction electrode 56 along the upper semiconductor surface. Reverse bias voltage $V_R$, a fixed electrical potential here, is applied between body electrode 46 and each junction electrode 56 to reverse bias corresponding p-n junction 54. Since each junction region 52 is of n-type conductivity, each junction electrode 56 is at a higher voltage than body electrode 46. A junction depletion region 58, which normally meets surface depletion region 48, extends along each p-n junction 54.

FIG. 6 illustrates the situation in which two junction regions 52 are present in a deep depletion insulated-gate varactor. With the two regions 52 being laterally separated from each other, the structure is similar to an insulated-gate FET except that regions 52 are electrically tied together rather than serving as source and drain. When only one region 52 is present, the other region 52 is typically replaced with dielectric material that laterally electrically isolates islands of the semiconductor material along the upper semiconductor surface.

The deep depletion insulated-gate varactor of FIG. 6 operates in basically the same way as the depletion insulated-gate varactor of FIG. 4 except that the presence of junction region(s) 52 causes inversion layer 50 to occur at a greater positive value of gate-to-body voltage $V_{GB}$ than in an otherwise corresponding depletion varactor. Maximum surface depletion thickness $t_{dsmax}$ in the deep depletion varactor is thus greater than in the corresponding depletion varactor. Referring to curve C of FIG. 5, capacitance ratio $C_{VA}/C_{GDA}$ reaches a lower value with the deep depletion varactor than with the depletion varactor. Accordingly, minimum varactor capacitance value $C_{VAmin}$ reaches a lower value in the deep depletion varactor than in the depletion varactor. As a result, the deep depletion varactor achieves a higher maximum-to-minimum varactor capacitance ratio than the depletion varactor. In particular, the maximum-to-minimum capacitance ratio for a deep depletion varactor can readily be 15-20 at state-of-the-art values for gate dielectric thickness $t_{GD}$.

Wong et al ("Wong"), "A Wide Tuning Range Gated Varactor," *IEEE J. Solid-State Circs.*, May 2000, pages 773-779, describes another type of semiconductor varactor. As generally shown in FIG. 7, Wong's varactor is created from n body region 60 of a semiconductor body. Using somewhat unusual terminology, Wong's varactor includes heavily doped p-type "source" 62 and heavily doped n-type "drain" 64 laterally separated from each other along the upper semiconductor surface. Gate dielectric layer 66 separates gate electrode 68 from moderately doped n-type body material situated between source 62 and drain 64. Wong reports that the varactor capacitance is defined as the capacitance looking into the drain node.

Wong's varactor is operated in two modes with source voltage $V_S$ being ground reference (0 volt) in both modes. In one mode, drain voltage $V_D$ is also at ground while gate voltage $V_G$ is variable. Surface depletion region 70 extends along the upper semiconductor surface below gate electrode 68 and meets drain 64. Surface depletion region 70 merges into junction depletion region 72 extending along the p-n junction between body region 60 and source 62. Reducing gate voltage $V_G$ in this mode causes the thickness of composite depletion region 70/72 to increase so that the varactor capacitance decreases. In the second mode, gate voltage $V_G$ is at ground while drain voltage $V_D$ is variable. Increasing drain voltage $V_D$ causes the thickness of junction depletion region 72 to increase, thereby reducing the varactor capacitance. Inversion along the upper semiconductor surface below gate electrode 68 limits the maximum thickness of junction depletion region 72 and thus the minimum varactor capacitance in this mode.

Wong reports maximum and minimum capacitance values which appear to yield a maximum-to-minimum varactor capacitance ratio of 3-4. This varactor capacitance ratio is relatively low and, in fact, is lower than that typically achievable with either of the depletion insulated-gate varactors described above. As in the other varactors described above, the maximum-to-minimum capacitance ratio in Wong is determined primarily by the device metallurgical structure and is largely not independently controllable by the circuit designer.

Switched-capacitor varactors are employed in some applications. Although a high maximum-to-minimum varactor capacitance ratio can be achieved with a switched-capacitor varactor, it typically occupies a large semiconductor layout area. Switched-capacitor varactors require switching control and thus are also relatively complex.

It would be desirable to have a varactor which is of relatively simple design and which can readily achieve a high maximum-to-minimum varactor capacitance ratio. It would also be desirable to be able to change the maximum-to-minimum varactor capacitance ratio by appropriately adjusting certain lateral varactor layout dimensions.

GENERAL DISCLOSURE OF THE INVENTION

The present invention furnishes a semiconductor junction varactor that employs gate enhancement for enabling the varactor to achieve a high ratio of maximum varactor capacitance to minimum varactor capacitance. The maximum-to-minimum capacitance ratio for the present gate-enhanced junction varactor can easily be well in excess of 10. More particularly, the present varactor can readily achieve a maximum-to-minimum capacitance ratio in the vicinity of 20 or more. The varactor of the invention is of relatively simple design. No special processing techniques are needed to fabricate the present varactor. Consequently, it can be fabricated according to a semiconductor manufacturing process having a capability for providing p-n diodes and insulated-gate FETs.

Importantly, the maximum-to-minimum capacitance ratio for the gate-enhanced junction varactor of the invention depends on the amount of gate enhancement, a feature determined by the varactor's lateral dimensions. Accordingly, the maximum-to-minimum capacitance ratio can be set to achieve a specific value by appropriately selecting the varactor's lateral dimensions. The present varactor can thereby be readily incorporated into a general methodology for laying out and fabricating integrated circuits. In addition, the lateral area occupied by the varactor of the invention is small compared to that occupied by an otherwise comparable switched-capacitor varactor.

More particularly, a varactor configured according to the invention contains a plate region and a body region of a semiconductor body. The plate and body regions are of opposite conductivity type and meet each other to form a p-n junction. A dielectric layer is situated over the semiconductor body and contacts the body region. A gate electrode is situated over the dielectric layer at least where the dielectric layer contacts material of the body region. Plate and body electrodes are respectively connected to the plate and body regions.

The capacitance of the present gate-enhanced junction varactor is taken between the plate and body electrodes. A suitable plate-to-body bias voltage of a variable magnitude is applied between the plate and body electrodes so that the p-n junction is not conductively forward biased. The p-n junction is normally reversed biased over the large majority of the range across which the plate-to-body voltage varies. A junction depletion region extends along the p-n junction. With a suitable gate-to-body bias voltage applied between the gate and body electrodes, a surface depletion region is formed in the body region below the gate electrode and merges with the junction depletion region. The gate-to-body voltage is controlled in such a way that an inversion layer forms in the surface depletion region at a certain value of the plate-to-body voltage. The inversion layer disappears when the plate-to-body voltage is appropriately adjusted in a specified (positive or negative) manner.

One capacitor plate of the present varactor consists essentially of the undepleted material of the body region. When the plate-to-body voltage is of such a value that the inversion layer is present, the inversion layer combines with the undepleted material of the plate region to form a second capacitor plate of relatively large area. The surface and junction depletion regions together form the capacitor dielectric. The varactor's capacitance is then relatively large.

Upon adjusting the plate-to-body voltage so that the inversion layer disappears, the second capacitor plate is formed essentially by only the undepleted material of the plate region and thus is of relatively small area. The capacitor dielectric is now formed solely by the junction depletion region. Consequently, the varactor's capacitance is now relatively small. Adjusting the plate-to-body voltage so that the inversion layer switches between being present and absent thereby enables the capacitance of the present varactor to switch between relatively large and relatively small values.

In one aspect of the invention, the surface depletion region is spaced apart from a body contact portion of the body region. The body contact portion contacts the body electrode and is more heavily doped than the surface depletion region. The present varactor is then part of a structure that includes electronic circuitry having a capacitance signal path for receiving the varactor to enable the circuitry to perform an electronic function dependent on the varactor. The plate and body electrodes are situated in the capacitance signal path. The capacitance signal path can be extended to be an inductance-capacitance signal path. In that case, the electronic circuitry includes an inductor situated in the inductance-capacitance signal path with the plate and body electrodes to form an oscillatory inductive-capacitive combination.

In another aspect of the invention, the gate-to-body voltage is maintained approximately constant as the plate-to-body voltage is varied. The capacitance of the present varactor then changes relatively sharply as the inversion layer appears and disappears. While differing from the plate-to-body voltage, the gate-to-body voltage can also be varied as a function of the plate-to-body voltage. For example, the gate-to-body voltage can vary approximately linearly with the plate-to-body voltage. In that case, the inversion layer appears and disappears more gradually as the plate-to-body voltage varies, thereby causing the varactor's capacitance to change more gradually with the plate-to-body voltage.

The development of an implementation of the present varactor to achieve a maximum-to-minimum varactor capacitance ratio of at least a specified value involves the following steps. The present varactor is selected with the understanding that the plate region occupies a lateral plate area, the varactor's minimum capacitance depends on the plate area, the inversion layer occupies a lateral inversion area, and the varactor's maximum capacitance depends on the inversion area in combination with the plate area. The plate and inversion areas are then adjusted to control the minimum and maximum varactor capacitances. By appropriately adjusting the ratio of the inversion area to the plate region area, at least a specified value of the maximum-to-minimum capacitance ratio is attained.

In short, the gate-enhanced junction varactor of the invention readily achieves a high maximum-to-minimum varactor capacitance ratio. The varactor's maximum-to-minimum capacitance ratio can be adjusted to achieve a suitable value by simply adjusting certain lateral layout dimensions in designing the varactor. Fabrication of the present varactor can be done easily without requiring special processing techniques. Accordingly, the invention provides a large advance over the prior art.

BRIEF DESCRIPTION OF THE DRAWINGS

FIGS. 11a and 11b are diagrams of graphical symbols representing the n-channel and p-channel gate-enhanced junction varactors of the invention.

FIG. 12 is a graph of varactor transition voltage as a function of gate-to-body bias voltage for a silicon-gate implementation of the gate-enhanced junction varactor of FIGS. 8a and 8b.

Like reference symbols are employed in the drawings and in the description of the preferred embodiments to represent the same, or very similar, item or items.

DESCRIPTION OF THE PREFERRED EMBODIMENTS

General Considerations

The term "n-channel" as used here in describing a gate-enhanced junction varactor means that the varactor has a surface charge-inversion layer (or channel) in which the charge carriers are electrons. The term "p-channel" as used here in describing a gate-enhanced junction varactor similarly means that the varactor has a surface charge-inversion layer (or channel) in which the charge carriers are holes.

An electrical signal, such as a voltage (or electrical potential), generally consists of a direct-current ("DC") signal and/or an AC signal which varies with time at a frequency that may itself vary with time. The DC signal may vary with time. Any time variation of the DC signal is either not at a significant identifiable frequency or is at a frequency much lower than that of the AC signal. A bias signal, such as a bias voltage, is a DC signal employed to place parts of an electronic circuit, including a single circuit element, in a specified bias (e.g., amplifying) relationship with respect to one other.

A DC signal is generally denoted here by a reference symbol formed with an upper-case letter followed by a subscript that begins with an upper-case letter. For instance, the upper-case letter "V" followed by a subscript beginning with an upper-case letter represents a DC voltage such as a bias voltage. An AC signal is generally denoted here by a reference symbol consisting of a lower-case letter and a subscript that begins with a lower-case letter. When an electrical signal consists of both a DC signal and an AC signal, the total signal is generally denoted here by a reference symbol formed with a lower-case letter followed by a reference symbol beginning with an upper-case letter where, aside from the upper-case/lower-case distinction, the reference symbols for the total signal, the DC signal, and the AC signal all begin with the same letter and where, again aside from the upper-case/lower-case distinction, the subscripts in the reference symbols for the total, DC, and AC signals all begin with the same letter.

Gate-Enhanced Junction Varactor Structure

Figure 8A:
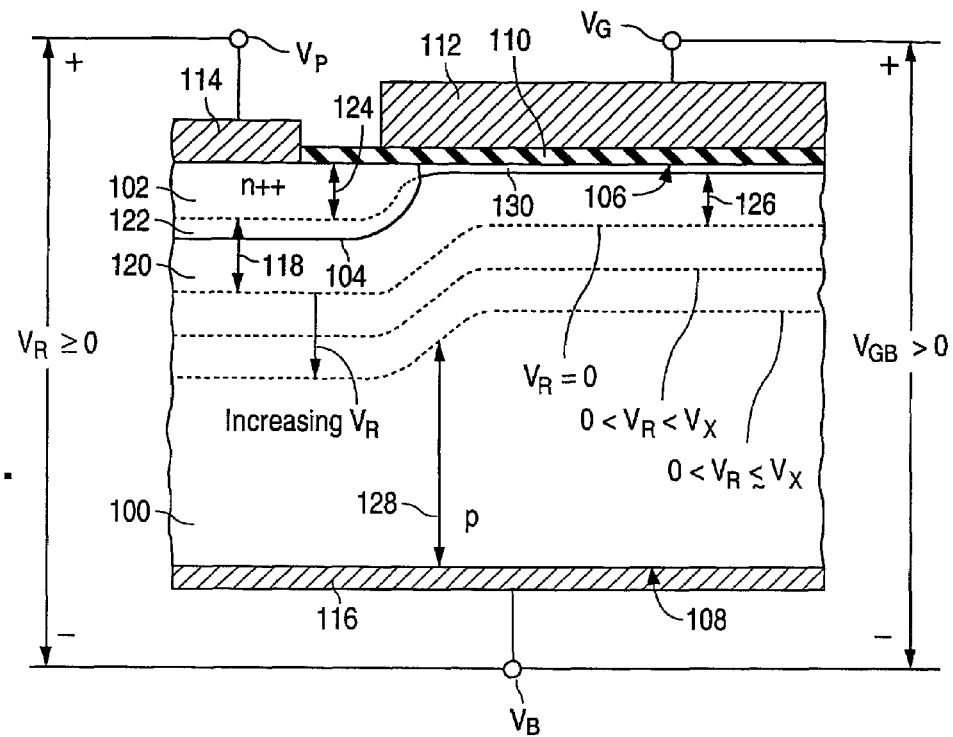
FIGS. 8a and 8b are cross-sectional side views of a general n-channel gate-enhanced junction varactor according to the invention.
Figure 8B:
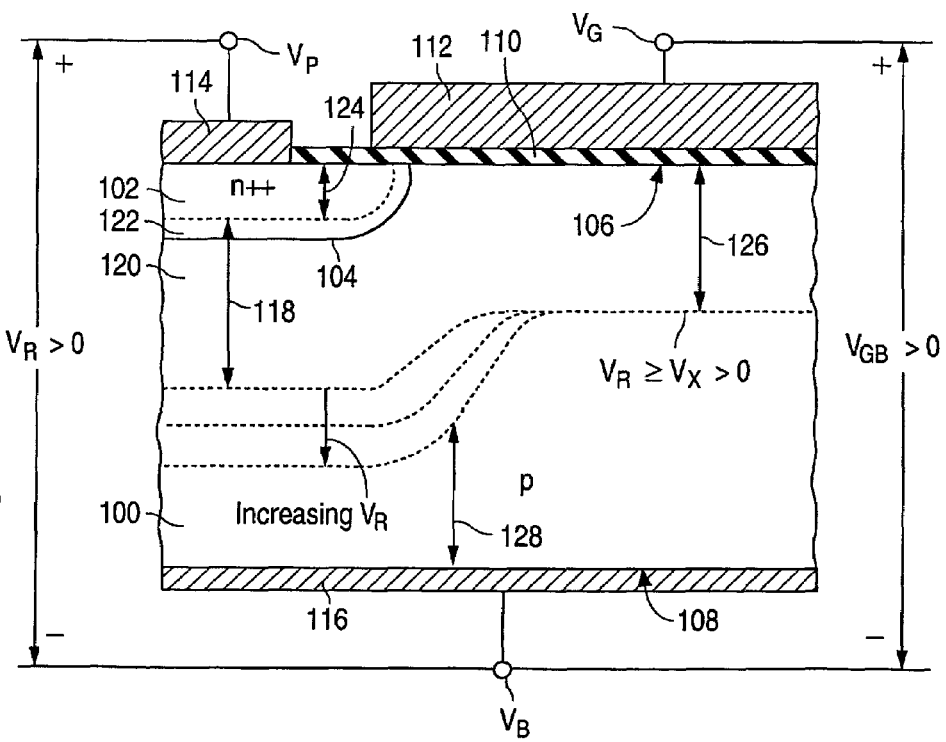

FIGS. 8a and 8b (collectively "FIG. 8") illustrate a general n-channel gate-enhanced junction varactor in accordance with the invention at two stages of varactor operation. The starting point for the n-channel junction varactor of FIG. 8 is a monocrystalline silicon ("monosilicon") semiconductor body having a p-type body region 100. An n-type plate region 102 of the semiconductor body meets moderately doped (p) material of body region 100 to form a p-n junction 104.

The semiconductor body has opposite first and second primary surfaces 106 and 108 referred to here respectively as the upper and lower semiconductor surfaces. Plate region 102 extends along upper semiconductor surface 106. Moderately doped material of body region 100 extends to upper surface 106 to the side of plate region 102. Accordingly, p-n junction 104 reaches upper surface 106. FIG. 8 depicts body region 100 as extending to lower semiconductor surface 108. However, the semiconductor body can be arranged so that n-type material fully underlies body region 100 and thus that region 100 does not extend to lower surface 108.

Plate region 102 is illustrated in FIG. 8 as being very heavily doped but can be differently constituted. For instance, plate region 102 may consist of a very heavily doped main portion and a more lightly doped lateral extension that extends to a side segment of p-n junction 104. In addition to, or in place of, such a more lightly doped lateral extension, region 102 may include a more lightly doped vertical extension that extends to a bottom segment of junction 104 to define a vertically graded junction. While the lateral or vertical extension is more lightly doped than the main plate portion, the lateral or vertical extension is normally more heavily doped than the adjoining material of body region 100.

A gate dielectric layer 110, typically consisting primarily of thermally grown silicon oxide, extends along upper semiconductor surface 106 above where body region 100 reaches upper surface 106 and also above part of plate region 102. A gate electrode 112 is situated on gate dielectric layer 110 and is electrically insulated from the semiconductor body by layer 110. Gate electrode 112 is located above where body region 100 reaches upper surface 106. Electrode 112 may consist of metal or/and conductively doped polycrystalline semiconductor material, typically polycrystalline silicon ("polysilicon"). Doped polycrystalline semiconductor material of electrode 112 is normally of the same conductivity type as plate region 102.

A plate electrode 114 electrically contacts plate region 102 along upper semiconductor surface 106. A body electrode 116 electrically contacts body region 100. The contact between body electrode 116 and body region 100 is typically made through one or more heavily doped body contact portions (not separately shown here) of region 100. For simplicity, FIG. 8 illustrates body electrode 116 as contacting region 100 along lower semiconductor surface 108. As indicated below, body electrode 116 normally contacts region 100 along upper surface 106. Electrodes 114 and 116 normally consist of metal but may include metal silicide along the surface areas where they contact the semiconductor body.

Varactor plate-to-body bias voltage $V_R$ is applied between plate electrode 114 and body electrode 116 by applying a DC plate voltage $V_P$ and a DC body voltage $V_B$ respectively to electrodes 114 and 116. Plate-to-body voltage $V_R$ is specifically defined as:

$$V_R = V_P - V_B \tag{10}$$

where plate voltage $V_P$ and body voltage $V_B$ are defined relative to an arbitrary reference point such as ground potential (again, 0 V).

The structure of FIG. 8 functions as a varactor in accordance with the invention when p-n junction 104 is not forward biased so as to conduct significantly. Accordingly, the magnitude and polarity of plate-to-body voltage $V_R$ are controlled such that junction 104 is either reversed biased or is forward biased but below the threshold point for significant conduction. When junction 104 is reverse biased, plate voltage $V_P$ is at a higher DC electrical potential than body voltage $V_B$ since plate region 102 is of n-type conductivity. Plate-to-body voltage $V_R$ is then positive.

When p-n junction 104 is forward biased below the threshold conductive point, plate-to-body voltage $V_R$ is negative but exceeds a negative junction threshold value $V_{R0}$ at which junction 104 first becomes significantly forwardly conductive. Negative junction threshold value $V_{R0}$ generally equals $-V_F$ where $V_F$ is the forward voltage drop of 0.6-0.7 V at which a p-n junction, i.e., junction 104 here, becomes significantly conductive in the forward direction. Hence, junction threshold value $V_{R0}$ is normally −0.6−−0.7 V, typically −0.7 V. Overall, voltage $V_R$ is controlled so as to be greater than negative junction threshold value $V_{R0}$.

With body voltage $V_B$ applied to body electrode 116, gate-to-body bias voltage $V_{GB}$ is applied between gate electrode 112 and body electrode 116 by applying a DC gate voltage $V_G$ to gate electrode 112. Gate-to-body voltage $V_{GB}$ is specifically defined as:

$$V_{GB} = V_G - V_B \tag{11}$$

where gate voltage $V_G$ is defined relative to the same arbitrary reference point, e.g., ground, as plate voltage $V_P$ and body voltage $V_B$. Gate-to-body voltage $V_{GB}$ is generally at least zero and is normally positive. As discussed further below, voltage $V_{GB}$ is normally substantially constant or is controlled as a function of plate-to-body voltage $V_R$.

Under the preceding conditions for bias voltages $V_R$ and $V_{GB}$, a junction depletion region 118 extends along p-n junction 104. Junction depletion region 118 consists of a body-side portion 120 and a plate-side portion 122. Because plate region 102 is very heavily doped compared to the adjoining material of body region 100, body-side depletion portion 120 is of much greater average thickness, e.g., 100 times greater average thickness, than plate-side depletion portion 122. As discussed further below, the thicknesses of depletion portions 120 and 122 change during varactor operation. Only the thickness change in body-side depletion portion 120 is, for simplicity, illustrated in FIG. 8. Item 124 in FIG. 8 indicates the undepleted n-type material of plate region 102.

A surface depletion region 126 is formed in body region 100 along upper semiconductor surface 106 below gate electrode 112. Surface depletion region 126 merges with junction depletion region 118, i.e., with depletion portions 120 and 122, to form a composite depletion region 118/126. As described below, each of the one or more portions of body region 100 along which body electrode 116 contacts region 100 is more heavily doped than, and spaced apart from, composite depletion region 118/126. In particular, surface depletion region 126 is typically spaced apart from each body contact portion along upper semiconductor surface 106. Item 128 in FIG. 8 indicates the undepleted p-type material of body region 100.

The capacitance of the gate-enhanced junction varactor of FIG. 8 is taken between plate electrode 114 and body electrode 116. When the varactor is employed in electronic circuitry having a capacitance signal path for receiving the varactor, electrodes 114 and 116 therefore lie in the capacitance path. Accordingly, body region 100 and plate region 102 are in the capacitance signal path. Gate electrode 112 is outside the capacitance signal path. Depletion regions 118 and 124 variously serve as capacitive dielectric for the varactor.

The varactor of FIG. 8 operates in the following way. The relationship between bias voltages $V_R$ and $V_{GB}$ is typically controlled so that gate-to-body voltage $V_{GB}$ is at an initial bias value $V_{GBi}$ sufficient to produce an inversion condition in the body material along upper semiconductor surface 106 below gate electrode 112 when plate-to-body voltage $V_R$ is zero. Letting $V_{T0}$ be the threshold value of voltage $V_{GB}$ at which inversion onsets when plate-to-body voltage $V_R$ is zero, initial gate-to-body value $V_{GBi}$ is greater than or equal to zero-point gate threshold value $V_{T0}$. The inversion condition is represented in FIG. 8a by an inversion layer 130 that extends along upper surface 106 below gate dielectric layer 110 and gate electrode 112 to meet plate region 102. The varactor of FIG. 8 then operates across a $V_R$ range in which plate-to-body voltage $V_R$ varies from a minimum value $V_{Rmin}$ in the vicinity of zero to a suitable positive maximum value $V_{Rmax}$.

Inversion layer 130 is of the same conductivity type, n-type, as plate region 102. Hence, the charge carriers in inversion layer 130 are electrons, the majority charge carriers in region 102. Layer 130 normally has a thickness in the vicinity of 1-10 nm. When gate dielectric layer 110 is approximately 4 nm thick, inversion layer 130 reaches a maximum electron concentration approximately 1 nm below dielectric layer 110. The thickness of inversion layer 130 is then approximately 3 nm.

The relationship between voltages $V_R$ and $V_{GB}$ can be controlled so that gate-to-body voltage $V_{GB}$ is at initial value $V_{GBi}$ to produce the inversion condition when plate-to-body voltage $V_R$ is at a value $V_{Ri}$ which is slightly positive or slightly negative, i.e., non-zero. In that case, initial gate-to-body value $V_{GBi}$ is greater than or equal to the general threshold value $V_T$ of gate-to-body voltage $V_{GB}$ at which inversion onsets when plate-to-body voltage $V_R$ is at non-zero value $V_{Ri}$, general gate threshold value $V_T$ being a function of plate-to-body voltage $V_R$. When non-zero value $V_{Ri}$ is negative, value $V_{Ri}$ is a safe amount, e.g., 0.1-0.2 V above negative junction threshold voltage $V_{R0}$, again −0.6−−0.7 V at which p-n junction 104 becomes significantly forwardly conductive. For instance, value $V_{Ri}$ can readily be as low as −0.5 V. Minimum value $V_{Rmin}$ of the $V_{Rmin}$-to-$V_{Rmax}$ range across which voltage $V_R$ varies in the varactor of FIG. 8 is then normally close to value $V_{Ri}$.

When inversion layer 130 is present, the varactor of FIG. 8 has a two-part upper capacitor plate consisting of (a) undepleted material 124 of plate region 102 and (b) inversion layer 130 which is electrically connected to undepleted plate material 124. The lower capacitor plate is undepleted material 128 of body region 100. The capacitor dielectric then consists of junction depletion region 118 and surface depletion region 126. In essence, inversion layer 130 enhances the lateral size of the present junction varactor so that it achieves a larger maximum capacitive area than an otherwise equivalent junction varactor lacking the gate enhancement of the invention.

Let $C_V$ represent the present varactor's AC capacitance taken between plate electrode 114 and body electrode 116. Varactor capacitance $C_V$ depends on an accumulative combination of (a) the lateral area occupied by undepleted material 124 of plate region 102 and (b) the lateral area occupied by inversion layer 130 when it is present. As indicated in FIG. 8a, undepleted plate material 124 extends fully across plate region 102 when layer 130 is present. In this condition, capacitance $C_V$ is given approximately as:

$$C_V = K_{SC}\varepsilon_0 \left( \frac{A_P}{t_{dj}} + \frac{A_I}{t_{ds}} \right) \quad (12)$$

where $A_P$ is the lateral area occupied by plate region 102, $t_{dJ}$ is the average thickness of junction depletion region 118, $A_I$ is the lateral area occupied by inversion layer 130, and $t_{ds}$ is the average thickness of surface depletion region 126.

AC areal capacitance $C_{VA}$ of the varactor of FIG. 8 is averaged over the varactor's entire lateral capacitive area. When inversion layer 130 is present, capacitance $C_{VA}$ is thus given as:

$$C_{VA} = \frac{C_V}{A_P + A_I} \quad (13)$$
$$= \frac{K_{SC}\varepsilon_0}{(A_P + A_I)} \left( \frac{A_P}{t_{dJ}} + \frac{A_I}{t_{ds}} \right)$$

Gate-to-body voltage $V_{GB}$ is maintained approximately constant at initial value $V_{GBi}$ in one preferred implementation of the gate-enhanced varactor of FIG. 8. As plate-to-body voltage $V_R$ is raised above minimum value $V_{Rmin}$, the increase in voltage $V_R$ causes the electrical potential of undepleted material 124 of plate region 102 to increase by a corresponding amount relative to body voltage $V_B$. Accordingly, thickness $t_{dJ}$ of junction depletion region 118 increases.

The increase in plate-to-body voltage $V_R$ is applied (with slight resistive diminishment) to inversion layer 130 by way of undepleted material 124 of plate region 102. With gate-to-body voltage $V_{GB}$ being constant, thickness $t_{ds}$ of surface depletion region 126 may initially remain constant as voltage $V_R$ is raised above $V_{Rmin}$. However, a point is reached at which the electrical potential that voltage $V_R$ produces in layer 130 exceeds the electrical potential that voltage $V_{GB}$ produces in layer 130. Plate-to-body voltage $V_R$ then controls the electrical potential of layer 130 and, consequently, thickness $t_{ds}$ of depletion region 126. Further increase in voltage $V_R$ causes thickness $t_{ds}$ to increase.

Figure 6:
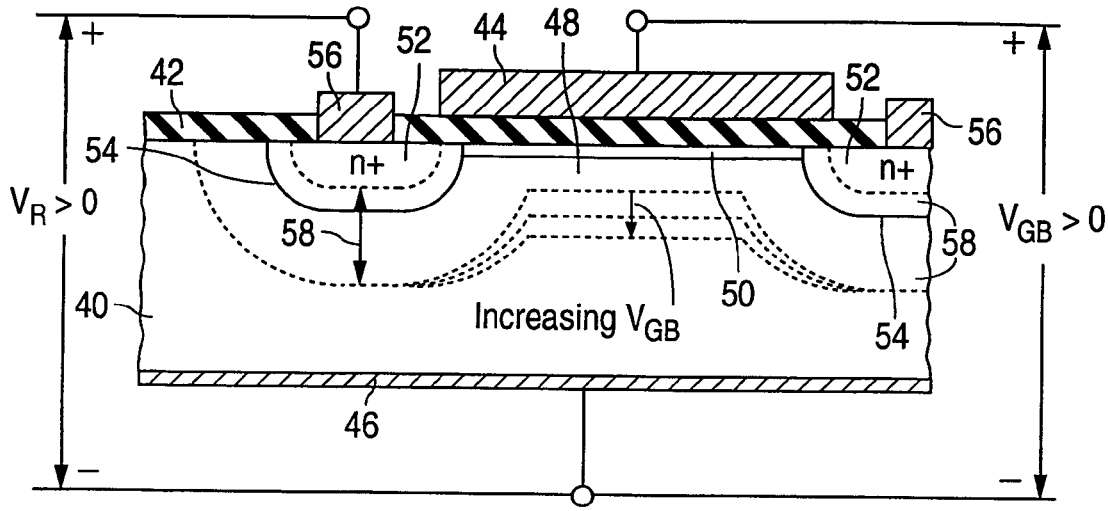
Figure 7:
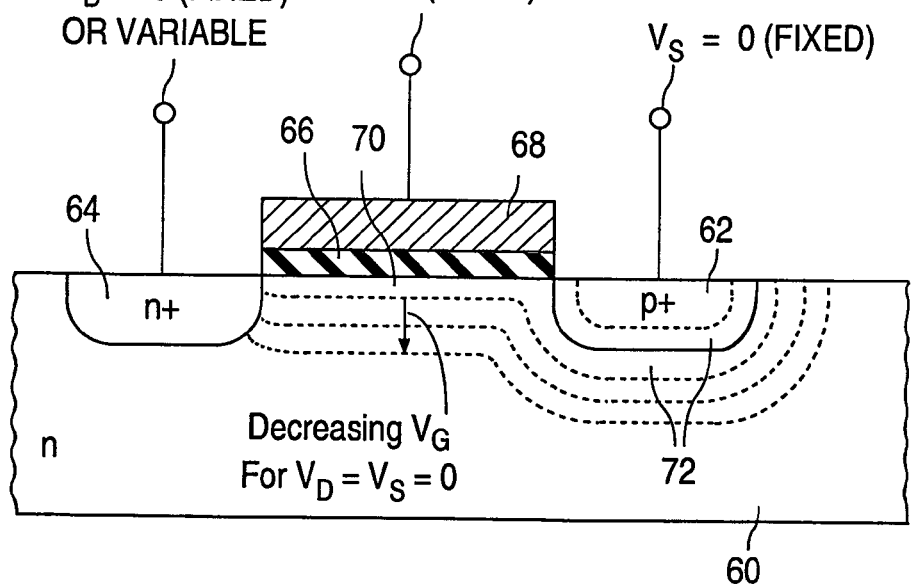

The operational phenomenon of having thickness $t_{ds}$ of surface depletion region 126 increase with increasing plate-to-body voltage $V_R$ when inversion layer 130 extends along the upper surface of body region 100 differs from the operation in the conventional deep depletion insulated-gate varactor of FIG. 6 where the onset of inversion largely prevents an increase in gate-to-body voltage $V_{GB}$ at constant reverse bias voltage $V_R$ from causing further increase in thickness $t_{ds}$ of surface depletion region 48. In the gate-enhanced junction varactor of FIG. 8, the further increase in thickness $t_{ds}$ of surface depletion region 126 in the presence of inversion layer 130 is caused by suitable increasing plate-to-body voltage $V_R$, an operational feature not present in the deep depletion varactor of FIG. 6.

With thickness $t_{dJ}$ of junction depletion region 118 increasing with increasing plate-to-body voltage $V_R$ and with thickness $t_{ds}$ of surface depletion region 126 being largely constant or increasing as voltage $V_R$ increases starting from minimum value $V_{Rmin}$, varactor capacitance $C_{VA}$ is at maximum value $C_{VAmax}$ in the varactor of FIG. 8 when inversion layer 130 is present with voltage $V_R$ at $V_{Rmin}$. Using Eq. 13, maximum capacitance $C_{VAmax}$ is given approximately as:

$$C_{VAmax} = \frac{K_{SC}\varepsilon_0}{(A_P + A_I)} \left( \frac{A_P}{t_{dJmin}} + \frac{A_I}{t_{dsmin}} \right) \quad (14)$$

where $t_{dJmin}$ and $t_{dsmin}$ respectively are the minimum values of thicknesses $t_{dJ}$ and $t_{ds}$ of junction depletion region 118 and surface depletion region 126 at voltage $V_R$ equal to $V_{Rmin}$.

As plate-to-body voltage $V_R$ increases beyond the point at which the potential produced by $V_R$ in surface depletion region 126 first exceeds the potential produced by gate-to-body voltage $V_{GB}$ in region 126, the electrons in inversion layer 130 are gradually drained to plate region 102. The vertical electric field produced by voltage $V_{GB}$ creates additional negative depletion charge in region 126 to make up for the negative charge lost to plate region 102. However, nothing of a significant qualitative nature occurs as long as electrons are still present along the top of body region 100 below gate electrode 112. Consequently, increasing voltage $V_R$ causes varactor capacitance $C_{VA}$ to decrease monotonically in the varactor of FIG. 8.

All the electrons in inversion layer 130 are drained to plate region 102 when plate-to-body voltage $V_R$ is raised sufficiently high to a transition value $V_X$. Inversion can no longer be maintained along upper semiconductor surface 106 below gate electrode 112. Inversion layer 130 disappears.

FIGS. 8a and 8b illustrate how the capacitive structure evolves as plate-to-body voltage $V_R$ is raised from minimum value $V_{Rmin}$, here depicted as zero, to a positive value greater than transition value $V_X$ at constant gate-to-body voltage $V_{GB}$. The dotted lines in FIG. 8a indicate how the thicknesses of depletion regions 118 and 126 increase as voltage $V_R$ is increased from zero to a value just below transition value $V_X$. The dotted lines in FIG. 8b indicate what happens to the thicknesses of regions 118 and 126 as voltage $V_R$ goes from transition value $V_X$ to even higher values. Transition value $V_X$ is, as discussed below, a function of gate-to-body voltage $V_{GB}$.

When inversion layer 130 disappears, the upper plate of the varactor in FIG. 8 shrinks laterally so as to consist solely of undepleted material 124 of plate region 102. In effect, layer 130 is electrically disconnected from undepleted plate material 124. The capacitor dielectric consists solely of junction depletion region 118 in the absence of layer 130.

Capacitance $C_V$ for the varactor of FIG. 8 depends on area $A_P$ of plate region 102 when inversion layer 130 is absent but not on area $A_I$ of absent layer 130. In the absence of layer 130, capacitance $C_V$ is given as:

$$C_V = \frac{K_{SC}\varepsilon_0 A_P}{t_{dJ}} \tag{15}$$

Although capacitance $C_V$ does not depend on inversion area $A_I$, areal capacitance $C_{VA}$ does depend on total capacitive area $A_P+A_I$ of the varactor. Areal capacitance $C_{VA}$ is therefore given approximately as:

$$C_{VA} = \frac{K_{SC}\varepsilon_0 A_P}{(A_P + A_I)t_{dJ}} \tag{16}$$

when layer 130 is absent.

As plate-to-body voltage $V_R$ passes through transition value $V_X$ in moving upward, areal capacitance $C_{VA}$ drops sharply from a high value $C_{VAH}$ to a low value $C_{VAL}$. Using Eqs. 13 and 16, high capacitance value $C_{VAH}$ and low capacitance value $C_{VAL}$ are respectively given as:

$$C_{VAH} = \frac{K_{SC}\varepsilon_0}{(A_P + A_I)}\left(\frac{A_P}{t_{dJX}} + \frac{A_I}{t_{dsX}}\right) \tag{17}$$

$$C_{VAL} = \frac{K_{SC}\varepsilon_0 A_P}{(A_P + A_I)t_{dJX}} \tag{18}$$

where $t_{dJX}$ and $t_{dsX}$ respectively are the values of thicknesses $t_{dJ}$ and $t_{ds}$ of junction depletion region 118 and surface depletion region 126 when voltage $V_R$ equals $V_X$. The ratio $C_{VAH}/C_{VAL}$ of the AC capacitance change that occurs when voltage $V_R$ passes through transition value $V_X$ is thus approximately:

$$\frac{C_{VAH}}{C_{VAL}} = 1 + \left(\frac{A_I}{A_P}\right)\left(\frac{t_{dJX}}{t_{dsX}}\right) \tag{19}$$

The $C_{VAH}/C_{VAL}$ transition capacitance ratio of Eq. 19 depends on the ratio of area $A_I$ of inversion layer 130 to the area $A_P$ of plate region 102 and can be made high by simply making the $A_I/A_P$ area ratio high.

When plate-to-body potential $V_R$ is closely approaching transition value $V_X$ from below so that inversion layer 130 is still present, voltage $V_R$ controls both the electrical potential in plate region 102 and the electrical potential in layer 130. The amount by which the electrical potential of layer 130 exceeds body voltage $V_B$ is approximately the same as the amount by which the electrical potential of region 102 exceeds voltage $V_B$. For a typical implementation in which the acceptor body dopant concentration is largely uniform in surface depletion region 126 and body-side portion 120 of junction depletion region 118, transition thickness $t_{dsX}$ of surface depletion region 126 approximately equals transition thickness $t_{dJX}$ of junction depletion region 118. Eq. 19 reduces simply to:

$$\frac{C_{VAH}}{C_{VAL}} = 1 + \frac{A_I}{A_P} \tag{20}$$

for uniform acceptor dopant concentration in body-side depletion portion 120 and surface depletion region 126.

Raising plate-to-body voltage $V_R$ beyond transition value $V_X$ toward maximum value $V_{Rmax}$ causes thickness $t_{dJ}$ of junction depletion region 118 to increase further. In light of Eq. 16, capacitance $C_{VA}$ decreases further for the varactor of FIG. 8. Capacitance $C_{VA}$ reaches minimum capacitance value $C_{VAmin}$ when voltage $V_R$ reaches $V_{Rmax}$. Using Eq. 16, minimum capacitance $C_{VAmin}$ for the varactor of FIG. 8 is given approximately as:

$$C_{VAmin} = \frac{K_{SC}\varepsilon_0 A_P}{(A_P + A_I)t_{dJmax}} \tag{21}$$

where $t_{dJmax}$ is the maximum value of thickness $t_{dJ}$ of junction depletion region 118 when voltage $V_R$ equals $V_{Rmax}$.

By combining Eqs. 14 and 21, the ratio of maximum varactor areal capacitance $C_{VAmax}$ to minimum varactor areal capacitance $C_{VAmin}$ for the varactor of FIG. 8 is approximately:

$$\frac{C_{VAmax}}{C_{VAmin}} = \left(\frac{t_{dJmax}}{t_{dJmin}}\right) + \left(\frac{A_I}{A_P}\right)\left(\frac{t_{dJmax}}{t_{dsmin}}\right). \tag{22}$$

Per the approximation of Eq. 22, the maximum-to-minimum varactor capacitance ratio for the present gate-enhanced junction varactor is a function of (a) the maximum-to-minimum thickness ratio $t_{dJmax}/t_{dJmin}$ for junction depletion region 118, (b) the gate-enhancement area ratio $A_I/A_P$ of inversion area $A_I$ to plate area $A_P$, and (c) the mixed gate-enhancement thickness ratio $t_{dJmax}/t_{dsmin}$ of maximum junction depletion thickness $t_{dJmax}$ to minimum surface depletion thickness $t_{dsmin}$.

Figure 1:
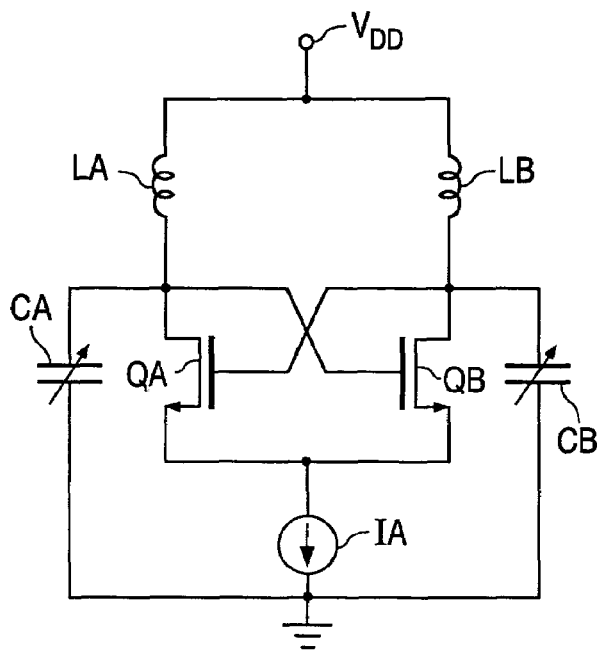
FIGS. 1, 2a, and 2b are circuit diagrams of conventional VCOs.
Figure 2A:
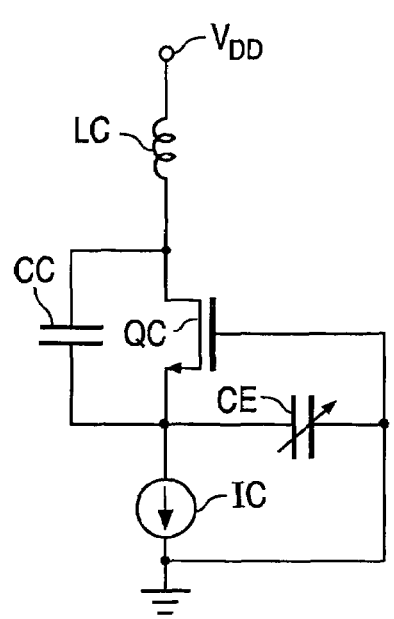
Figure 2B:
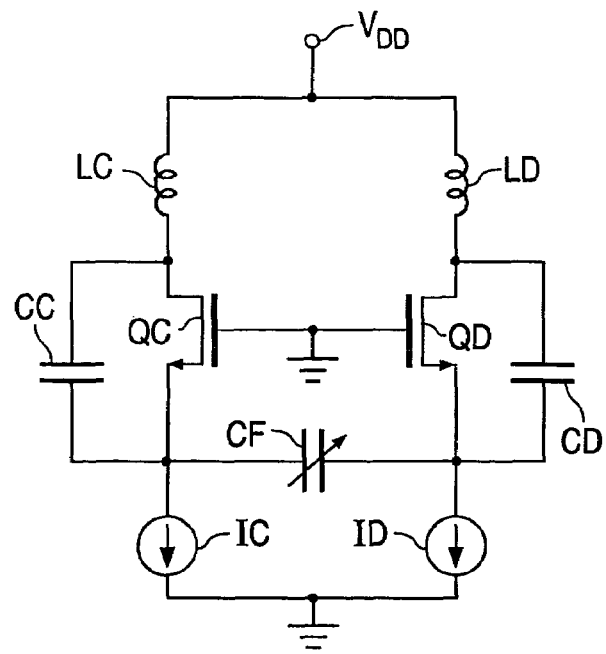
Figure 3:
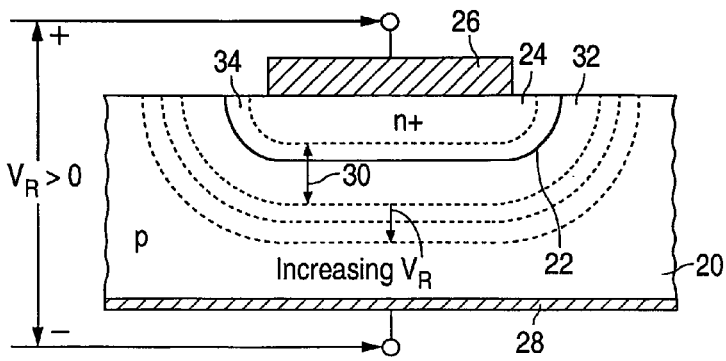
FIGS. 3, 4, 6, and 7 are cross-sectional side views of conventional varactors.
Figure 4:
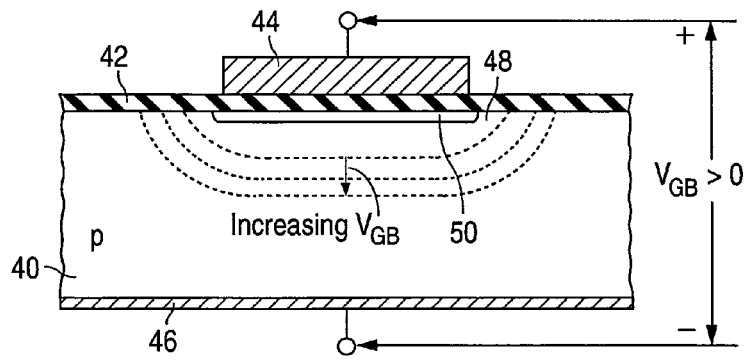
Figure 5:
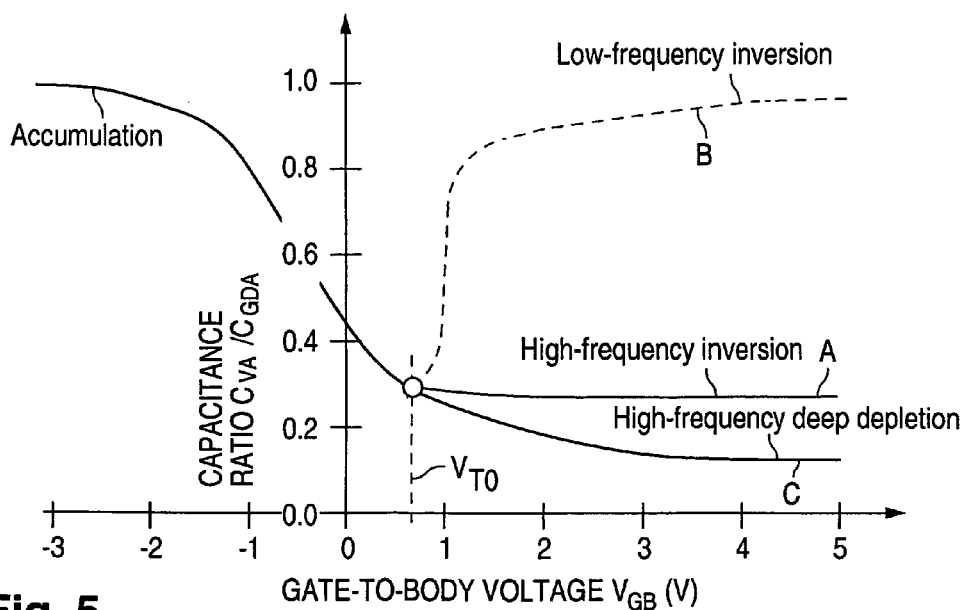
FIG. 5 is a graph of the ratio of varactor areal capacitance to gate-dielectric areal capacitance as a function of gate-to-body bias voltage for the varactors of FIGS. 4 and 6.

Thickness values $t_{dJmax}$ and $t_{dJmin}$ for junction depletion region 118 can be determined approximately from Eq. 3 presented above for the conventional junction varactor of FIG. 3. For uniform acceptor body dopant concentration $N_B$ in region 118, the maximum-to-minimum thickness ratio for region 118 is approximately:

$$\frac{t_{dJmax}}{t_{dJmin}} = \sqrt{\frac{V_{Rmax} + V_{BI}}{V_{Rmin} + V_{BI}}} \tag{23}$$

where $V_{BI}$ is the built-in voltage of p-n junction 104. The right-hand side of Eq. 23 is the maximum-to-minimum varactor capacitance ratio given by Eq. 4 for the conventional junction varactor of FIG. 3 at uniform body dopant concentration in body-side portion 32 of junction depletion region 30. If gate electrode 110 were absent so that inversion area $A_I$ is zero in the varactor of FIG. 8, the capacitance ratio given by Eq. 22 for the present gate-enhanced junction varactor would (as expected) devolve to that given by Eq. 4 for the conventional junction varactor.

In addition to the $t_{dJmax}/t_{dJmin}$ junction depletion thickness ratio, the maximum-to-minimum varactor capacitance ratio for the varactor of FIG. 8 contains, as indicated by Eq. 22, a factor $(A_I/A_P)(t_{dJmax}/t_{dsmin})$ that arises from the gate enhancement. The $t_{dJmax}/t_{dsmin}$ mixed gate-enhancement thickness ratio is greater than 1. Accordingly, the maximum-to-minimum varactor capacitance ratio for the varactor of FIG. 8 can be made quite high by choosing the $A_I/A_P$ gate-enhancement area ratio to be high.

For example, minimum surface depletion thickness $t_{dsmin}$ typically approximately equals minimum junction depletion thickness $t_{dJmin}$. Typical values for end-point voltages $V_{Rmax}$ and $V_{Rmin}$ are 2 and −0.5 V. With built-in voltage $V_{BI}$ being approximately 0.9 V, application of Eq. 23 yields a value of 2.5-3 for each of thickness ratios $t_{dJmax}/t_{djmin}$ and $t_{dJmax}/t_{dsmin}$. At a moderate $A_J/A_P$ area ratio of 4, the $C_{VAmax}/C_{VAmin}$ capacitance ratio is 10-15 for the varactor of FIG. 8. For a higher $A_J/A_P$ area ratio of 8-10, the $C_{VAmax}/C_{VAmin}$ ratio is 20-30. The varactor of FIG. 8 can achieve yet higher values of the maximum-to-minimum capacitance ratio by utilizing values of the $A_J/A_P$ area ratio in excess of 10.

Figure 9A:
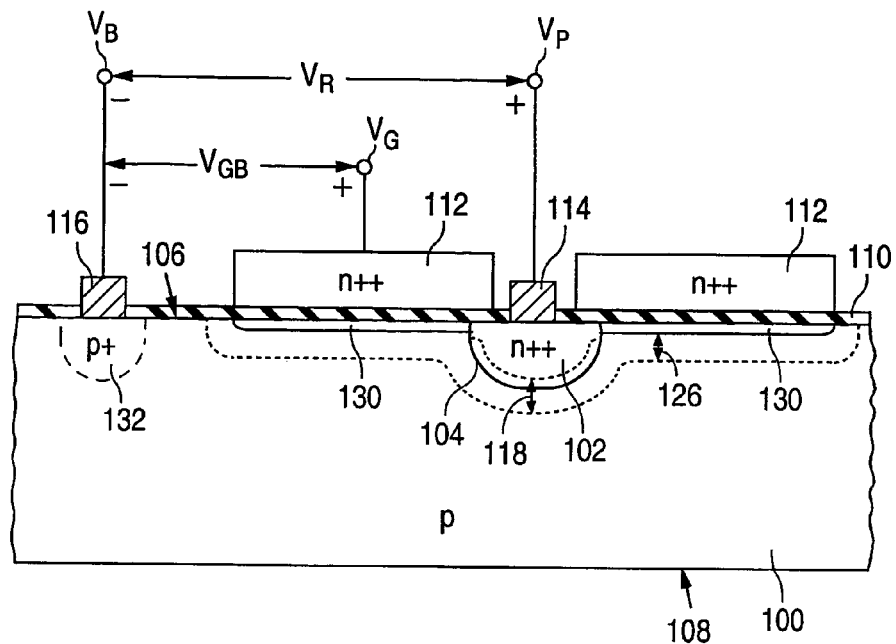
FIGS. 9a and 9b are cross-sectional side views of two silicon-gate implementations of the gate-enhanced junction varactor of FIGS. 8a and 8b.

FIG. 9a illustrates a silicon-gate implementation of the n-channel gate-enhanced junction varactor of FIG. 8 in accordance with the invention. In the implementation of FIG. 9a, body electrode 116 contacts body region 100 along upper semiconductor surface 106 through a heavily doped p-type body contact portion 132 of region 100. Body contact portion 132 is spaced laterally apart from surface depletion region 126 and also from junction depletion region 118.

Gate electrode 112 here consists of very heavily doped n-type polysilicon. Hence, gate electrode 112 is of the same conductivity type (n-type) as plate region 102. Two portions of electrode 112 are depicted in FIG. 9a. These two portions can be two laterally separated gate electrodes 112 with gate voltage $V_G$ being applied to each electrode 112. The two portions can also be connected together outside the plane of FIG. 9a to form a single, normally annular, electrode 112.

Figure 9B:
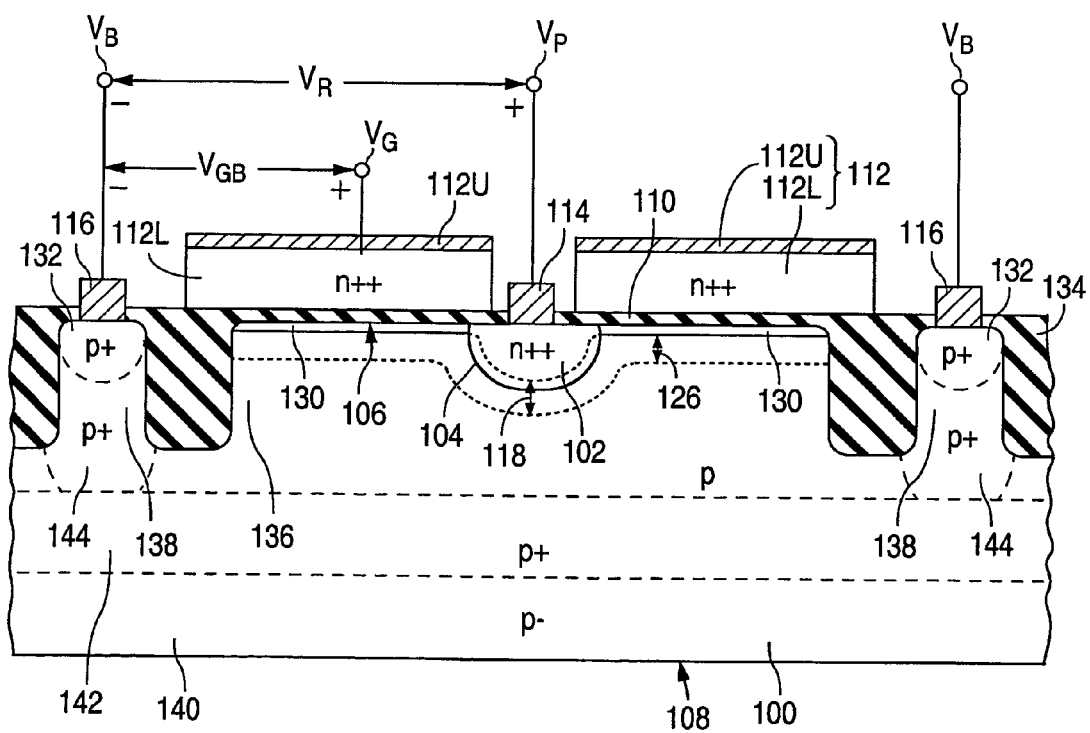

FIG. 9b illustrates another silicon-gate implementation of the n-channel gate-enhanced junction varactor of FIG. 8 in accordance with the invention. In the implementation of FIG. 9b, a field region 134 of electrically insulating material extends into the semiconductor body along upper semiconductor surface 106 to divide an upper section of the semiconductor body into a group of laterally separated islands of semiconductor material. Field insulating region 134 typically consists largely of silicon oxide but can include, or consist largely of, other electrically insulating material. Items 136 and 138 in FIG. 9b indicate two of the semiconductor islands. Plate region 102 is located in semiconductor island 136. Gate electrode 112 overlies part of island 136.

The implementation of FIG. 9b contains p+ body contact portion 132 located in semiconductor island 138. Body electrode 116 may contact body contact portion 132 at one location, or at multiple locations, along upper semiconductor surface 106. Body contact portion 132 may be implemented as a single body contact segment or as multiple laterally separated body contact segments. In either case, field insulating region 134 laterally separates the one or more segments of body contact portion 132 from depletion regions 118 and 126. Although two portions of island 138 are shown in FIG. 9b, the two island portions are usually connected together outside the plane of FIG. 9b to form a single, normally annular, island 138.

In the implementation of FIG. 9b, body region 100 includes a lightly doped p-type substrate section 140 and an optional heavily doped p-type buried layer 142. Substrate section 140 extends downward to lower semiconductor surface 108. Buried layer 142 is situated between substrate section 140 and overlying moderately doped (p) material of body region 100. Buried layer 142 is illustrated as lying below field insulating region 134 but may contact region 134. Body region 100 also includes an optional heavily doped p-type plug region 144 that extends from buried layer 142 to body contact portion 132. When p+ buried layer 142 and p+ plug portion 144 are present in the structure, they reduce the access resistance to the lower capacitor plate portion consisting of the p-type material in semiconductor island 136. This improves the varactor's quality factor.

Gate electrode 112 in the implementation of FIG. 9b consists of a lower electrode portion 112L and an upper electrode portion 112U. Lower electrode portion 112L is formed with very heavily doped n-type polysilicon. Similar to what occurs in the implementation of FIG. 9a, lower electrode portion 112L is thus of the same conductivity as plate region 102. Upper electrode portion 112U consists of metal or/and metal silicide. Similar to what was said above about gate electrode 112 in FIG. 9a, the two portions of electrode 112 shown in FIG. 9b can be connected together outside the plane of FIG. 9b to form a single, normally annular, electrode 112. The two illustrated electrode portions can also be two laterally separated gate electrodes 112.

Figure 10A:
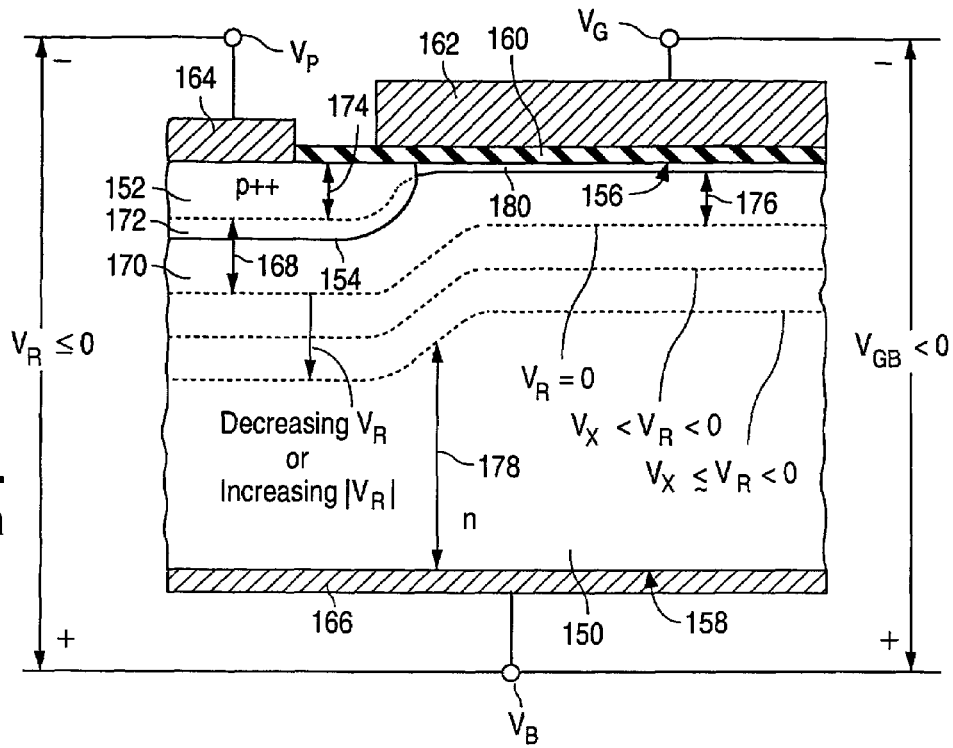
FIGS. 10a and 10b are cross-sectional side views of a general p-channel gate-enhanced junction varactor according to the invention.
Figure 10B:
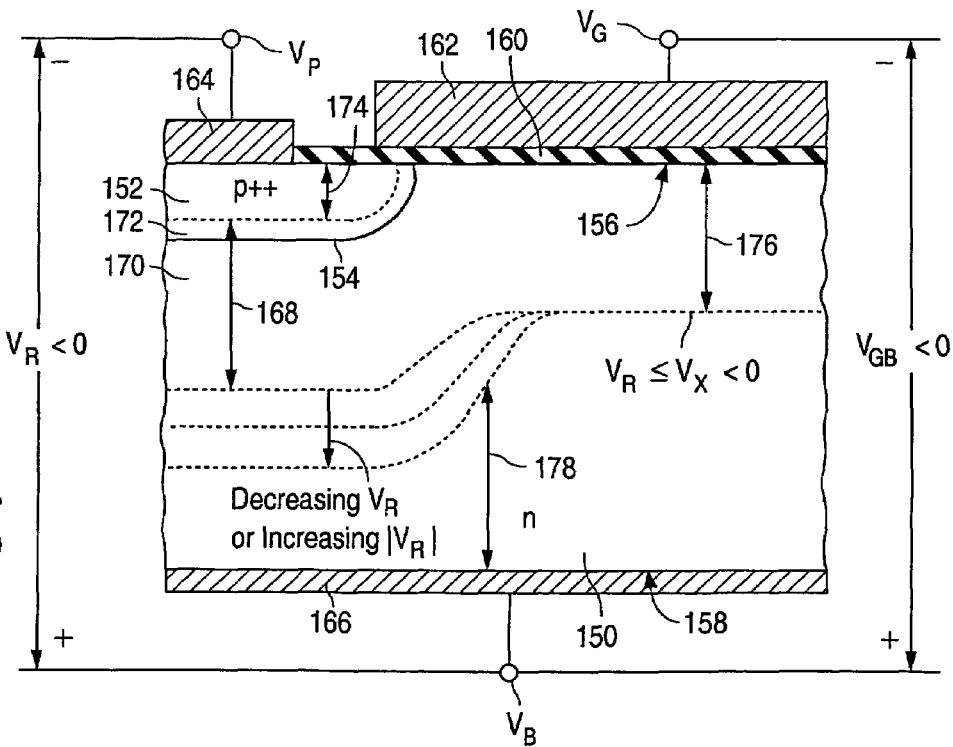

The gate-enhanced junction varactor of the present invention can be implemented in p-channel versions as well as n-channel versions. Analogous to FIG. 8, FIGS. 10a and 10b (collectively "FIG. 10") illustrate a general p-channel gate-enhanced junction varactor in accordance with the invention at two stages of varactor operation. The p-channel junction varactor of FIG. 10 is formed from a semiconductor body containing an n-type body region 150 and a very heavily doped p-type plate region 152 that meets body region 150 to form a p-n junction 154. Items 156 and 158 in FIG. 10 indicate the upper and lower surfaces of the semiconductor body.

In addition, the p-channel junction varactor of FIG. 10 contains a gate dielectric layer 160, a gate electrode 162, a plate electrode 164, a body electrode 166, a junction depletion region 168 consisting of a body-side portion 170 and a plate-side portion 172, undepleted p-type material 174 of plate region 152, a surface depletion region 176, and undepleted n-type material 178 of body region 150. An inversion layer 180, here consisting of holes, is formed along upper semiconductor surface 156 below gate dielectric layer 160 and gate electrode 162 to meet plate region 152. Voltages $V_G$, $V_P$, and $V_B$ are respectively applied to electrodes 162, 164, and 166 in the p-channel varactor of FIG. 10 to establish gate-to-body voltage $V_{GB}$ and plate-to-body voltage $V_R$ according to Eqs. 10 and 11 just as voltages $V_G$, $V_P$, and $V_B$ are applied to electrodes 112, 114, and 116 in the n-channel varactor of FIG. 8.

Components 150, 152, 154, 160, 162, 166, 168, 170, 172, 174, 176, and 178 in the p-channel varactor of FIG. 10 are respectively configured the same as components 100, 102, 104, 110, 112, 114, 116, 118, 120, 122, 124, 126, and 128 in the n-channel varactor of FIG. 8. Likewise, inversion layer 180 forms at the same relative location in the varactor of FIG. 10 as does inversion layer 130 in the varactor of FIG. 8. The operational stages of FIGS. 10a and 10b respectively correspond to the operational stages of FIGS. 8a and 8b. Subject to the voltage polarities being respectively reversed in the varactor of FIG. 10 compared to the varactor of FIG. 8 and subject to the voltage changes occurring respectively in the opposite directions in the varactor of FIG. 10 than in the varactor of FIG. 8, the p-channel varactor of FIG. 10 functions in the same way, benefits from gate enhancement in the same way, and is employed in the same way as the n-channel varactor of FIG. 8. Eqs. 12-23 thus apply directly to the p-channel varactor of FIG. 10.

FIGS. 11a and 11b illustrate electronic symbols suitable for respectively representing the n-channel and p-channel gate-enhanced junction varactors of the invention. The plus and minus signs in FIGS. 11a and 11b indicate the voltage polarities utilized during all, or nearly all, of the operation of the present n-channel and p-channel junction varactors.

Transition Voltage

Transition voltage $V_X$, the value of plate-to-body bias voltage $V_R$ at which inversion layer 130 or 180 disappears, is derived in the following manner as a function of gate-to-body voltage $V_{GB}$. The derivation of transition voltage $V_X$ is performed under the general simplifying assumptions employed in Grove, *Physics and Technology of Semiconductor Devices* (John Wiley & Sons), 1967, and does not include quantum-mechanical threshold-voltage corrections typically associated with values of gate dielectric thickness $t_{GD}$ less than 10 nm. The derivation is done here for the n-channel varactor of FIG. 8 but, with appropriate reversals in voltage polarities, applies to the p-channel varactor of FIG. 10.

The $V_X$ derivation is done for a stripe-type (rectangular) geometry rather than an annular or other three-dimensional geometry. That is, device characteristics are assumed to vary in two directions (or dimensions), namely, the vertical direction and one of the remaining two orthogonal directions, but not in the other of the remaining two orthogonal directions. The results of the derivation are qualitatively applicable to an annular geometry and are quantitatively applicable to an annular geometry for situations in which the radii of curvature in the annular geometry are much greater than the gate-dielectric and depletion-region thicknesses involved in the electric-field determinations.

Assume that acceptor dopant concentration $N_B$ in the body material that forms surface depletion region 126 and body-side portion 120 of junction depletion region 118 in the varactor of FIG. 8 is uniform. For simplicity, also assume that body voltage $V_B$ is ground reference (0 V). The $V_X$ derivation can then be done in terms of plate-to-body voltage $V_R$ and gate-to-body voltage $V_{GB}$ without reference to plate voltage $V_P$ and gate voltage $V_G$ since they respectively equal voltages $V_R$ and $V_{GB}$ when body voltage $V_B$ is ground.

Consider the situation in which plate-to-body voltage $V_R$ is initially zero. Further assume that gate-to-body bias voltage $V_{GB}$ is at a fixed positive value, i.e., initial value $V_{GBi}$, greater than gate threshold value $V_{T0}$ where $V_{T0}$ is again the value of voltage $V_{GB}$ at which inversion onsets when voltage $V_R$ is zero. Since voltage $V_{GB}$ is greater than threshold value $V_{T0}$, inversion layer 130 is present. The varactor of FIG. 8 is in a condition of strong inversion.

Let $V_{IL}$ generally represent the DC electrical potential of inversion layer 130 in FIG. 8. Neglecting the vertical potential drop in layer 130, inversion-layer potential $V_{IL}$ is at an initial DC value $V_{ILi}$ given as follows when plate-to-body voltage $V_R$ is zero and the varactor of FIG. 8 is in strong inversion:

$$V_{ILi} = \Phi_{s,inv} \tag{24}$$
$$= 2\Phi_{Fp}$$

where $\Phi_{s,inv}$ is the surface potential at inversion, and $\Phi_{Fp}$ is the Fermi potential of the p-type semiconductor material in surface depletion region 126. Fermi potential $\Phi_{Fp}$ is determined from:

$$\Phi_{Fp} = \left(\frac{kT}{q}\right)\ln\left(\frac{N_B}{n_i}\right) \tag{25}$$

where k is Boltzmann's constant, T is the temperature, and $n_i$ is the intrinsic carrier concentration.

Let $V_{PR}$ represent the DC electrical potential of plate region 102 in FIG. 8. Even though plate-to-body potential $V_R$ is zero, plate-region potential $V_{PR}$ is at an initial positive DC value $V_{PRi}$ due to built-in potential $V_{BI}$ across p-n junction 104. Initial value $V_{PRi}$ is given as:

$$V_{PRi} = \Phi_{Fp} + \Phi_{Fn} \tag{26}$$
$$\approx 2\Phi_{Fp}$$

where $V_{Fn}$ is the Fermi potential of the n-type semiconductor material in plate region 102. Since plate-region potential $V_{PR}$ approximately equals inversion-layer potential $V_{IL}$ at this point, the electrons in inversion layer 130 have no physical impetus for leaving layer 130 and thus stay in layer 130 close to upper semiconductor surface 106.

Gate dielectric layer 112 takes up the potential between body region 100 and inversion layer 130. The DC potential difference $V_{GD}$ across gate dielectric 112 is at an initial DC value $V_{GDi}$ given as:

$$V_{GDi} = V_{GB} - V_{FB} - V_{ILi} \tag{27}$$
$$\approx V_{GB} - V_{FB} - 2\Phi_{Fp}$$

where $V_{FB}$ is the flat-band voltage.

The electronic charge in inversion layer 130 and surface depletion region 126 consists of surface electrons in layer 130 and bulk ionized acceptor atoms in region 126 and layer 130. Let $Q_{nA}$ represent the charge per unit area of the electrons in inversion layer 130 while $Q_{BA}$ is the charge per unit area of ionized acceptor atoms in depletion region 126 and layer 130. Areal charges $Q_{nA}$ and $Q_{BA}$ are both negative in sign and have respective initial values $Q_{nAi}$ and $Q_{BAi}$ when gate-to-body voltage $V_B$ is at initial value $V_{GBi}$ while plate-to-body voltage $V_R$ is zero. Using Eq. 27, the total initial areal charge in inversion layer 130 and surface depletion region 126 is determined from the relationship:

$$|Q_{nAi}| + |Q_{BAi}| = C_{GDA}V_{GDi} \tag{28}$$
$$\approx C_{GDA}(V_{GB} - V_{FB} - 2\Phi_{Fp})$$

where $C_{GDA}$ is the areal capacitance of gate dielectric layer 110.

With gate-to-body voltage $V_{GB}$ being greater than threshold value $V_{T0}$ needed to cause strong inversion while plate-to-body voltage $V_R$ is zero, thickness $t_{ds}$ of surface depletion layer 126 is at the value that occurs when voltage $V_{GB}$ equals $V_{T0}$. This $t_{ds}$ value, referred to here as $t_{dsmax0}$, is the maximum value of surface depletion thickness $t_{ds}$ for the condition in which voltage $V_R$ is zero. More particularly, raising gate-to-body voltage $V_{GB}$ from zero to $V_{T0}$ while voltage $V_R$ is at zero causes thickness $t_{ds}$ to progressively increase until inversion onsets when voltage $V_{GB}$ reaches value $V_{T0}$. The presence of inversion layer 130 substantially prevents thickness $t_{ds}$ from increasing further while voltage $V_R$ is held at zero. Accordingly, thickness $t_{ds}$ remains at value $t_{dsmax0}$ when voltage $V_{GB}$ is raised to a value greater than $V_{T0}$ with voltage $V_R$ at zero.

Plate-to-body voltage $V_R$ is now raised to a positive value so as to reverse bias p-n junction 104. Plate-region potential $V_{PR}$ is thus adjusted to:

$$V_{PR} = V_R + \Phi_{Fp} + \Phi_{Fn} \quad (29)$$

$$\approx V_R + 2\Phi_{Fp}$$

Plate-region potential $V_{PR}$ is now greater than initial value $V_{ILi}$ of inversion-layer potential $V_{IL}$ that exists when voltage $V_R$ is zero. Compare Eq. 29 to Eq. 24. Accordingly, some of the electrons in inversion layer 130 flow to plate region 102, causing inversion-layer potential $V_{ILi}$ to increase. The electron flow stops when potential $V_{IL}$ of layer 130 rises up to plate-region potential $V_{PR}$ to satisfy the relationship:

$$V_{IL} = V_R + 2\Phi_{Fp} \quad (30)$$

Voltage $V_{GD}$ across gate dielectric layer 110 is now given as:

$$V_{GD} = V_{GB} - V_{FB} - V_{IL} \quad (31)$$

$$\approx V_{GB} - V_{FB} - V_R - 2\Phi_{Fp}$$

The deep depletion condition produced by raising plate-to-body voltage $V_R$ to a positive value is a special deep depletion condition referred to here as inversion deep depletion. Unlike the conventional deep depletion insulated-gate varactor of FIG. 6 where no inversion charge is present in surface depletion layer (48) when the conventional varactor goes into deep depletion, a finite inversion-layer charge co-exists with the charge of the ionized acceptors in surface depletion region 126 when the varactor of FIG. 8 is in inversion deep depletion. The amount (magnitude) of electron charge that forms inversion layer 130 is less in inversion deep depletion than in strong inversion.

In inversion deep depletion with plate-to-body voltage $V_R$ at some positive value, thickness $t_{ds}$ of surface depletion region 126 is greater than the $t_{dsmax0}$ value that exists when voltage $V_R$ is zero. Surface depletion thickness $t_{ds}$ is specifically given as:

$$t_{ds} = \sqrt{\frac{2K_{SC}\varepsilon_0(V_R + 2\Phi_{Fp})}{qN_B}} \quad (32)$$

where Fermi potential $\Phi_{Fp}$ is again given by Eq. 25. Using Eq. 31, the total areal charge in depletion region 126 for the inversion deep depletion condition is determined from:

$$|Q_{nA}| + |Q_{BA}| = C_{GDA}V_{GD} \quad (33)$$

$$\approx C_{GDA}(V_{GB} - V_{FB} - V_R - 2\Phi_{Fp})$$

where areal charge $Q_{BA}$ of the ionized acceptor atoms in region 126 is determined from:

$$|Q_{BA}| = qN_B t_{ds} \quad (34)$$

with gate dielectric thickness $t_{ds}$ being given by Eq. 32.

Inversion layer 130 disappears when plate-to-body voltage $V_R$ is at transition value $V_X$. This corresponds to setting areal electron charge $Q_{nA}$ to zero. Combining Eqs. 32-34 with electron charge $Q_{nA}$ set to zero yields the following relationship for transition voltage $V_X$:

$$C_{GDA}(V_{GB} - V_{FB} - V_X - 2\Phi_{Fp}) = \sqrt{2K_{SC}\varepsilon_0 qN_B(V_X + 2\Phi_{Fp})} \quad (35)$$

Squaring Eq. 35 produces a quadratic equation whose solution of interest for transition voltage $V_X$ is:

$$V_X = V_{GB} - V_{FB} + \frac{K_{SC}\varepsilon_0 qN_B}{C_{GDA}^2} - \quad (36)$$

$$2\Phi_{Fp} - \sqrt{\frac{2K_{SC}\varepsilon_0(V_{GB} - V_{FB})}{C_{GDA}^2} + \left(\frac{K_{SC}\varepsilon_0 qN_B}{C_{GDA}^2}\right)^2}$$

with Fermi potential $\Phi_{Fp}$ again being determined from Eq. 25.

Transition voltage $V_X$, as determined from Eq. 36, is presented graphically in FIG. 12 as function of gate-to-body bias voltage $V_{GB}$ for a silicon implementation of the varactor of FIG. 8 in which gate dielectric layer 110 consists of silicon oxide and in which gate electrode 112 consists of polysilicon doped to be of the same conductivity type, n-type, as plate region 102. Line 190 with the circular symbols represents Eq. 36 for an implementation having the following numerical parameters:

Gate dielectric thickness $t_{GD}$=4.0 nm so that gate dielectric capacitance $C_{GDA}\approx 8.6\times 10^{-15}$ F/um$^2$,
Body dopant concentration $N_B$=7.6×10$^{17}$ atom/cm$^3$,
Flat-band voltage $V_{FB}$=1.03 V, and
Zero-point gate threshold voltage $V_{T0}$=0.45 V.

In FIG. 12, transition voltage $V_X$ varies nearly linearly with gate-to-body voltage $V_{GB}$ according to the relationship:

$$V_X = \alpha(V_{GB} - V_{T0})$$

where α is a constant whose value is approximately 0.79 here. See line 192 in FIG. 12. Dark circles 194 in FIG. 12 indicate the results of numerical calculations discussed below.

Computer Simulation

The gate-enhanced junction varactor of the present invention was computer simulated in two dimensions to validate the operational principles and analytical theory. The simulation was conducted on a stripe-type (rectangular) silicon-gate implementation of the n-channel varactor of FIG. 8 using the Medici two-dimensional simulation program. See *Medici Two-Dimensional Device Simulation Program User's Manual*, version 1998.4, Avant! Corp., 1999.

In order to determine zero-point gate threshold voltage $V_{T0}$, i.e., the value of gate-to-body voltage $V_{GB}$ at which inversion onsets in the simulated gate-enhanced junction varactor when plate-to-body voltage $V_R$ is zero, a corresponding stripe-like silicon-gate implementation of an n-channel enhancement-mode insulated-gate FET was also computer simulated with the Medici two-dimensional simulation program. A cross-section of the computer-simulated implementation of the n-channel FET is presented in FIG. 13. The FET consisted of a moderately doped p-type body region 200, an n-type source region 202, an n-type drain region 204, a gate dielectric layer 206, a gate electrode 208, a pair of gate sidewall dielectric spacers 210, a source electrode 212, a drain electrode 214, and a body electrode 216 arranged as shown in FIG. 13.

Body region 200, source region 202, and drain region 204 were simulated in a monosilicon semiconductor body. Source region 202 consisted of a very heavily doped main source portion 202M and a more lightly doped lateral source extension 202E. Drain region 204 similarly consisted of a very heavily doped main drain portion 204M and a more lightly doped lateral drain extension 204B. Although extensions 202E and 204E were more lightly doped than main portions 202M and 204M, extensions 202E and 204E were still heavily doped.

Gate dielectric layer 206 was silicon oxide in the simulation. Gate electrode 208 was formed with a thick lower heavily doped n-type polysilicon portion 208L and a thin upper portion 208U consisting of metal or/and metal silicide. Gate sidewall spacers 210 were silicon nitride. Body electrode 216 was, as indicated in FIG. 13, provided along the lower semiconductor surface.

Figure 13:
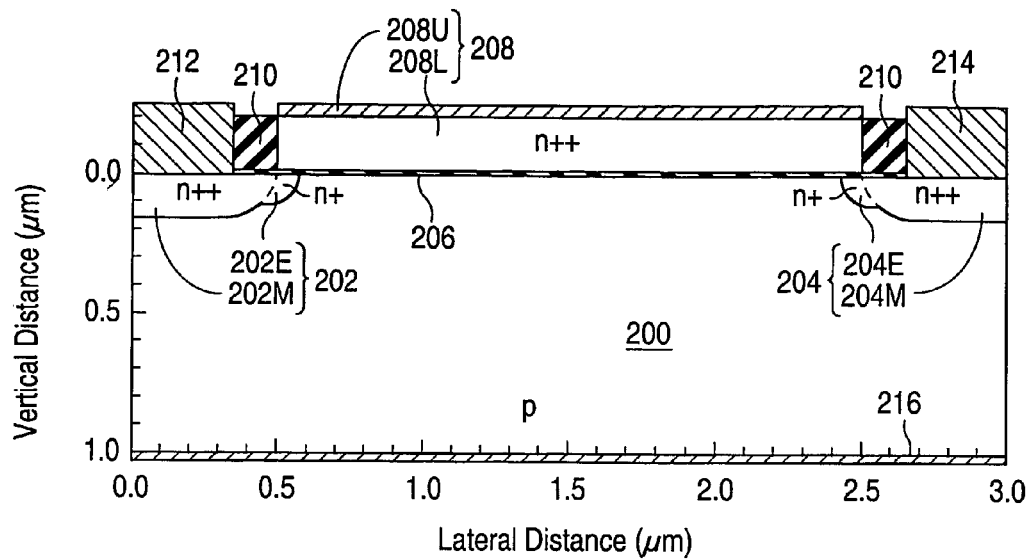
FIG. 13 is a cross-sectional side view of a computer-simulated n-channel silicon-gate insulated-gate FET examined for comparison purposes.

The simulated n-channel FET of FIG. 13 had the following numerical parameters:

Thickness ($t_{GD}$) of gate dielectric layer 208=4.0 nm,
Total length of source region 202 and drain region 204=1.4 μm,
Channel length=2.0 μm,
Lateral width of each spacer 210=0.15 μm,
Junction depth of main source/drain portions 202M and 204M=0.15 μm,
Junction depth of source/drain extensions 202E and 204E=0.1 μm,
Uniform acceptor dopant concentration ($N_B$) of body region 200=4.5×10$^{17}$ atoms/cm$^3$,
Upper surface dopant concentration of main source/drain portions 202M and 204M=1.0×10$^{20}$ atoms/cm$^3$, and
Upper surface dopant concentration of source/drain extensions 202E and 204E=1.0×10$^{19}$ atoms/cm$^3$.

Figure 14:
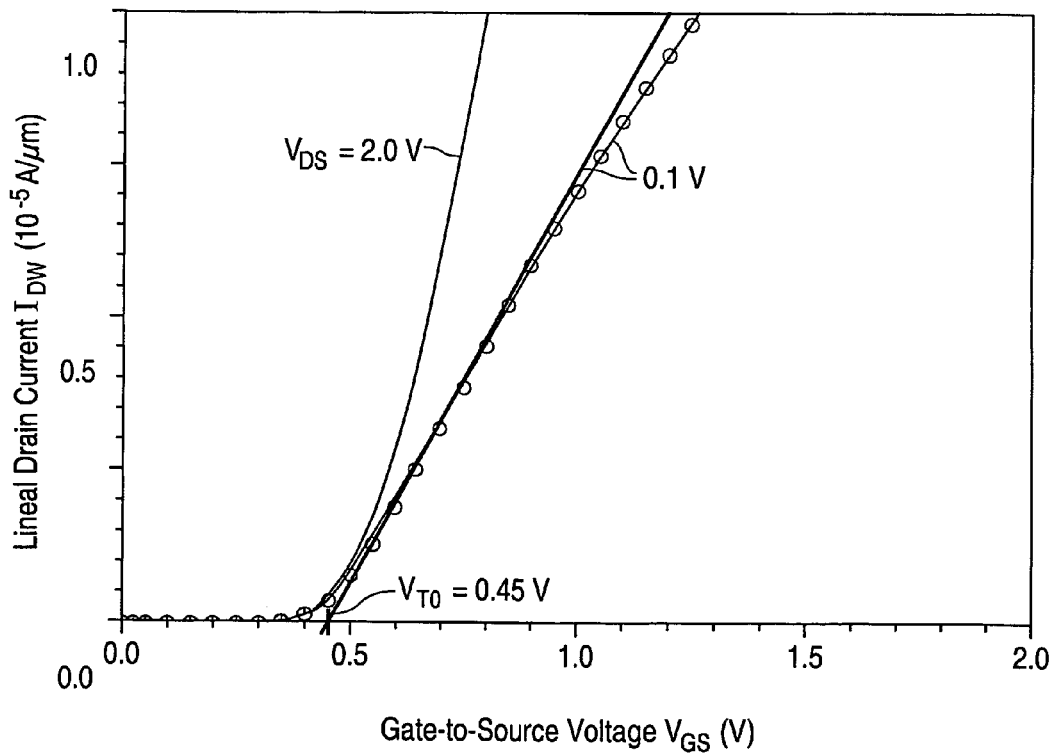
FIG. 14 is a graph of widthwise lineal drain current density as a function of gate-to-source voltage for the computer-simulated FET of FIG. 13.

FIG. 14 illustrates how widthwise lineal drain current $I_{DW}$, i.e. the drain current per unit drain width, varies as a function of gate-to-source voltage $V_{GS}$ at two different values of drain-to-source voltage $V_{DS}$ for the computer-simulated FET of FIG. 13. Using the preceding numerical parameters, the FET of FIG. 13 had a long-channel threshold voltage of approximately 0.45 V. This voltage is zero-point gate threshold voltage VTO for the simulated varactor.

Figure 15:
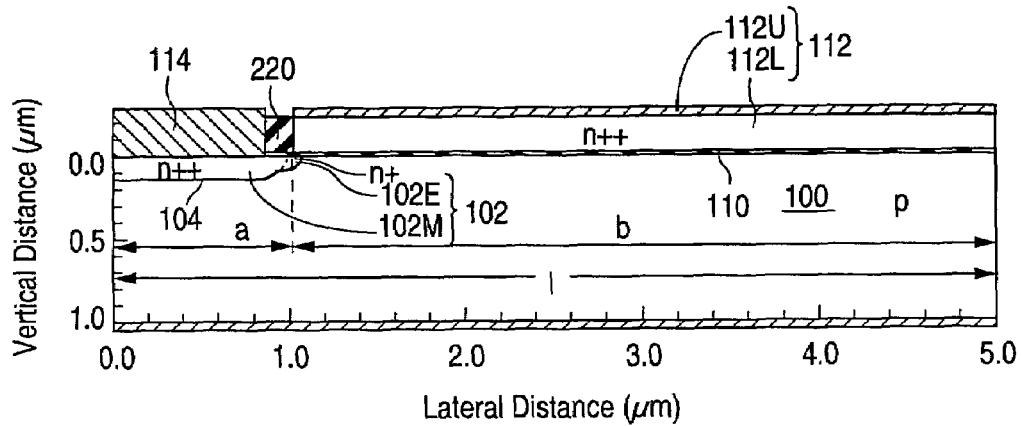
FIG. 15 is a cross-sectional side view of a computer-simulated n-channel silicon-gate gate-enhanced junction varactor according to the invention.

FIG. 15 presents a cross section of the computer-simulated n-channel gate-enhanced junction varactor of the invention. N-type plate region 102 in the computer-simulated varactor consisted of a very heavily doped main plate portion 102M and a more lightly doped lateral extension 102E. Although more lightly doped than main plate portion 102M, plate extension 102E was still heavily doped. Gate electrode 112 was formed with lower n++ polysilicon portion 112L and upper portion 112U as in the implementation of FIG. 9b. Upper gate-electrode portion 112U was metal. The computer-simulated varactor of FIG. 15 also included a gate sidewall dielectric spacer 220 situated between electrodes 112 and 114.

The simulated gate-enhanced junction varactor of FIG. 15 had the same sidewall spacer parameters and dopant performance characteristics as the simulated FET of FIG. 13. In particular, body region 100 of the simulated varactor had the same uniform acceptor body dopant concentration $N_B$ as body region 200 of the simulated FET. The surface dopant concentrations of main plate portion 102M and extension 102E of the simulated varactor were respectively the same as those of main source/drain portion 202M or 204M and source/drain extension 202E or 204E of the simulated FET. The junction depths of main plate portion 102M and plate extension 102E were also respectively the same as those of main source/drain portion 202M or 204M and source/drain extension 202E or 204E.

The two dimensions employed for simulating the present varactor are the horizontal and vertical directions in FIG. 15. All the varactor components, including plate region 102 and inversion layer 130, had the same width as measured perpendicular to the plane of FIG. 15. A convenient parameter for examining the varactor of FIG. 15 is the varactor capacitance per unit varactor width, referred to here as the varactor widthwise lineal capacitance $C_{VW}$. Varactor lineal capacitance $C_{VW}$ and varactor areal capacitance $C_{VA}$ are related as:

$$C_{VW} = 1 C_{VA} \tag{38}$$

where l is the total varactor length measured horizontally in FIG. 15. As plate-to-body voltage $V_R$ passes through transition value $V_X$, lineal capacitance $C_{VW}$ switches between a high value $C_{VWH}$ and a low value $C_{VWL}$. In terms of values $C_{VWH}$ and $C_{VWL}$, the $C_{VAH}/C_{VAL}$ transition capacitance ratio of Eq. 20 is represented as:

$$\frac{C_{VWH}}{C_{VWL}} = 1 + \frac{A_I}{A_P} \tag{39}$$

In the simulated varactor of FIG. 15, plate region 102 had a length a of approximately 1 μm, while inversion layer 130 (when present) had a length b of approximately 4 μm. Length b of layer 130 (not specifically shown in FIG. 15) is approximately represented by the length of gate electrode 112. Lengths a and b are measured horizontally in FIG. 15. Inasmuch as region 102 and layer 130 are of the same width, area ratio $A_I/A_P$ for the simulated varactor is given as:

$$\frac{A_I}{A_P} = \frac{b}{a} \tag{40}$$

Combining Eqs. 39 and 40 gives:

$$\frac{C_{VWH}}{C_{VWL}} = 1 + \frac{b}{a} \tag{41}$$

Since length ratio b/a was 4, the simulated varactor of FIG. 15 was directed toward a $C_{VWH}/C_{VWL}$ ratio of 5 at the $V_X$ transition point.

Lineal capacitance $C_{VW}$ was determined as a function of plate-to-body bias voltage $V_R$ for the simulated varactor of FIG. 15 by replacing DC bias voltage $V_R$ with a frequency-dependent plate-to-body voltage $v_R$ consisting of bias voltage $V_R$ and a small-signal AC variation $v_r$ at frequencies, primarily 10 MHz, in the high-frequency regime while gate-to-body voltage $V_{GB}$ was held at fixed initial value $V_{GBi}$. Body voltage $V_B$ was held at zero so that the $v_r$ small-signal frequency was applied specifically to plate region 102. Initial value $V_{GBi}$ was sufficiently great to cause inversion layer 130 to be present at bias voltage $V_R$ equal to zero.

The frequency of the $v_r$ small signal was also varied across a range extending from 1 Hz-to-1 GHz. No significant difference in the $C_{VW}$ dependence on the frequency of the $v_r$ small signal occurred across the 1 Hz-to-1 GHz high-frequency range. In this regard, the capacitive behavior of the present gate-enhanced junction varactor is determined by the variation of the electrical charges in junction depletion region 118 and surface depletion region 126 and therefore by a majority charge-carrier effect. Consequently, constancy of the capacitive behavior across the high-frequency regime is theoretically expected.

More particularly, only the connection/disconnection of inversion layer 130 to undepleted material 124 of plate region 102 involves minority charge carriers, namely the electrons that form layer 130. The intervention of these minority charge carriers has no effect on the varactor operation except for the initial time interval, typically on the order of several microseconds to several milliseconds (depending on the minority carrier lifetime), in which layer 130 is first created by thermal generation with plate-to-body bias voltage $V_R$ at zero. Otherwise, charge flows into and out of layer 130 almost instantaneously by drift and diffusion. Since there is no significant minority carrier effect on the capacitance of the present varactor, the variation of the varactor capacitance as a function of voltage $V_R$ is expected to be substantially constant across the high-frequency regime as confirmed by the present simulations.

The two-dimension simulation model of the present gate-enhanced junction varactor represents the device physics in a more complete way than the one-dimensional modeling approximations employed in generating Eqs. 12-22. For instance, the sub-threshold conditions are well represented in the two-dimensional model but are not included in the one-dimensional approximations. Due to these differences, the two-dimensional computer-simulated model of the present varactor employs a slightly different value of acceptor body dopant concentration $N_B$ than was used in the one-dimensional analytical approximations presented in FIG. 12, $4\times10^{17}$ atoms/cm$^3$ for the two-dimensional model compared to $7.6\times10^{17}$ atoms/cm$^3$ for the one-dimensional approximations.

Figure 16:
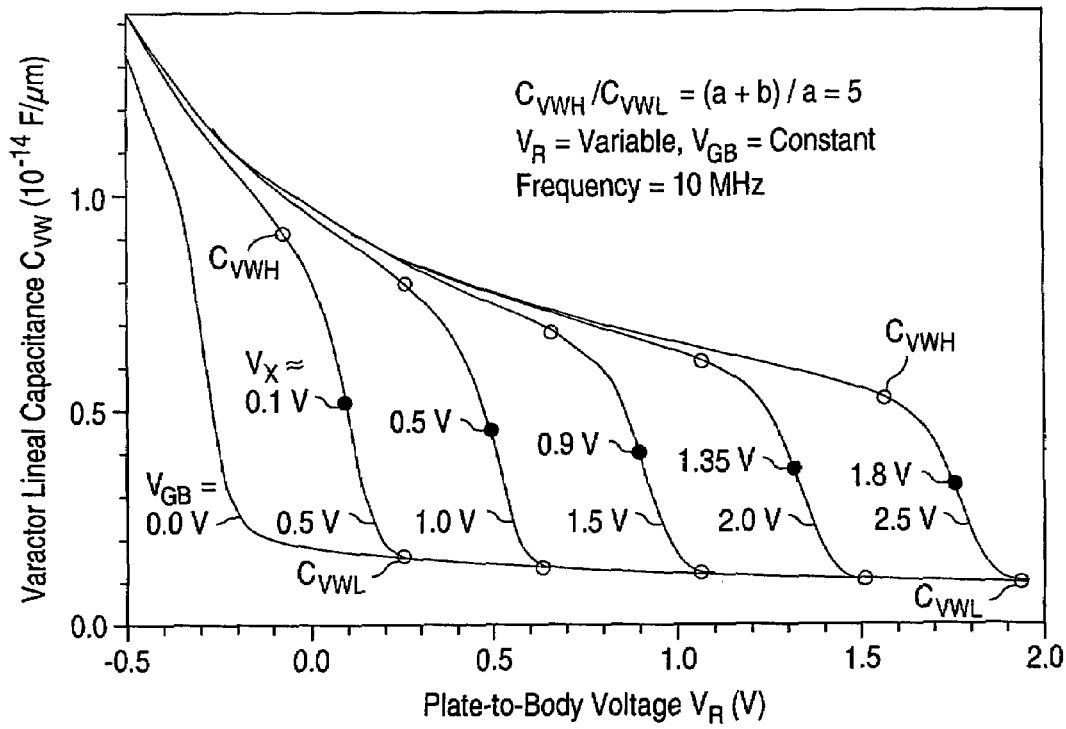
FIG. 16 is a graph of varactor widthwise lineal capacitance as a function of plate-to-body bias voltage for the computer-simulated varactor of FIG. 15 at constant gate-to-body bias voltage.

FIG. 16 illustrates how varactor lineal capacitance $C_{VW}$ varied with plate-to-body bias voltage $V_R$ for the simulated varactor of FIG. 15 at fixed values ($V_{GBi}$) of gate-to-body bias voltage $V_{GB}$ ranging from 0.0 V in 0.5-V increments to 2.5 V in the high-frequency regime at a $v_r$ small-signal frequency of 10 MHz. As FIG. 16 shows, capacitance $C_{VW}$ for each of the five right-most curves having $V_{GB}$ values from 0.5 V to 2.5 V initially decreased in a roughly hyperbolic manner with increasing voltage $V_R$ starting from voltage $V_R$ slightly less than zero. Each of these five curves then went through an inflection after which capacitance $C_{VW}$ decreased sharply with increasing $V_R$ over a relatively short $V_R$ transition interval. Capacitance $C_{VW}$ for each of these five curves subsequently leveled out with increasing voltage $V_R$ and then continued to decrease in a roughly hyperbolic manner with increasing voltage $V_R$.

Each of the five curves presented in FIG. 16 for constant $V_{GB}$ values ranging from 0.5 V to 2.5 V is marked with a circle labeled $C_{VWH}$ at a location shortly after the inflection point where capacitance $C_{VW}$ starts to decrease sharply with increasing plate-to-body voltage $V_R$. The location at which capacitance $C_{VW}$ later nearly levels out with increasing voltage $V_R$ on each of these five curves is similarly marked with a small circle labeled $C_{VWL}$. The $C_{VWH}$ and $C_{VWL}$ locations on each of these five curves are somewhat arbitrary and could be chosen to be closer together. Nonetheless, the ratio of high varactor transition capacitance $C_{VWH}$ to low varactor transition capacitance $C_{VWL}$ for the two so-marked locations on each curve is roughly 5.

For instance, consider the curve for which gate-to-body voltage $V_{GB}$ is 1.0 V in FIG. 16. High transition capacitance value $C_{VWH}$ is approximately $0.8\times10^{-14}$ F/µm while low transition capacitance value $C_{VWL}$ is approximately $0.15\times10^{-14}$ F/µm. The $C_{VWH}/C_{VWL}$ transition capacitance ratio for the curve at voltage $V_{GB}$ equal to 1.0 V is thus roughly 5. Inasmuch as Eq. 41 yields a $C_{VWH}/C_{VWL}$ ratio of 5 for the one-dimensional approximations at a b/a length ratio of 4, the curves presented in FIG. 16 for the two-dimensional simulation of the present varactor qualitatively confirm the performance enhancements expected from the one-dimensional approximations.

A point approximately halfway along the sharply decreasing portion of each of the five curves having gate-to-body voltage $V_{GB}$ ranging from 0.5 V to 2.5 V is marked as transition value $V_X$. Points 194 in FIG. 12 represent these $V_X$ values as a function of the associated $V_{GB}$ values. As FIG. 12 indicates, points 194 are quite close to curve 190 which represents the analytical one-dimensional approximations. This confirms the quantitative determinations of the one-dimensional modeling.

As described above, FIG. 16 demonstrates that capacitance $C_{VW}$ changes sharply as plate-to-body voltage $V_R$ passes through transition value $V_X$ in the two-dimensional simulation of the varactor of FIG. 15. Nonetheless, there is a small $V_R$ interval over which capacitance $C_{VW}$ changes from high transition value $C_{VWH}$ to low transition value $C_{VWL}$. This indicates that inversion layer 130 does not disappear immediately as voltage $V_R$ passes upwardly through value $V_X$. Instead, layer 130 disappears over a small $V_R$ interval centered generally around transition value $V_X$. Hence, a $V_R$ interval for controlling the varactor capacitance to achieve a particular capacitance in the sharp capacitance transition interval is available.

Electronic Circuitry Containing Gate-Enhanced Junction Varactor

Figure 17:
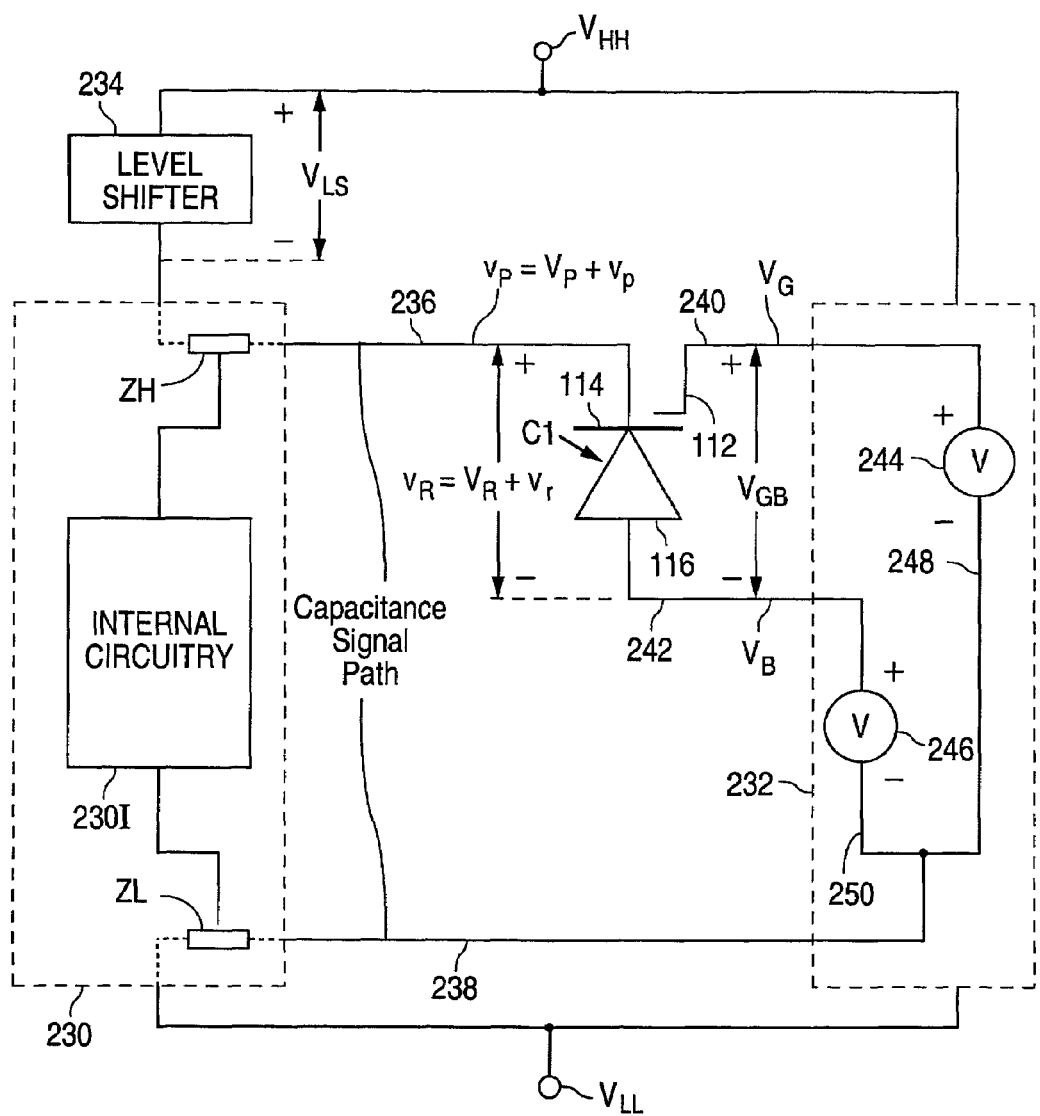
FIG. 17 is a circuit diagram of general electronic circuitry which employs a gate-enhanced junction varactor according to the invention.

The present gate-enhanced junction varactor can be employed in various ways in electronic circuitry, especially in integrated circuits. FIG. 17 illustrates general electronic circuitry configured in accordance with the invention for utilizing an n-channel version of the present varactor with gate-to-body bias voltage $V_{GB}$ being maintained approximately constant during varactor operation. The electronic circuitry in FIG. 17 is connected between a source of a high supply voltage $V_{HH}$ and a source of low supply voltage $V_{LL}$, typically ground. The components of the electronic circuitry consist of a general electronic circuit 230, an n-channel gate-enhanced junction varactor C1 configured according to the invention, a varactor control system 232, and an optional level shifter 234.

The electronic circuitry, primarily circuit 230, in FIG. 17 has a capacitance signal path for receiving varactor C1 in order to enable the circuitry to perform an electronic function dependent on variable capacitance $C_V$ of varactor C1. Plate electrode 114 and body electrode 116 of varactor C1 are situated in the capacitance signal path. One end of the capacitance signal path consists of a high-bias capacitance signal path line 236 that terminates at circuit 230. The other end of the capacitance signal path is formed with a low-bias capacitance signal path line 238 that likewise terminates at circuit 230. High-bias path line 236 is at a higher DC electrical potential than low-bias path line 238 during circuitry operation.

With varactor C1 being an n-channel junction varactor, high-bias path line 236 is connected to plate electrode 114. Electronic circuit 230 provides high-bias line 236 with a composite plate voltage $v_P$ consisting of DC plate voltage $V_P$ and an AC plate voltage $v_p$. Varactor C1 thus receives DC plate voltage $V_P$ from circuit 230 by way of line 236.

Electronic circuit 230 is formed with internal circuitry 230I, a high-bias impedance component ZH, and a low-bias impedance component ZL. Internal circuitry 230I can interact with impedance components ZH and ZL in various ways. For purposes of generality, FIG. 17 simply depicts circuitry 230I as being connected by a pair of electrical lines respectively to components ZH and ZL. Circuitry 230I may be connected by more than one electrical line to component ZH or ZL. Accordingly, the lines shown as connecting circuitry 230I to components ZH and ZL in FIG. 17 are intended to represent interactions rather than specific electrical connections. Although the line connecting circuitry 230I to component ZH is illustrated as touching an intermediate point on component ZH in FIG. 17, this line can be connected to an end of component ZH. The same applies to the line connecting circuitry 230I to component ZL.

Impedance components ZH and ZL can be configured in various ways. For example, each component ZH or ZL may consist of one or more passive electrical elements such as resistor, inductors, and capacitors. Additionally or alternatively, each component ZH or ZL may include one or more active elements such as FETs and bipolar transistors. Either of components may, in some cases, be of substantially zero impedance (0 ohm). Hence, component ZH or ZL can be simply an electrical line.

High-bias impedance component ZH is part of a high-bias electrically conductive DC path which extends through circuit 230 and through which high-bias capacitance signal path line 236 is electrically coupled to the $V_{HH}$ high voltage supply. Low-bias impedance component ZL is similarly part of a low-bias electrically conductive DC path which extends through circuit 230 and through which low-bias capacitance signal path line 238 is electrically coupled to the $V_{LL}$ low voltage supply.

Varactor control system 232 furnishes varactor C1 with gate voltage $V_G$ and body voltage $V_B$ at values which normally vary during circuitry operation but whose difference $V_{GB}$ is maintained largely constant at initial value $V_{GBi}$. In particular, gate electrode 112 of varactor C1 receives gate voltage $V_G$ on a high-bias control line 240 connected to control system 232. Body electrode 116 similarly receives voltage $V_B$ on a low-bias control line 242 connected to system 232. Since varactor C1 is of n-channel type, voltage $V_G$ on high-bias control line 240 is normally greater than voltage $V_B$ on low-bias control line 242.

Control system 232 contains a high-bias DC voltage source 244 and a low-bias DC voltage source 246. High-bias voltage source 244 is coupled between high-bias control line 240 and low-bias path line 238 by way of an electrical line 248. Low-bias voltage source 246 is similarly coupled between low-bias control line 242 and path line 238 by way of an electrical line 250. Voltage sources 244 and 246 thus respectively furnish DC gate voltage $V_G$ and DC body voltage $V_B$.

Low-bias voltage source 246 is in the capacitance signal path since body electrode 116 is in the capacitance signal path. Accordingly, the capacitance signal path consists of high-bias path line 236, plate electrode 114, body electrode 116, low-bias control line 242, low-bias voltage source 246, electrical line 250, and low-bias path line 238. Gate electrode 112 is outside the capacitance signal path. Also, control system 232 is normally connected between the $V_{HH}$ and $V_{LL}$ voltage supplies.

Gate-to-body voltage $V_{GB}$ is, as indicated above, provided at largely constant value $V_{GBi}$ to varactor C1 during operation of the electronic circuitry in FIG. 17. Since voltage sources 244 and 246 respectively provide gate voltage $V_G$ and body voltage $V_B$ whose difference is gate-to-body voltage $V_{GB}$, a tracking condition is imposed on voltage sources 244 and 246. That is, when one of voltages $V_G$ and $V_B$ changes by some amount, voltage sources 244 and 246 track each other so that the other of voltages $V_G$ and $V_B$ changes by substantially the same amount.

Subject to the tracking condition being maintained between voltages $V_G$ and $V_B$, the circuitry of FIG. 17 can be configured to enable high-bias voltage source 244 to provide gate voltage $V_G$ at a value as high as high supply voltage $V_{HH}$. The circuitry of FIG. 17 can also be configured to enable low-bias voltage source 246 to provide body voltage $V_B$ at a value as low supply voltage $V_{LL}$. The latter situation arises when low-bias impedance component ZL is of such a nature, e.g., an electrical line on an inductor, that substantially no DC voltage drop occurs across component ZL. With gate-to-body voltage $V_{GB}$ being fixed at initial value $V_{GBi}$, the high value of body voltage $V_B$ is $V_{GBi}$ lower than the high value of gate voltage $V_G$ while the low value of gate voltage $V_G$ is $V_{GBi}$ higher than the low value of body voltage $V_B$.

Level shifter 234, which is present in some implementations of the circuitry of FIG. 17 but not in others, is connected between electronic circuit 230 and the $V_{HH}$ high voltage supply. Shifter 234 is specifically connected to the ZH high-bias DC path in circuit 230 so as to be electrically coupled to high-bias path line 236.

Current from the $V_{HH}$ high voltage supply flows through level shifter 234 to circuit 230. As this current flows through shifter 234, a DC voltage drop $V_{LS}$ occurs across shifter 234. The magnitude of voltage drop $V_{LS}$ may be controlled substantially solely by shifter 234 or by shifter 234 in combination with one or more circuitry elements in circuit 230. In any event, the presence of shifter 234 effectively causes circuit 230 to receive, by way of the ZH high-bias DC path, a lower high supply voltage than high supply voltage $V_{HH}$ provided to control system 232.

When level shifter 234 is absent, electronic circuit 230 is directly connected to the $V_{HH}$ high voltage supply. Accordingly, circuit 230 and control system 232 receive the same high supply voltage, i.e., voltage $V_{HH}$.

DC voltages $V_P$, $V_G$, and $V_B$ are referenced to low supply voltage $V_{LL}$ in the circuitry of FIG. 17. Except as otherwise indicated, all values of voltages $V_P$, $V_G$, and $V_B$ mean values relative to voltage $V_{LL}$.

The circuitry of FIG. 17 operates generally in the following manner. Plate voltage $V_P$, the DC portion of composite plate voltage $v_p$ supplied from electronic circuit 230 to plate electrode 114 of varactor C1, is maintained largely constant (relative to low supply voltage $V_{LL}$) and exceeds DC body voltage $V_B$. With low-bias control line 242 providing voltage $V_B$ to body electrode 116 of capacitor C1, composite plate-to-body voltage $v_R$ consisting of DC plate-to-body bias voltage $V_R$ and AC plate-to-body voltage $v_r$ is thus applied between electrodes 114 and 116 of capacitor C1. DC bias voltage $V_R$ is again the difference between DC voltages $V_P$ and $V_B$ according to Eq. 10.

Low-bias voltage source 246 adjusts body voltage $V_B$ upward or downward (relative to low supply voltage $V_{LL}$) depending on the needed value of varactor capacitance $C_V$. Since DC plate voltage $V_P$ is largely constant, DC plate-to-body voltage $V_R$ moves-upward or downward in a corresponding way to adjust the $C_V$ value. High-bias voltage source 244 tracks low-bias voltage source 246 so as to maintain DC gate-to-body voltage $V_{GB}$ largely constant. Varactor C1 operates internally in the manner described above in connection with the varactor of FIG. 8. Accordingly, the circuitry of FIG. 17 performs an electron function that varies with the value of capacitance $C_V$.

Consider an implementation of the circuitry of FIG. 17 in which level shifter 234 is absent and in which the low value of body voltage $V_B$ is low supply voltage $V_{LL}$ while the high value of gate voltage $V_G$ is high supply voltage $V_{HH}$. The high value of body voltage $V_B$ is $V_{HH}-V_{GBi}$ since gate voltage $V_G$ exceeds body voltage $V_B$ by $V_{GBi}$, the fixed positive value of gate-to-body voltage $V_{GB}$. Assume that circuit 230 has no significant effect on DC plate voltage $V_P$. That is, assume that high-bias impedance component ZH is of such a nature that substantially no DC voltage drop occurs across component ZH. In the absence of shifter 234, the fixed value of DC plate voltage $V_P$ is then substantially $V_{HH}$. Since plate-to-body voltage $V_R$ is the difference between plate voltage $V_P$ and body voltage $V_B$, plate-to-body voltage $V_R$ varies across a minimum-to-maximum range extending from $V_{GBi}$ to $V_{HH}-V_{LL}$ when shifter 234 is absent. Even though minimum value $V_{Rmin}$ equals $V_{GBi}$ and is thus greater than zero, maximum value $V_{Rmax}$ equals $V_{HH}-V_{LL}$ and therefore occupies the entire supply voltage range. The length of the $V_{Rmin}$-to-$V_{Rmax}$ range is $V_{HH}-V_{LL}-V_{GBi}$.

The effect of level shifter 234 is to shift the $V_{Rmin}$-to-$V_{Rmax}$ range downward by an amount equal to shifter voltage drop $V_{LS}$ so that, by suitably choosing shifter drop $V_{LS}$ and fixed value $V_{GBi}$ of gate-to-body voltage $V_{GB}$, minimum value $V_{Rmin}$ of plate-to-body voltage $V_R$ can be made close to zero or slightly negative. The length of the $V_{Rmin}$-to-$V_{Rmax}$ range remains the same.

More particularly, again consider the situation in which body voltage $V_B$ varies between $V_{LL}$ and $V_{HH}-V_{GBi}$. Again assume that electronic circuit 230 does not significantly affect DC plate voltage $V_P$. In the presence of shifter 234, the fixed value of plate voltage $V_P$ is then substantially $V_{HH}-V_{LS}$. Hence, plate-to-body voltage $V_R$ varies across a minimum-to-maximum range extending from $V_{GBi}-V_{LS}$ to $V_{HH}-V_{LL}-V_{LS}$ when shifter 234 is present. The length of the $V_{Rmin}$-to-$V_{Rmax}$ range is $V_{HH}-V_{LL}-V_{LS}$, the same as arises when shifter 234 is absent.

By employing level shifter 234, maximum plate-to-body voltage $V_{Rmax}$ equals $V_{HH}-V_{LL}-V_{LS}$ and is thereby reduced by an amount $V_{LS}$ compared to the situation in which shifter 234 is absent. Although the $V_{Rmax}$ value is less than the full supply voltage range when shifter 234 is present, minimum plate-to-body voltage $V_{Rmin}$ equals $V_{GBi}-V_{LS}$ when shifter 234 is utilized and is therefore likewise reduced by amount $V_{LS}$ compared to the situation in which shifter 234 is absent. Use of shifter 234 enables minimum value $V_{Rmin}$ to be made close to zero or slightly negative by choosing shifter drop $V_{LS}$ to be close to or slightly greater than $V_{GBi}$, the fixed value of gate-to-body voltage $V_{GB}$. In either case, this can lead to an increase in the maximum-to-minimum varactor capacitance ratio in light of the varactor capacitance-voltage characteristics illustrated in FIG. 16.

Electronic circuit 230 may impact DC plate voltage $V_P$ by causing it to be reduced by a DC amount $V_K$. That is, high-bias impedance component ZH may be of such a nature that a voltage drop $V_K$ occurs across component ZH. In the case where internal voltage drop $V_K$ is substantially constant, the effect of the $V_P$ reduction caused by circuit 230 is similar to that produced by level shifter 230. Specifically, plate-to-body voltage $V_R$ varies across a minimum-to-maximum range extending from $V_{GBi}-V_K$ to $V_{HH}-V_{LL}-V_K$ when shifter 234 is absent. The length of the $V_{Rmin}$-to-$V_{Rmax}$ range is again $V_{HH}-V_{LL}-V_{GBi}$. Consequently, the $V_{Rmin}$-to-$V_{Rmax}$ range is shifted downward by internal voltage drop $V_K$ without changing the range length. Utilization of shifter 234 causes the $V_{Rmin}$-to-$V_{Rmax}$ range to be shifted downward by an additional amount $V_{LS}$, again without changing the range length.

In some implementations of the circuitry of FIG. 17, DC plate voltage $V_P$ can vary during circuitry operation provided that voltage $V_P$ varies differently than body voltage $V_B$. The variation in voltage $V_P$ is achieved by appropriately varying internal voltage drop $V_K$. Body voltage $V_B$ can, in fact, sometimes be largely constant (relative to low supply voltage $V_{LL}$).

In any event, DC plate-to-body voltage $V_R$ varies upward or downward to adjust the $C_V$ value as needed.

The general circuitry of FIG. 17 can be readily modified to use a p-channel version of the present gate-enhanced junction varactor in place of n-channel junction varactor C1. One way of implementing this modification is to reconfigure the circuitry so that it is interconnected in a complementary (mirror-image) manner to what is shown in FIG. 17. That is, high-bias capacitance signal path line 236 can be connected directly to voltage sources 244 and 246 in control system 232. Using the electrode reference symbols of FIG. 10, low-bias capacitance signal path line 238 is connected to plate electrode 164 of the p-channel varactor. With the polarity direction of voltage sources 244 and 246 reversed, gate electrode 162 and body electrode 166 of the p-channel varactor are respectively connected to voltage sources 244 and 246. Due to the polarity direction reversal, voltage source 244 provides gate voltage $V_G$ at a lower value than body voltage $V_B$ provided by voltage source 246. When present, level shifter 234 is connected between circuit 230 and the $V_{LL}$ supply.

Figure 18:
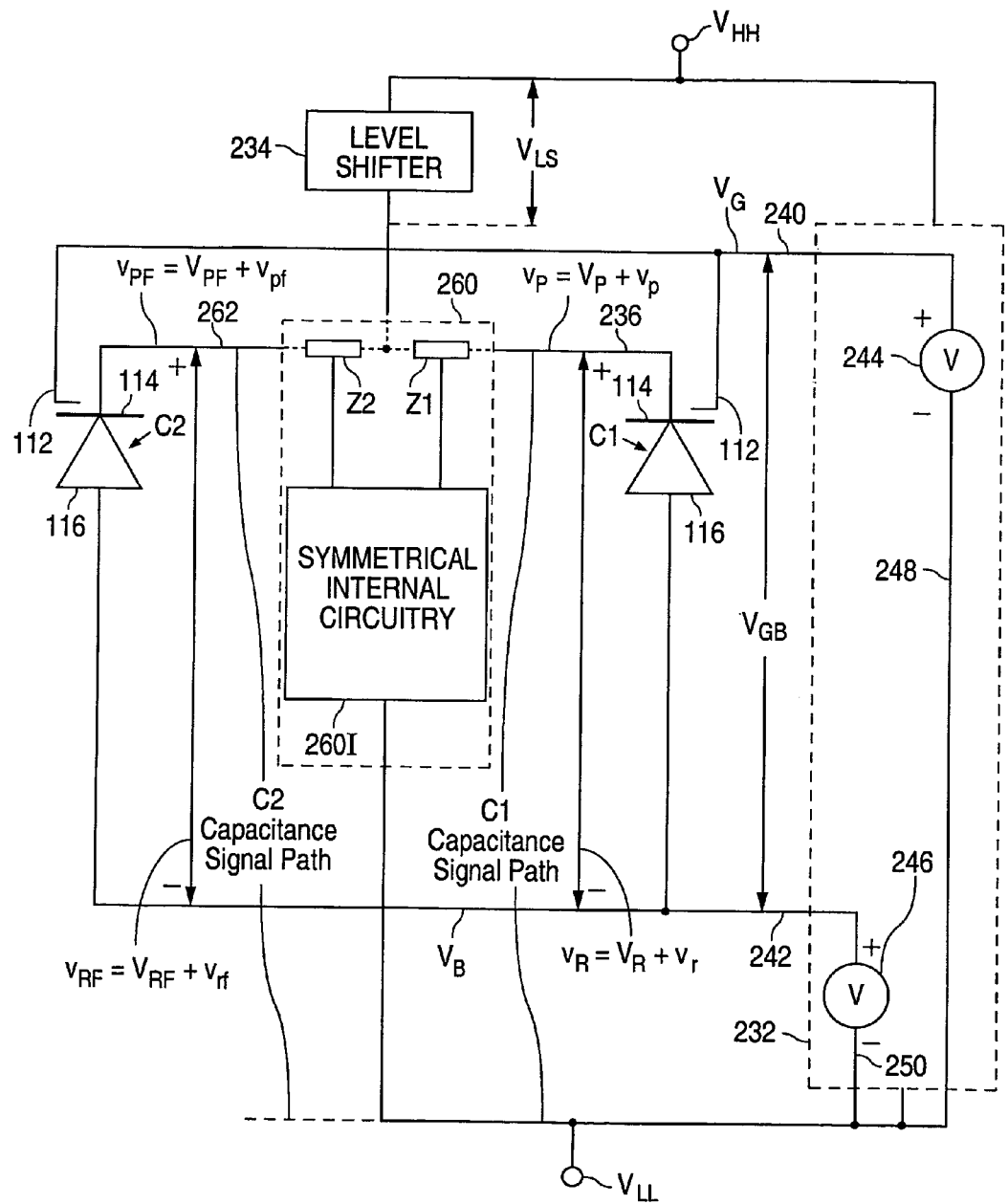
FIG. 18 is a circuit diagram of general electronic circuitry which employs a pair of gate-enhanced junction varactors positioned symmetrically around a symmetrical circuit according to the invention.

An extension, or application, in accordance with the invention of the general electronic circuitry of FIG. 17 to the use of a pair of n-channel versions of the present varactor with symmetrical circuitry is presented in FIG. 18. As in the circuitry of FIG. 17, gate-to-body voltage $V_{GB}$ is maintained approximately constant during varactor operation in the general electronic circuitry of FIG. 18. The components of the electronic circuitry of FIG. 18 consist of a general symmetrical electronic circuit 260, a pair of largely identical n-channel gate-enhanced junction varactors C1 and C2 configured according to the invention, varactor control system 232, and optional level shifter 234.

The electronic circuitry, primarily symmetrical circuit 260, in FIG. 18 has a pair of capacitance signal paths for respectively receiving varactors C1 and C2 in order to enable the circuitry to perform an electronic function dependent on variable capacitances $C_V$ of varactors C1 and C2. Plate electrodes 114 and body electrodes 116 of capacitors C1 and C2 are situated in the capacitance signal paths. Analogous to the electronic circuitry of FIG. 17, one end of the C1 capacitance signal path in the circuitry of FIG. 18 consists of high-bias capacitance signal path line 236 that terminates at circuit 260. One end of the C2 capacitance signal path in the circuitry of FIG. 18 similarly consists of a further high-bias capacitance signal path line 262 that likewise terminates at circuit 260.

As in the circuitry of FIG. 17, high-bias path line 236 is connected to plate electrode 114 of varactor C1 in the circuitry of FIG. 18. Electronic circuit 260 thereby provides path line 236 with composite plate voltage $v_P$ consisting of DC plate voltage $V_P$ and AC plate voltage $v_p$. With varactor C2 being an n-channel junction varactor, further high-bias path line 262 is connected to plate electrode 114 of varactor C2. Circuit 260 provides further path line 262 with a further composite plate voltage $v_{PF}$ consisting of a further DC plate voltage $V_{PF}$ and a further AC plate voltage $v_{pf}$. Varactors C1 and C2 thus respectively receive DC plate voltages $V_P$ and $V_{PF}$ from circuit 260 by way of respective lines 236 and 262.

Symmetrical circuit 260 is formed with symmetrical internal circuitry 260I and a pair of largely identical high-bias impedance components Z1 and Z2. Analogous to high-bias impedance component ZH in the circuitry of FIG. 17, high-bias impedance component Z1 is part of a high-bias electrically conductive DC path which extends through circuit 260 and through which high-bias path line 236 is electrically coupled to the $V_{HH}$ high voltage supply. High-bias impedance component Z2 is similarly part of a further high-bias electrically conductive DC path which extends through circuit 260 and through which further high-bias path line 262 is electrically coupled to the $V_{HH}$ supply.

Internal symmetrical circuitry 260I of circuit 260 consists of electronic circuitry configured symmetrically with respect to high-bias impedance components Z1 and Z2. Internal circuitry 260I can interact with components Z1 and Z2 in various ways. For the purpose of generality, FIG. 18 simply illustrates circuitry 260I as being connected by a pair of electrical lines respectively to components Z1 and Z2. The comments made above about the constituency of high-bias impedance component ZH and about the ZH connection point of the electrical line shown as extending from internal circuitry 230I to component ZH in the circuitry of FIG. 17 apply here to components Z1 and Z2 and the electrical lines illustrated as connecting circuitry 260I to components Z1 and Z2 in the circuitry of FIG. 18. Examples of the symmetrical nature of circuitry 260I with respect to components Z1 and Z2 are presented below in connection with the VCO implementations of FIGS. 19a and 19b.

Internal circuitry 260I is also connected to the $V_{LL}$ low voltage supply. To the extent that circuitry 260I is connected by multiple paths to the $V_{LL}$ supply, these connections are made in a symmetrical manner relative to high-bias impedance components Z1 and Z2. Although not indicated in FIG. 18, circuitry 260I may be coupled to the $V_{HH}$ high voltage supply by multiple symmetrical paths separate from those that go through components Z1 and Z2. As a result, circuit 260 is internally symmetrical and is symmetrically arranged with respect to varactors C1 and C2.

Varactor control system 232 in the circuitry of FIG. 18 is configured with respect to, and controls, varactor C1 in the same manner as in the circuitry of FIG. 17. Control system 232 in the circuitry of FIG. 18 is also configured with respect to, and controls, varactor C2 the same as varactor C1. Hence, system 232 furnishes each of varactors C1 and C2 with gate voltage $V_G$ and body voltage $V_B$ at values which normally vary during circuitry operation but whose difference $V_{GB}$ is held largely constant at initial value $V_{GBi}$. In particular, high-bias DC voltage source 244 provides gate voltage $V_G$ on high-bias control line 240 to gate electrode 112 of each of varactors C1 and C2. Low-bias voltage source 246 provides body voltage $V_B$ on low-bias control line 242 to body electrode 116 of each of varactors C1 and C2.

Neither low-bias capacitance signal path line 236 nor one or more low-bias impedance components analogous to low-bias impedance ZL in the circuitry of FIG. 17 appears in the circuitry of FIG. 18. Rather than being connected through electrical lines 248 and 250 to low-bias path line 238, voltage sources 244 and 246 in control system 232 are connected by electrical lines 248 and 250 directly to the $V_{LL}$ low voltage supply in the circuitry of FIG. 18.

The second (other) ends of the C1 and C2 capacitance signal paths terminate at the $V_{LL}$ low voltage supply in the circuitry of FIG. 18. With low-bias control line 242 connected to body electrodes 116 of both of varactors C1 and C2, the C1 capacitance signal path here consists of high-bias path line 236, C1 plate electrode 114, C1 body electrode 116, low-bias control line 242, low-bias voltage source 246, and electrical line 250. The C2 capacitance signal path signal path similarly consists of further high-bias path line 262, C2 plate electrode 114, C2 body electrode 116, line 242, voltage source 246, and line 250. Gate electrodes 112 of varactors C1 and C2 are outside the capacitance signal paths.

Alternatively, varactors C1 and C2 may be considered to be in a single capacitance signal path that bypasses low-bias voltage source 246. In that case, the single capacitance signal path in the circuitry of FIG. 18 consists of high-bias path line 236, C1 plate electrode 114, C1 body electrode 116, low-bias control line 242, C2 body electrode 116, C2 plate electrode 114, and further high-bias path line 262. Gate electrodes 112 are outside the single capacitance signal path. Due to (a) the symmetrical arrangement of varactors C1 and C2 relative to symmetrical circuit 260 and (b) the common symmetrical way in which control system 232 controls varactors C1 and C2, the values of capacitances $C_V$ of varactors C1 and C2 are substantially the same at any time during circuitry operation. Since varactors C1 and C2 are in series with each other, the varactor capacitance in the single capacitance signal path is $C_V/2$, i.e., the series combination of two capacitances $C_V$.

Level shifter 234 is present in some implementations of the circuitry of FIG. 18 but not in others. Analogous to the positioning of shifter 234 in the circuitry of FIG. 17, shifter 234 here is connected between electronic circuit 260 and the $V_{HH}$ high voltage supply. In particular, shifter 234 is connected to each of the Z1 and Z2 high-bias DC paths so as to be electrically coupled to each of high-bias path lines 236 and 262. When shifter 232 is present, circuit 260 effectively receives, by way of the Z1 and Z1 high-bias DC paths, a high supply voltage which is shifter DC voltage drop $V_{LS}$ lower than high supply voltage $V_{HH}$ provided to control system 232. In the absence of shifter 232, circuit 260 receives the same high supply voltage, i.e., $V_{HH}$, as system 232.

Subject to the above-mentioned configurational differences, the circuitry of FIG. 18 operates similarly to, but in a symmetrical manner compared to, the circuitry of FIG. 17. Plate voltages $V_P$ and $V_{PF}$, the DC portions of respective composite plate voltages $v_P$ and $v_{PF}$ provided from circuit 260 to plate electrodes 114 of varactors C1 and C2 are maintained largely constant. Each DC plate voltage $V_P$ or $V_{PF}$ exceeds body voltage $V_B$. Due to the circuitry symmetry, plate voltages $V_P$ and $V_{PF}$ are largely equal.

Composite plate-to-body voltage $v_R$ consisting of DC plate-to-body bias voltage $V_R$ and AC plate-to-body voltage $v_r$ is applied between electrodes 114 and 116 of varactor C1 in the circuitry of FIG. 18 just as in the circuitry of FIG. 17. With low-bias control line 242 also providing body voltage $V_B$ to body electrode 116 of varactor C2, a further composite plate-to-body bias voltage $v_{RF}$ consisting of a further DC plate-to-body bias voltage $V_{RF}$ and a further AC plate-to-body voltage $v_{rf}$ is applied between electrodes 114 and 116 of varactor C2. Further DC plate-to-body voltage $V_{RF}$ is the difference between further DC plate voltage $V_{PF}$ and DC body voltage $V_B$ in the manner presented above in Eq. 10 for plate-to-body voltage $V_R$. Since DC plate voltages $V_P$ and $V_{PF}$ are largely equal, DC plate-to-body voltages $V_R$ and $V_{RF}$ are largely equal.

Control system 232 in the circuitry of FIG. 18 operates the same as in the circuitry of FIG. 17. Accordingly, low-bias voltage source 246 adjusts body voltage $V_B$ upward or downward dependent on the desired value of varactor capacitance $C_V$ in each of the C1 and C2 capacitance signal paths or, alternatively, dependent on the desired value of capacitance $C_V/2$ in the single capacitance signal path. With DC plate voltages $V_P$ and $V_{PF}$ being held constant at largely the same value, largely equal DC plate-to-body voltages $V_R$ and $V_{RF}$ respectively move upward or downward in a corresponding way to respectively adjust capacitances $C_V$ of varactors C1 and C2. High-bias voltage source 244 tracks low-bias voltage source 246 to maintain gate-to-body voltage largely constant at value $V_{GBi}$. The circuitry of FIG. 18 thereby performs an electronic function that varies with the common value of capacitances $C_V$.

Level shifter 234 affects the location of the $V_{Rmin}$-to-$V_{Rmax}$ range in the circuitry of FIG. 18 in the same way as in the circuitry of FIG. 17. Since DC plate-to-body voltages $V_R$ and $V_{RF}$ are largely equal, voltage $V_{Rmin}$ is the minimum value of voltage $V_R$ or $V_{RF}$ for the circuitry of FIG. 18. Voltage $V_{Rmax}$ is similarly the maximum value of voltage $V_R$ or $V_{RF}$ for the circuitry of FIG. 18.

Electronic circuit 260 can impact DC plate voltages $V_P$ and $V_{PF}$ by causing each of them to be reduced by a DC amount $V_K$. The resultant effect on the location of the $V_{Rmin}$-to-$V_{Rmax}$ range is the same as when electronic circuit 230 causes plate voltage $V_P$ to be reduced by DC amount $V_K$ in the circuitry of FIG. 17. Similar to what occurs in the circuitry of FIG. 17, voltages $V_P$ and $V_{PF}$ can sometimes vary in the circuitry of FIG. 18 while still remaining largely equal to each other.

The general circuitry of FIG. 18 can be readily modified to employ two of the present p-channel gate-enhanced junction varactors in place of n-channel junction varactors C1 and C2. Analogous to what was said above about similarly modifying the circuitry of FIG. 17, one way of implementing this modification is to reconfigure the circuitry of FIG. 18 so as to be interconnected in a manner complementary to what is shown in FIG. 18. High-bias path line 236 is then replaced with low-bias capacitance signal path line 238. Further, high-bias path line 262 is likewise replaced with an analogous further low-bias capacitance signal path line. High-bias impedance components Z1 and Z2 are respectively replaced with a pair of low-bias impedance components connected respectively through low-bias path line 238 and the further low-bias path line respectively to the plate electrodes (164) of the two replacement p-channel junction varactors.

Figure 19A:
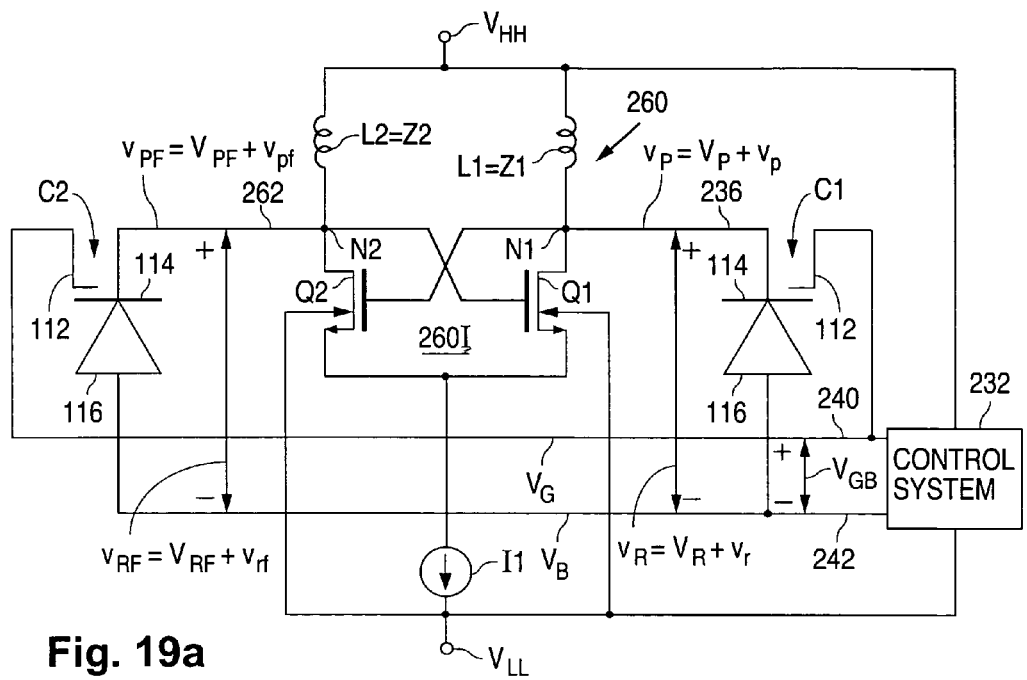
FIGS. 19a and 19b are circuit diagrams of two VCO implementations of the general electronic circuitry of FIG. 18.

FIG. 19a depicts a VCO implementation of the electronic circuitry of FIG. 18 for which level shifter 234 is absent. In FIG. 19a, electronic circuit 260 is implemented with a pair of largely identical cross-coupled n-channel enhancement-mode insulated-gate FETs Q1 and Q2, a pair of largely identical fixed-value inductors L1 and L2, and a current source I1. The drain of each FET Q1 or Q2 is connected to the gate electrode of the other FET Q2 or Q1. The lower end of inductor L1 is connected by way of a node N1 to the Q1 drain. The lower end of inductor L2 is similarly connected by way of a node N2 to the Q2 drain. The upper ends of inductors L1 and L2 are connected to the $V_{HH}$ Supply. Current source I1 is connected between the $V_{LL}$ supply and the interconnected sources of FETs Q1 and Q2.

Internal circuitry 260I of symmetrical circuit 260 consists of FETs Q1 and Q2 and current source I1 in the implementation of FIG. 19a. High-bias impedance components Z1 and Z2 are respectively implemented with inductors L1 and L2.

FETs Q1 and Q2 are typically formed from the same semiconductor body as varactors C1 and C2. The body regions of FETs Q1 and Q2 receive low supply voltage $V_{LL}$. In contrast, body regions 100 of varactors C1 and C2 receive body voltage $V_B$ which normally differs from $V_{LL}$. Accordingly, body regions 100 of varactors C1 and C2 need to be electrically isolated from the body regions of FETs Q1 and Q2.

The VCO of FIG. 19a operates in the following manner. When the VCO is turned on by raising high supply voltage $V_{HH}$ to a suitably high value relative to low supply voltage $V_{LL}$, the VCO begins to oscillate. That is, the drain currents of FETs Q1 and Q2 alternately switch between high and low values. The VCO typically needs only a small disturbance to start oscillating. DC plate-to-body voltages $V_R$ and $V_{RF}$ are controlled as described above for the general circuitry of FIG. 18.

Let $L_O$ represent the inductance of either of inductors L1 and L2. The VCO of FIG. 19a provides an oscillator signal (not separately shown) from the drain of FET Q1 or Q2 at a variable frequency $f_O$ given by Eq. 1 repeated below:

$$f_O = \frac{1}{2\pi\sqrt{L_O C_O}} \qquad (42)$$

where $C_O$ is now capacitance $C_V$ of either of varactors C1 and C2.

The VCO of FIG. 19a implements the circuitry of FIG. 18 for the situation in which DC plate voltages $V_P$ and $V_{PF}$ largely equal high supply voltage $V_{HH}$. This arises because impedance components Z1 and Z2 are implemented with inductors L1 and L2 across each of which there is largely no DC voltage drop. Minimum value $V_{Rmin}$ of plate-to-body voltages $V_R$ and $V_{RF}$ is then $V_{GBi}$, typically 0.5 V. Maximum value $V_{Rmax}$ of voltages $V_R$ and $V_{RF}$ is $V_{HH}$-$V_{LL}$. Accordingly, the maximum-to-minimum varactor capacitance ratio for the VCO of FIG. 19a is determined by end-range $V_R$ values extending from $V_{GBi}$ to $V_{HH}$-$V_{LL}$.

Figure 19B:
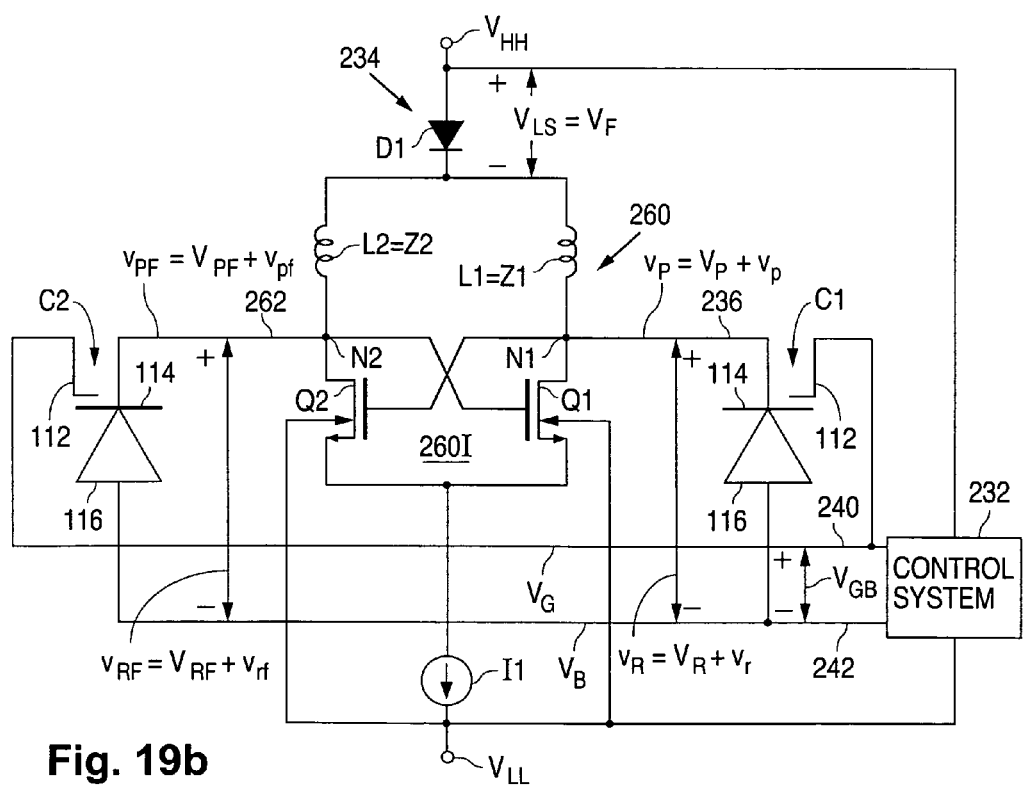

FIG. 19b presents another VCO implementation of the circuitry of FIG. 18. The VCO of FIG. 19b is configured to provide a greater frequency range than that achievable with the VCO of FIG. 19a. Except as described below, the VCO of FIG. 19b contains varactors C1 and C2, FETs Q1 and Q2, inductors L1 and L2, current source I1, and varactor control system 232 configured and operable the same as in the VCO of FIG. 19a. Internal circuitry 260I of circuit 260 again consists of FETs Q1 and Q2 and current source I1. Likewise, impedance components Z1 and Z2 are again respectively formed with inductors L1 and L2.

In addition, the VCO of FIG. 19b contains level shifter 234 implemented as a p-n diode D1. Level-shift voltage drop $V_{LS}$ is thus a diode forward voltage drop $V_F$ of 0.5-0.9 V, typically 0.7 V. Diode D1 and current source I1 cooperate to set the specific value of diode voltage drop $V_F$. Increasing the size of current source I1 so as to increase the sourced current flowing through source I1 cause diode voltage $V_F$ to increase, and vice versa.

The VCO of FIG. 19b implements the circuitry of FIG. 18 for the situation in which DC plate voltage $V_P$ substantially equals $V_{HH}$-$V_{LS}$. Hence, voltage $V_P$ substantially equals $V_{HH}$-$V_F$ here. As a result, minimum plate-to-body voltage $V_{Rmin}$ is $V_{GBi}$-$V_F$ while maximum plate-to-body voltage $V_{Rmax}$ is $V_{HH}$-$V_{LL}$-$V_F$. Fixed value $V_{GBi}$ of gate-to-body voltage $V_{GB}$ is again typically 0.5 V. Since diode drop voltage $V_F$ is typically 0.7 V, minimum plate-to-body voltage $V_{Rmin}$ in the VCO of FIG. 19b is quite close to zero, typically −0.2 V.

Compared to the $V_{Rmin}$-to-$V_{Rmax}$ range for the VCO of FIG. 19a, the $V_{Rmin}$-to-$V_{Rmax}$ range for the VCO of FIG. 19b is shifted downward by $V_F$, again typically 0.7 V. Referring to FIG. 16, the varactor capacitance changes much greater with increasing plate-to-body voltage $V_R$ before the short $V_R$ region in which the capacitance drops sharply in the vicinity of transition value $V_x$ than after the $V_R$ transition region. In particular, the varactor capacitance for the $C_{VA}(V_R)$ curve having gate-to-body voltage $V_{GB}$ equal to 0.5 V, i.e., value $V_{GBi}$ equals 0.5 V, in FIG. 16 drops very slowly with increasing voltage $V_R$ when voltage $V_R$ is greater than 0.5 V. Consequently, shifting the $V_{Rmin}$-to-$V_{Rmax}$ range downward by amount $V_F$ typically equal to 0.7 V substantially increases the maximum-to-minimum varactor capacitance ratio. In light of Eq. 42, the VCO of FIG. 19b has a greater frequency range than that of FIG. 19a.

The C1 and C2 capacitance signal paths in the general circuitry of FIG. 18 are, in the VCO of FIG. 19a or 19b, extended to be a pair of inductance-capacitance signal paths which respectively include inductors L1 and L2. From an AC perspective, varactor C1 and inductor L1 are situated in parallel with each other in the L1C1 inductance-capacitance signal path. Varactor C2 and inductor L2 are likewise situated in parallel with each other in the L2C2 inductance-capacitance signal path. Plate electrodes 114 and body electrodes 116 of varactors C1 and C2 are in the inductance-capacitance signal paths. Gate electrodes 112 of varactors C1 and C2 are outside the inductance-capacitance signal paths. Varactor C1 and inductor L1 form an oscillatory inductive-capacitive combination. Varactor C2 and inductor L2 likewise form an oscillatory inductive-capacitive combination.

The VCOs of FIGS. 19a and 19b can be operated in a unitary tuning-range mode or in a split tuning-range mode. In the unitary tuning-range mode, plate-to-body voltage $V_R$ or $V_{RF}$ can vary across the entire $V_{Rmin}$-to-$V_{Rmax}$ range and thus pass through transition value $V_X$ in the immediate vicinity of which varactor capacitance $C_V$ changes sharply. Control system 232 needs to control body voltage $V_B$ quite precisely in the unitary tuning-range mode because small changes in voltage $V_R$ or $V_{RF}$ produce large capacitance changes when voltage $V_R$ or $V_{RF}$ is close to value $V_X$.

In the split tuning-range mode, values of plate-to-body voltage $V_R$ or $V_{RF}$ in the immediate vicinity of transition value $V_X$ are avoided. Voltages $V_R$ and $V_{RF}$ each traverse two ranges, referred to as the low and high ranges, separated from each other by an intermediate $V_R$ interval in which varactor capacitance $C_V$ changes sharply. The low $V_R$ range extends from minimum value $V_{Rmin}$ to a low intermediate value $V_{RitmL}$ below the intermediate $V_R$ interval. The high range extends from a high intermediate value $V_{RitmH}$ above the intermediate interval to maximum value $V_{Rmax}$. When voltage $V_R$ or $V_{RF}$ switches from the low range to the high range, capacitance $C_V$ jumps from a high value to a low value, and vice versa. Control system 232 is provided with suitable switching circuitry for switching between the low and high $V_R$ ranges.

Further Computer Simulation

The sharp change that capacitance $C_V$ of the present gate-enhanced junction varactor undergoes when plate-to-body bias voltage $V_R$ passes through transition value $V_X$ at constant gate-to-body bias voltage $V_{GB}$ can be made more gradual with changing voltage $V_R$ by appropriately adjusting voltage $V_{GB}$ as a function of voltage $V_R$, thereby enabling capacitance $C_V$ to be controlled more accurately. With reference to FIG. 16, gate-to-body voltage $V_{GB}$ should ideally be varied so that, as plate-to-body voltage $V_R$ increases, the varactor's capacitance-voltage characteristics progressively shift to curves of higher voltage $V_{GB}$ with the operational point on each curve being close to the $V_X$ transition point. More particularly, voltage $V_{GB}$ should be adjusted so that transition value $V_X$ is approximately equal to voltage $V_R$ at each different $V_R$ value.

As indicated by Eq. 37, transition value $V_X$ varies nearly linearly with gate-to-body voltage $V_{GB}$. By imposing the condition that transition value $V_X$ equal plate-to-body voltage $V_R$ for each different $V_R$ value, Eq. 37 is converted to:

$$V_R = \alpha(V_{GB} - V_{T0}) \tag{43}$$

where constant α is normally less than 1, e.g., 0.79 in the linear approximation of FIG. 12. Rearranging Eq. 43 yields the condition:

$$V_{GB} = \frac{V_R}{\alpha} - V_{T0} \tag{44}$$

for varying voltage $V_{GB}$ so as to avoid the sharp $C_{VW}$ changes depicted in FIG. 16. Adjusting voltage $V_{GB}$ generally in accordance with Eq. 44 results in voltage $V_{GB}$ varying linearly with voltage $V_R$. Because constant α is normally less than 1, implementing the condition of Eq. 44 can sometimes be difficult.

A suitable alternative to the condition of Eq. 44 is to control gate-to-body voltage $V_{GB}$ so that it satisfies the relationship:

$$V_{GB} = V_R + V_{GP} \tag{45}$$

where $V_{GP}$ is a non-zero constant voltage value. As with Eq. 44, adjusting voltage $V_{GB}$ in accordance with Eq. 45 results in voltage $V_{GB}$ varying linearly with plate-to-body voltage $V_R$. Importantly, the condition of Eq. 45 is easier to implement because voltage $V_R$ in Eq. 45 is not multiplied by a non-unitary factor such as constant α in Eq. 44. Imposing the condition of Eq. 45 specifically requires that voltage $V_{GB}$ directly track voltage $V_R$, or vice versa.

Voltage difference $V_{GB} - V_R$ is the gate-to-plate voltage for the present varactor. Accordingly, the condition of Eq. 45 requires that the gate-to-plate voltage be held constant at a suitable non-zero value.

Figure 20A:
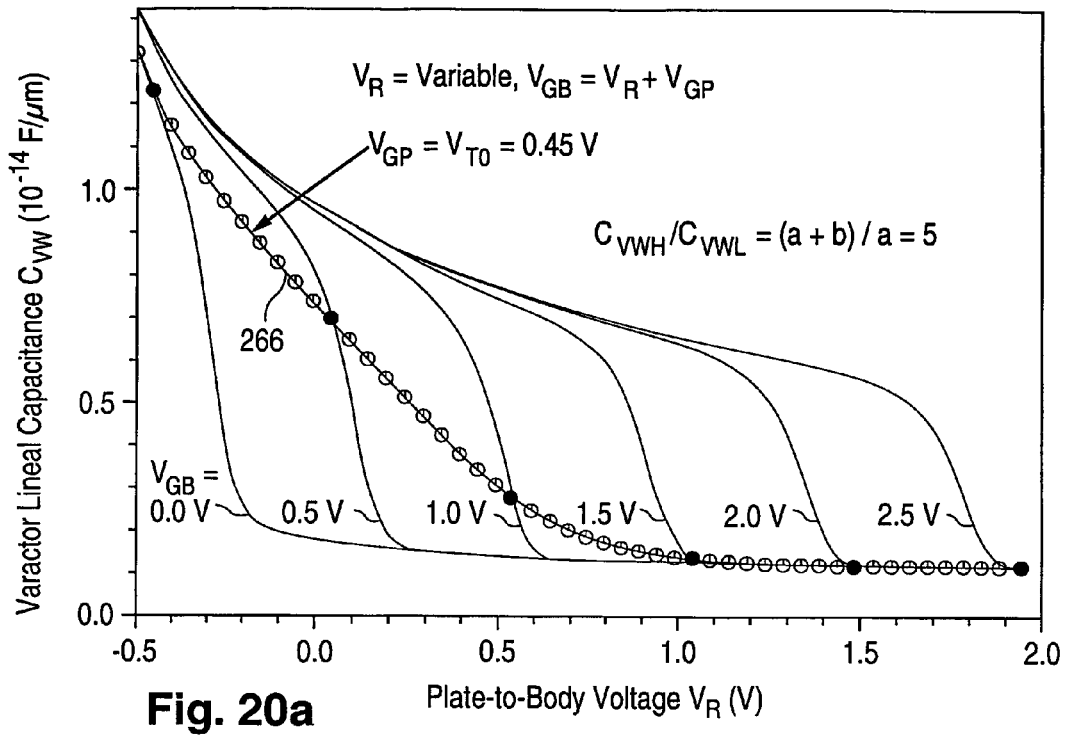
FIGS. 20a and 20b are graphs of varactor widthwise lineal capacitance as a function of plate-to-body bias voltage at a constant difference between the gate-to-body and plate-to-body bias voltages.

FIG. 20a illustrates how widthwise lineal capacitance $C_{VW}$ varies with plate-to-body voltage $V_R$ for the simulated varactor of FIG. 15 when gate-to-body voltage is adjusted according to the condition of Eq. 45 with gate-to-plate voltage $V_{GP}$ being set at zero-point gate threshold value $V_{T0}$, approximately 0.45 V. See curve 266 defined by circles in FIG. 20a. For reference purposes, FIG. 20a also repeats the six curves of FIG. 16 at constant values of voltage $V_{GB}$. As curve 266 indicates, adjusting voltage $V_{GB}$ so that voltage $V_{GP}$ is held constant at threshold value $V_{T0}$ enables capacitance $C_{VW}$ to decrease gradually with increasing voltage $V_R$ and thereby avoids the sharp $C_{VW}$ change that occur when voltage $V_{GB}$ is constant. This significantly facilitates controlling the varactor capacitance and alleviates problems caused by noise in the control path.

Figure 20B:
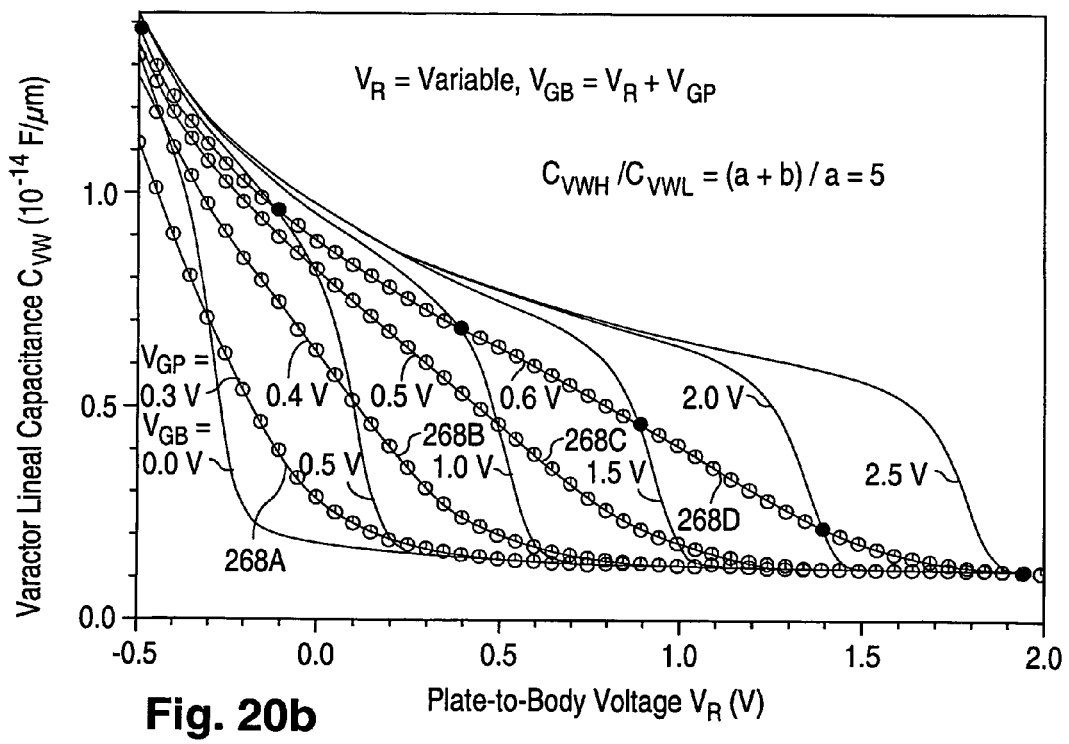

FIG. 20b depicts how lineal capacitance $C_{VW}$ varies with plate-to-body voltage $V_R$ for the present simulated varactor when gate-to-body voltage $V_{GB}$ is controlled according to Eq. 45 with gate-to-plate voltage $V_{GB}$ fixed at values ranging from 0.3 V in 0.1-V increments to 0.6 V. See curves 268A, 268B, 268C, and 268D defined by circles in FIG. 20b. As in FIG. 20a, the six curves of FIG. 16 at constant values of voltage $V_{GB}$ are also repeated in FIG. 20b for reference purposes.

Curves 268A, 268B, 268C, and 268D in FIG. 20b show that the $C_{VW}$ variations with plate-to-body voltage $V_R$ becomes progressively more gradual as gate-to-plate voltage $V_{GP}$ is raised from a constant value of 0.3 V to a constant value of 0.6 V. Also, capacitance $C_{VW}$ for each of curves 268A, 268B, 268C, and 268D changes approximately linearly with increasing voltage $V_R$ over the majority of the minimum-to-maximum varactor capacitance range. This further simplifies controlling the varactor capacitance as a function of voltage $V_R$.

Among the four values of gate-to-plate voltage $V_{GB}$ presented in FIG. 20b, fixing voltage $V_{GP}$ at 0.6 V as represented by curve 268D generally enables the varactor capacitance to be controlled best because the change in varactor capacitance with increasing plate-to-body voltage $V_R$ is most gradual. Other considerations may place the optimum value of voltage $V_{GB}$ at a point between 0.5 V and 0.6 V.

Figure 21:
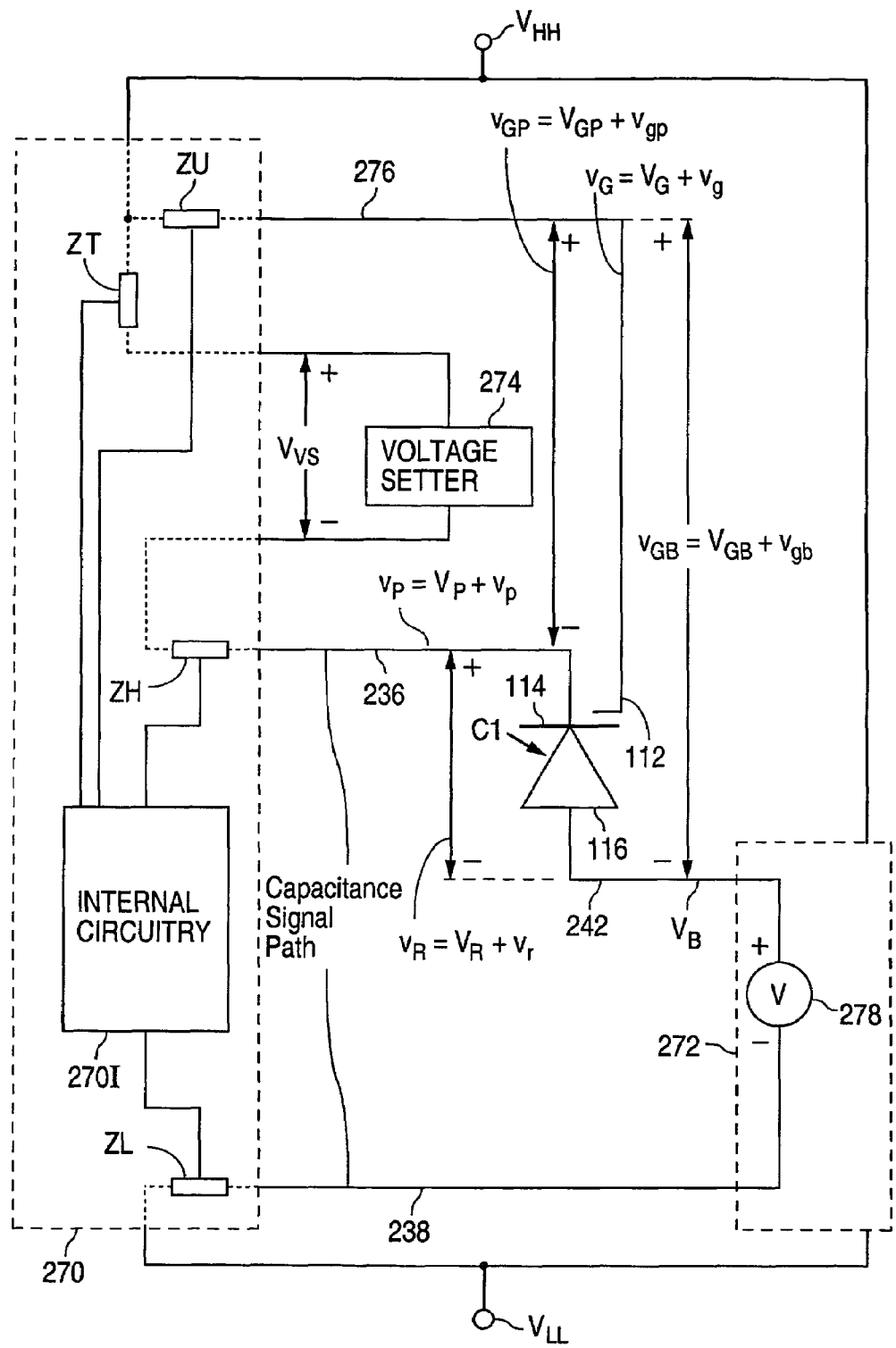
FIG. 21 is a circuit diagram of further general electronic circuitry which employs a gate-enhanced junction varactor according to the invention.

FIG. 21 illustrates general electronic circuitry configured in accordance with the invention for utilizing an n-channel version of the present gate-enhanced junction varactor in which gate-to-body bias voltage $V_{GB}$ varies with plate-to-body bias voltage $V_R$ in such a way that gate-to-plate bias voltage $V_{GP}$ is held largely constant at a suitable non-zero value. The electronic circuitry of FIG. 21 is connected between voltage supplies $V_{HH}$ and $V_{LL}$. The components of the circuitry in FIG. 21 consist of a general electronic circuit 270, n-channel junction varactor C1, a varactor control system 272, and a voltage setter 274.

The electronic circuitry, primarily circuit 270, in FIG. 21 has a capacitance signal path for receiving varactor C1 to enable the circuitry to perform an electronic function dependent on variable varactor capacitance $C_V$. Plate electrode 114 and body electrode 116 of varactor C1 are situated in the capacitance signal path. Analogous to how the capacitance signal path is terminated at circuit 230 in the circuitry of FIG. 17, bias capacitance signal path lines 236 and 238 terminate the capacitance signal path at circuit 270 in the circuitry of FIG. 21. High-bias path line 236 is again connected to plate electrode 114 for providing plate voltage $V_P$ to varactor C1. Plate voltage $V_P$ is the DC portion of composite plate voltage $v_P$ supplied on path line 236, voltage $v_p$ being the AC portion.

Electronic circuit 270 is formed with internal circuitry 270I, high-bias impedance component ZH, low-bias impedance component ZL, and two additional impedance components ZU and ZT. Internal circuitry 270I can interact with impedance components ZH, ZL, ZT, and ZU in various ways. For the purpose of generality, FIG. 21 simply depicts circuitry 270I as being connected by four respective electrical lines to components ZH, ZL, ZT, and ZU.

Internal circuitry 270I may interact with either of both of impedance components ZT and ZU by way of high-bias impedance component ZH (or even by way of low-bias impedance component ZL). Circuitry 270I may also interact with one of components ZT and ZU by way of the other component. Furthermore, circuitry 270I may be connected directly or indirectly by more than one electrical line to any of components ZH, ZL, ZT, and ZU. The lines shown as connecting circuitry 270I to components ZH, ZL, ZT, and ZU in FIG. 21 are thus intended to represent interactions rather than specific electrical connections. Analogous to what was said above about the general circuitry of FIG. 17, the line extending from circuitry 270I to component ZH here may be connected to an end of component ZH even though that line is depicted as touching an intermediate point on component ZH in FIG. 21. The same applies to the lines respectively connecting circuitry 270I to components ZL, ZT, and ZU.

Impedance components ZH, ZL, ZT, and ZU here can be configured in the ways generally described above for components ZH and ZL in the circuitry of FIG. 17. Accordingly, each of components ZH, ZL, ZT and ZU may consist of one or more passive electrical elements or/and one or more active electrical elements. Any of components ZH, ZL, ZT, and ZU can be of substantially zero impedance in some implementations of circuit 270. Each component ZH, ZL, ZT, or ZU can thus sometimes simply be an electrical line.

High-bias impedance component ZH is part of a high-bias DC electrically conductive path which extends through circuit 270 and through which high-bias capacitance signal path line 236 is electrically coupled to voltage setter 274. Analogous to what occurs in the circuitry of FIG. 17, low-bias impedance component ZL here is part of a low-bias electrically conductive DC path which extends through circuit 270 and through which low-bias capacitance signal path line 238 is electrically coupled to the $V_{LL}$ low voltage supply.

Impedance component ZT is part of an electrically conductive DC path which extends through circuit 270 and through which voltage setter 274 is electrically coupled to the $V_{HH}$ high voltage supply. Since the ZH high-bias DC path electrically couples high-bias path line 236 to setter 274, the ZH and ZT DC paths are parts of a longer electrically conductive DC path through which path line 236 is electrically coupled to the $V_{HH}$ supply. Impedance component ZU is part of an electrically conductive DC path which extends through circuit 270 and through which an electrical line 276 connected to gate electrode 112 of varactor C1 is electrically coupled to the $V_{HH}$ supply.

Varactor control system 272 furnishes varactor C1 with DC body voltage $V_B$ at a bias value which normally varies during circuitry operation. In particular, gate electrode 112 of varactor C1 receives body voltage $V_B$ on low-bias control line 242 connected to control system 270. Voltage $V_B$ is provided from a low-bias voltage source 278 connected between control line 242 and low-bias capacitance signal path line 238.

With body electrode 116 of varactor C1 being in the capacitance signal path, voltage source 278 of control system 272 is in the capacitance signal path. Hence, the capacitance signal path here consists of high-bias path line 236, electrodes 114 and 116, control line 242, voltage source 278, and low-bias path line 238. Gate electrode 112 of varactor C1 is again outside the capacitance signal path. Also, control system 272 is normally connected between the $V_{HH}$ and $V_{LL}$ voltage supplies.

A composite gate voltage $V_G$ consisting of DC gate voltage $V_G$ and an AC gate voltage $v_g$ is provided from electronic circuit 270 on electrical line 276 to gate electrode 112 of varactor C1. Impedance component ZU is of such a nature in some implementations of circuit 270 that substantially no DC voltage drop occurs across component ZU. Since the ZU DC path connects line 276 to the $V_{HH}$ high voltage supply, DC gate voltage $V_G$ is then simply high voltage supply $V_{HH}$, normally substantially constant. In further implementations where component ZU is of substantially zero impedance, AC gate voltage $v_g$ is substantially zero. Composite gate voltage $V_G$ then devolves to DC gate voltage $V_G$ which equals $V_{HH}$.

Voltage setter 274 is, as indicated above, connected between the ZT DC path and the ZH high-bias DC path. With the ZT DC path being connected to the $V_{HH}$ high voltage supply, setter 274 receives current from the $V_{HH}$ supply. As this current flows through setter 274 to circuit 270, a largely constant voltage drop $V_{VS}$ occurs across setter 274. The magnitude of voltage drop $V_{VS}$ can be controlled substantially solely by setter 274 or by setter 274 in combination with one or more circuitry elements in circuit 270.

With DC voltages $V_P$ and $V_B$ again being referenced to low supply voltage $V_{LL}$, the circuitry of FIG. 21 operates generally in the following manner. Voltage setter 274 and impedance components ZH, ZT, and ZU of circuit 270 together apply a composite gate-to-plate voltage $v_{GP}$ between gate electrode 112 and plate electrode 114 at a suitable non-zero value. Composite gate-to-plate voltage $v_{GP}$ consists of DC gate-to-plate bias voltage $V_{GP}$ and an AC gate-to-plate voltage $v_{gp}$. Components ZH, ZT, and ZU are normally of such a nature that a largely constant DC voltage drop $V_Z$ occurs across them. This causes gate-to-plate bias voltage $V_{GP}$ to equal the sum of DC impedance voltage drop $V_Z$ and DC setter voltage $V_{VS}$. Voltage $V_{GP}$ is thus largely constant at a non-zero value during circuitry operation.

In some implementations of circuit 270, impedance components ZH, ZT, and ZU are of such a nature that DC impedance voltage drop $V_Z$ is very close to zero. Gate-to-plate bias voltage $V_{GP}$ then approximately equals DC setter voltage $V_{VS}$. Regardless of whether impedance voltage $V_Z$ is zero or some positive constant value, voltage setter 274 controls the value of voltage $V_{GP}$. Importantly, voltage $V_{GP}$ is controlled by the circuitry of FIG. 21 so as to be largely constant during circuitry operation.

DC gate voltage $V_G$ is often largely constant at high supply voltage $V_{HH}$ or at a value close to, but less than, $V_{HH}$ in the circuitry of FIG. 21. Voltage $V_G$ largely equals $V_{HH}$ when impedance component ZU is of such a nature that largely no DC voltage drop occurs component ZU. In any event, the sum of DC plate voltage $V_P$ and DC plate-to-gate voltage $V_{GP}$ equals gate voltage $V_G$. Since gate-to-plate voltage $V_{GP}$ equals the sum of largely constant voltages $V_{VS}$ and $V_Z$, plate voltage $V_P$ is a largely constant amount $V_{VS}+V_Z$ below gate voltage $V_G$. For the exemplary situation in which gate voltage $V_G$ is largely $V_{HH}$ with impedance voltage drop $V_Z$ being largely zero, plate voltage $V_P$ is largely fixed at $V_{HH}-V_{VS}$.

A composite gate-to-body voltage $v_{GB}$ consisting of DC gate-to-body bias voltage $V_{GB}$ and an AC gate-to-body voltage $v_{gb}$ is applied between electrodes 112 and 116 of varactor C1. Unlike the circuitry of FIG. 17 where AC gate-to-body voltage $v_{gb}$ is zero (or is not present), voltage $v_{gb}$ is present at a variable value in the circuitry of FIG. 21 when impedance component ZU is of non-zero impedance so that AC gate voltage $v_g$ is present at a variable value. As in the circuitry of FIG. 17, composite plate-to-body voltage $v_R$ consisting of DC plate-to-body bias voltage $V_R$ and AC plate-to-body voltage $v_r$ is applied here between electrodes 114 and 116 of varactor C1. DC gate-to-body bias voltage $V_{GB}$ equals DC plate-to-body bias voltage $V_R$ plus gate-to-plate bias voltage $V_{GP}$. Inasmuch as DC gate-to-plate voltage $V_{GP}$ equals the sum of voltages $V_{VS}$ and $V_Z$, DC gate-to-body voltage $V_{GB}$ equals the sum of voltages $V_R$, $V_{VS}$, and $V_Z$. Again, impedance voltage $V_Z$ is sometimes zero or close to zero.

In addition to often being largely constant at high supply voltage $V_{HH}$ or at a value close to $V_{HH}$, DC gate voltage $V_G$ is normally greater than DC body voltage $V_B$. Adjusting body voltage $V_B$ upward or downward produces an opposite change in gate-to-body voltage $V_{GB}$ which, in turn, produces an opposite change in plate-to-body voltage $V_R$ while gate-to-plate voltage $V_{GP}$ is being held largely constant at $V_{VS}+V_Z$, often approximately $V_{VS}$. Varactor C1 again operates internally as described above in connection with the varactor of FIG. 8. Varactor capacitance $C_V$ is thereby adjusted in the way generally described above in connection with Eq. 45 to enable the circuitry of FIG. 21 to perform an electronic function that varies with the $C_V$ value.

Body voltage $V_B$ in the circuitry of FIG. 21 can generally go as low as low supply voltage $V_{LL}$ and as high as high supply voltage $V_{HH}$. The sum of gate-to-body voltage $V_{GB}$ and body voltage $V_B$ can often be as high as high supply voltage $V_{HH}$. Accordingly, gate-to-body voltage $V_{GB}$ can often be varied across a range extending from zero to $V_{HH}-V_{LL}$. Inasmuch, as plate-to-body bias voltage $V_R$ equals $V_{GB}-V_{VS}-V_Z$, minimum plate-to-body voltage $V_{Rmin}$ is normally $-(V_{VS}+V_Z)$ while maximum plate-to-body voltage $V_{Rmax}$ is normally $V_{HH}-V_{LL}-V_{VS}-V_Z$. The $V_{Rmin}$-to-$V_{Rmax}$ range is the full supply voltage range $V_{HH}-V_{LL}$.

Importantly, minimum plate-to-body voltage $V_{Rmin}$ is negative in sign at a magnitude equal to the sum of setter voltage drop $V_{VS}$ and impedance voltage drop $V_Z$. Even though the varactor capacitance changes more gradually as plate-to-body voltage $V_R$ passes through transition value $V_X$ when gate-to-plate bias voltage $V_{GP}$ is held largely constant, as occurs in the circuitry of FIG. 21, compared to what arises when gate-to-body bias voltage $V_{GB}$ is held largely constant, as occurs in the circuitry of FIG. 17, the varactor capacitance still changes more with increasing voltage $V_R$ before the now-extended $V_R$ transition region than after the $V_R$ transition region. See FIGS. 20a and 20b. By having minimum plate-to-body voltage $V_R$ be negative, the circuitry of FIG. 21 makes efficient use of the varactor capacitance-voltage characteristics so as to enable a high value of the maximum-to-minimum varactor capacitance ratio to be achieved.

If the sum of voltage drops $V_{VS}$ and $V_Z$ is so high that p-n junction 104 of varactor C1 would be significantly conductively forward biased at the resulting minimum value $V_{Rmin}$, i.e. $-(V_{VS}+V_Z)$, of plate-to-body voltage $V_R$, control system 272 can control body voltage $V_B$ so that it stops a DC amount $V_Y$ short of high supply voltage $V_{HH}$. That is, body voltage $V_B$ only travels as high as $V_{HH}-V_Y$. As a result, minimum plate-to-body voltage $V_{Rmin}$ is adjusted to $V_Y-V_{VS}-V_Z$ for the circuitry of FIG. 21. The value of voltage adjustment $V_Y$ is chosen to be sufficiently high that junction 104 does not become significantly conductively forward biased.

The general circuitry of FIG. 21 can be readily modified to accept a p-channel version of the present gate-enhanced junction varactor in place of n-channel junction varactor C1. One way of implementing this modification is to reconfigure the circuitry so that it is interconnected in a manner complementary to what is shown in FIG. 21. This reconfiguration is performed as described above for the analogous reconfiguration of the circuitry of FIG. 17 subject to components 270, 272, and 274 respectively replacing components 230, 232, and 234.

Figure 22:
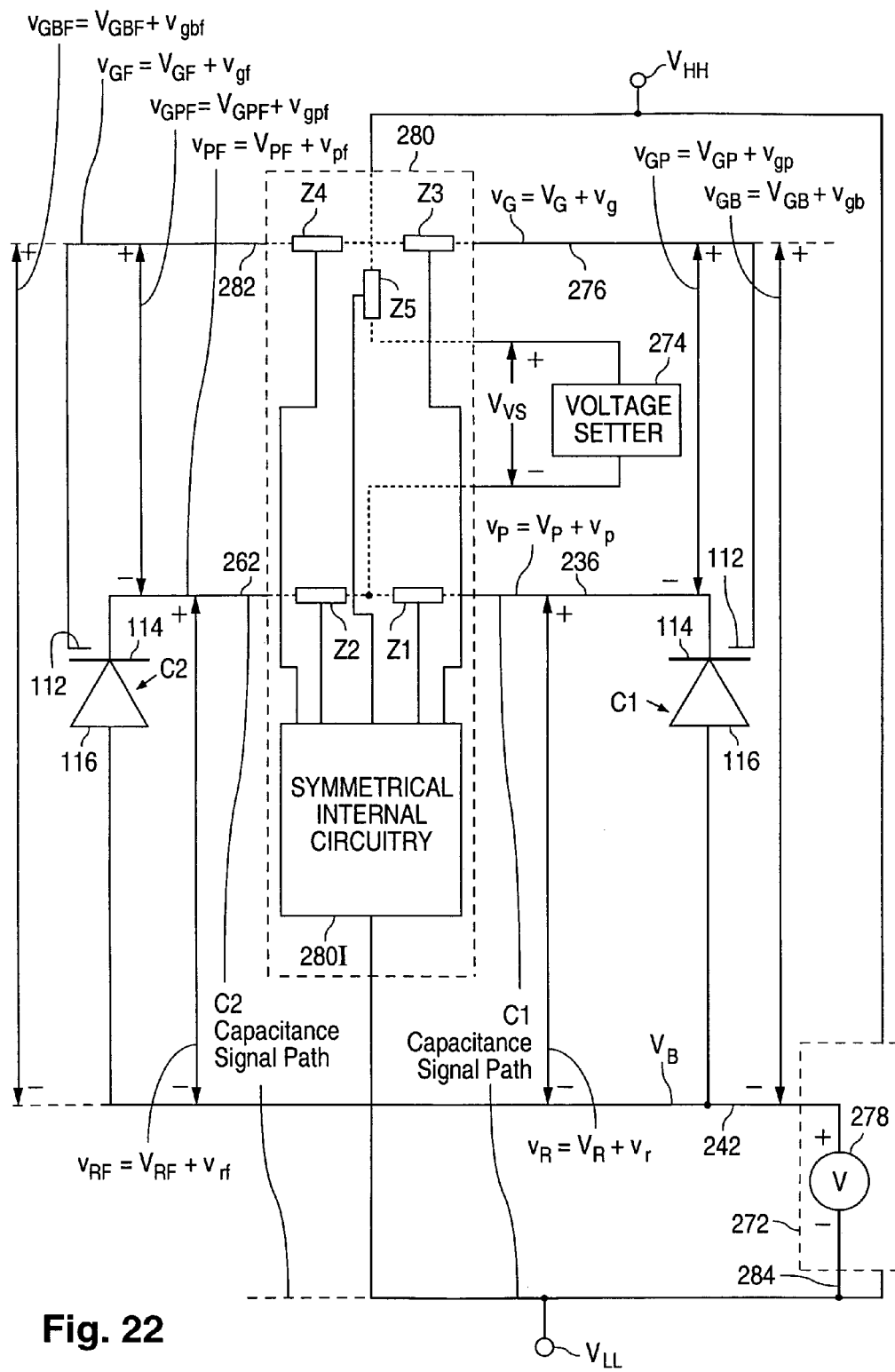
FIG. 22 is a circuit diagram of further general electronic circuitry which employs a pair of gate-enhanced junction varactors positioned symmetrically around a symmetrical circuit according to the invention.

An extension, or application, in accordance with the invention of the general electronic circuitry of FIG. 21 to the use of a pair of n-channel versions of the present varactor with symmetrical circuitry is presented in FIG. 22. As in the circuitry of FIG. 21, gate-to-body bias voltage $V_{GB}$ varies with plate-to-body bias voltage $V_R$ in such a manner that gate-to-plate bias voltage $V_{GP}$ is held largely constant at a suitable non-zero value during varactor operation in the general electronic circuitry of FIG. 22. The components of the electronic circuitry of FIG. 22 consist of a general symmetrical electronic circuit 280, varactors C1 and C2, varactor control system 272, and voltage setter 274.

The electronic circuitry, primarily symmetrical circuit 280, in FIG. 22 has a pair of capacitance signals path for respectively receiving varactors C1 and C2 to enable the circuitry to perform an electronic function dependent on variable capacitances $C_V$. Analogous to the electronic circuitry of FIG. 18, one end of the C1 capacitance signal path in the circuitry of FIG. 22 consists of high-bias capacitance signal path line 236 that terminates at circuit 280. One end of the C2 capacitance signal path similarly consists of further high-bias capacitance signal path line 262 that also terminates at circuit 280.

Symmetrical circuit 280 is formed with symmetrical internal circuitry 280I, high-bias impedance components Z1 and Z2, a pair of largely identical impedance components Z3 and Z4, and an additional impedance component Z5. Analogous to what occurs in the circuitry of FIG. 18, impedance components Z1 and Z2 are respective parts of a pair of high-bias electrically conductive DC paths which extend through circuit 280 and through which high-bias DC paths 236 and 262 are respectively coupled to voltage setter 274.

Analogous to impedance component ZU in the circuitry of FIG. 21, impedance component Z3 is part of an electrically conductive DC path which extends through circuit 280 and through which electrical line 276 connected to C1 gate electrode 112 is electrically coupled to the $V_{HH}$ high voltage supply. Impedance component Z4 is similarly part of an electrically conductive DC path which extends through circuit 280 and through which an electrical line 282 connected to C2 gate electrode 112 is electrically coupled to the $V_{HH}$ supply. Analogous to impedance components ZH in the circuitry of FIG. 21, impedance component Z5 is part of a electrically conductive DC path which extends through circuit 280 and through which voltage setter 274 is electrically coupled to the $V_{HH}$ supply. Accordingly, impedance components Z3, Z4, and Z5 are parts of a pair of longer electrically conductive DC paths through which paths 236 and 262 are electrically coupled to the $V_{HH}$ supply.

Internal symmetrical circuitry 280I of circuit 280 consists of electronic circuitry configured symmetrically with respect to impedance components Z1-Z5. Internal circuitry 280I can interact with components Z1-Z5 in various ways. For purpose of generality, FIG. 22 simply depicts circuitry 280I as being connected to components Z1-Z5 by five respective electrical lines. Similar to what was stated above about the four lines shown as connecting internal circuitry 270I to impedance components ZH, ZL, ZT, and ZU in FIG. 21, the lines shown as connecting circuitry 280I to components Z1-Z5 in FIG. 22 are intended to represent interactions rather than specific electrical connections. The comments made above the constituency of impedance components ZH, ZT, and ZU and about the ZH, ZT, and ZU connection points of the electrical lines shown as extending from internal circuitry 270I to components ZH, ZT, and ZU in the circuitry of FIG. 21 apply here to components Z1-Z5 and the electrical lines illustrated as connecting circuitry 280I to components Z1-Z5 in the circuitry of FIG. 22.

Internal circuitry 280I is also connected to the $V_{LL}$ low voltage supply. Circuitry 280I may be connected to the $V_{LL}$ supply by multiple paths. As with earlier internal circuitry 260I, circuitry 280I may be connected to the $V_{HH}$ high voltage supply by multiple paths separate from those going through impedance components Z1-Z5. These supply-voltage paths are arranged symmetrically in circuit 280I. Consequently, circuitry 280I is internally symmetrical and is symmetrically configured relative to varactors C1 and C2. Examples of the symmetrical nature of circuitry 280I are presented below in connection with FIGS. 23a and 23b.

Control system 272 in the circuitry of FIG. 22 is configured with respect to, and controls, varactor C1 in the same way as in the circuitry of FIG. 21. The same applies to varactor C2. Hence, voltage source 278 provides body voltage $V_B$ on low-bias control line 242 to body electrodes 116 of varactors C1 and C2. Voltage source 278 is here connected to the $V_{LL}$ low voltage supply by way of an electrical line 284.

Similar to the circuitry of FIG. 18, the second ends of the C1 and C2 capacitance signal paths terminate at the $V_{LL}$ low voltage supply in the circuitry of FIG. 22. The C1 capacitance signal path in FIG. 22 specifically consists of high-bias capacitance signal path line 236, C1 plate electrode 114, C1 body electrode 116, control line 242, voltage source 278, and electrical line 284. The C2 capacitance signal path similarly consists of high-bias capacitance signal path line 262, C2 plate electrode 114, C2 body electrode 116, line 242, voltage source 278, and line 284. Gate electrodes 112 of varactors C1 and C2 are again outside the capacitance signal paths.

Also similar to what was said above about the circuitry of FIG. 18, varactors C1 and C2 in the circuitry of FIG. 22 can alternately be considered to be in a single capacitance signal path that bypasses voltage source 278. The single capacitance signal path then consists of high-bias path line 236, C1 plate electrode 114, C1 body electrode 116, control line 242, C2 body electrode 116, C2 plate electrode 114, and high-bias path line 262 just as in circuitry of FIG. 18. Gate electrodes 112 are outside the single capacitance signal path in the circuitry of FIG. 22.

Subject to the above-mentioned configurational differences, the circuitry of FIG. 22 operates in a similar, but symmetrical, manner to that of FIG. 21. Insofar as symmetry is concerned, the circuitry of FIG. 22 operates similarly to that of FIG. 18.

In light of the foregoing analogies to the circuits of FIGS. 18 and 21, a further composite gate voltage $v_{GF}$ consisting of a further DC gate voltage $V_{GF}$ and a further AC gate voltage $v_{gf}$ is provided from circuit 280 on line 282 to gate electrode 112 of varactor C2. DC gate voltages $V_G$ and $V_{GF}$ are largely equal. A further composite gate-to-body voltage $v_{GBF}$ consisting of a further DC gate-to-body bias voltage $V_{GBF}$ and a further AC gate-to-body voltage $v_{gbf}$ is applied between electrodes 112 and 116 of varactor C2. DC gate-to-body bias voltages $V_{GB}$ and $V_{GBF}$ are largely equal.

As in the circuitry of FIG. 18, DC plate voltages $V_G$ and $V_{GF}$ are largely equal in the circuitry of FIG. 22. The same apples to DC plate-to-body bias voltages $V_R$ and $V_{RF}$, and to DC gate-to-plate bias voltages $V_{GP}$ and $V_{GPF}$. Importantly, each of voltages $V_{GP}$ and $V_{GPF}$ is approximately constant at a value equal to the sum of setter voltage $V_{VS}$ and impedance voltage $V_Z$. Since DC plate-to-gate voltages $V_R$ and $V_{RF}$ are largely equal, adjusting body voltage $V_B$ causes voltages $V_R$ and $V_{RF}$ to change and thereby adjust the values of capacitances $C_V$ while gate-to-plate voltages $V_{GP}$ and $V_{GPF}$ are maintained approximately constant. The circuitry of FIG. 22 thereby implements Eq. 45.

The general circuitry of FIG. 22 can be readily modified to use two of the present p-channel gate-enhanced junction varactors in place of n-channel junction varactors C1 and C2. One way of implementing this modification is to reconfigure the circuitry of FIG. 22 to be interconnected in a complementary manner to what is shown in FIG. 22 according to the general comments presented above for similarly modifying the circuitry of FIG. 18.

Figure 23A:
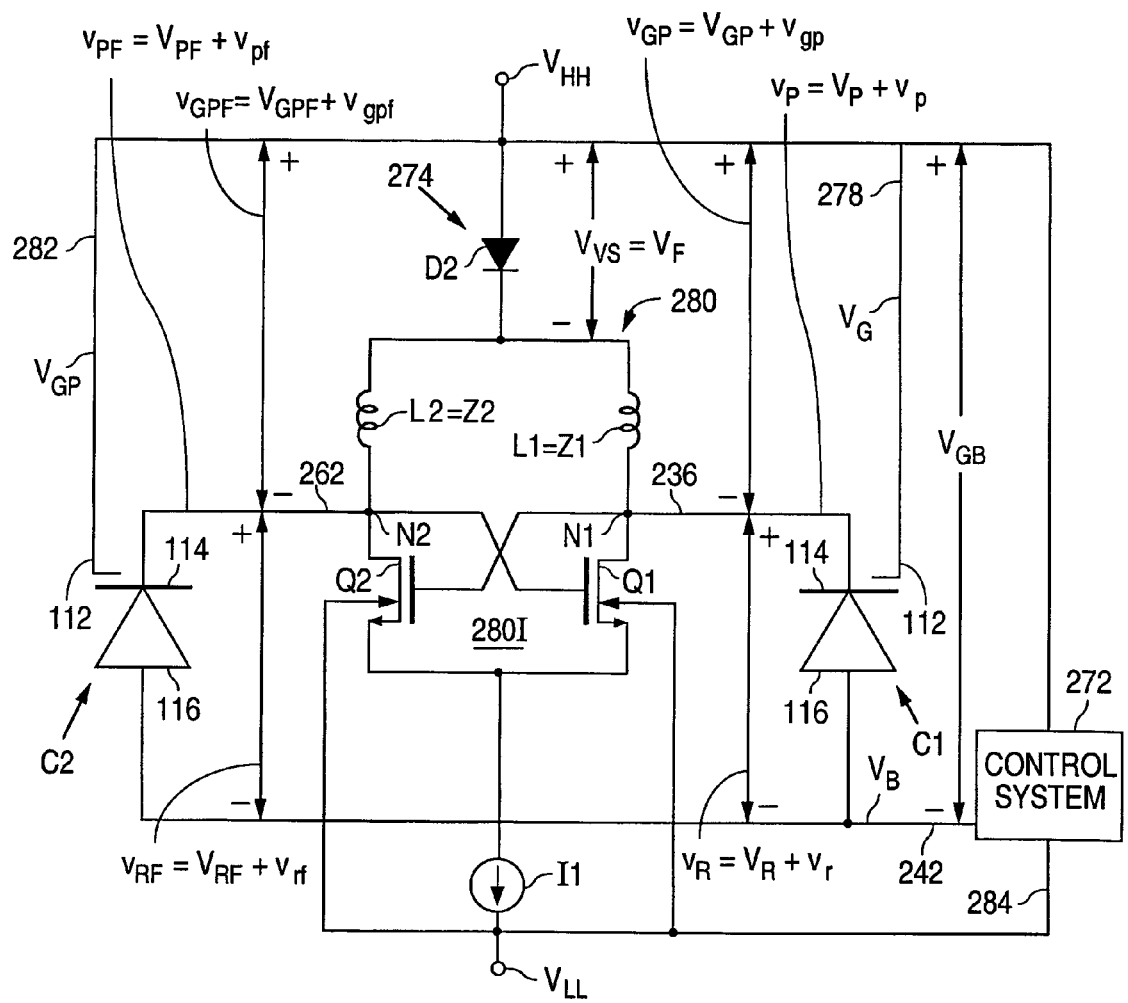
FIGS. 23a and 23b are circuit diagrams of two VCO implementations of the general electronic circuitry of FIG. 22.

FIG. 23a depicts a VCO implementation of the circuitry of FIG. 22. Electronic circuit 280 is implemented here with FETs Q1 and Q2, inductors L1 and L2, and current source I1 configured and operable the same as in circuit 260 of FIG. 19a except for the upper-end connections of inductors L1 and L2. Internal circuitry 280I of circuit 280 here consists of FETs Q1 and Q2 and current source I1. Similarly, high-bias impedance components Z1 and Z2 are respectively implemented with inductors L1 and L2 in the VCO of FIG. 23a.

Impedance components Z3-Z5 are each of largely zero impedance in the VCO of FIG. 23a. In other words, components Z3-Z5 are simply electrical lines in this VCO. Impedance voltage drop $V_Z$ is therefore largely zero. Also, each of plate voltages $V_G$ and $V_{GP}$ is substantially high supply voltage $V_{HH}$ in the VCO of FIG. 19a.

Voltage setter 274 is implemented as a p-n diode D2 which couples the $V_{HH}$ supply to the upper ends of inductors L1 and L2. Setter voltage drop $V_{VS}$ here is a diode forward voltage drop $V_F$ of 0.5-0.9 V, again typically 0.7 V. Diode D2 and current source I1 cooperate to set the specific value of diode drop $V_F$. As with diode D1 and current source I1 in the VCO of FIG. 19, increasing the size of current source I1 so as to increase its current causes voltage $V_F$ to increase, and vice versa. Since impedance voltage $V_Z$ is largely zero, each of DC gate-to-plate bias voltage $V_{GP}$ and $V_{GPF}$ is largely setter voltage drop $V_{VS}$ and thus equals $V_F$. Each of DC plate voltages $V_P$ and $V_{PF}$ is largely fixed at $V_{HH}-V_F$.

The VCO of FIG. 23a operates in the following manner. When high supply voltage $V_{HH}$ is raised to a sufficiently high value above low supply voltage $V_{LL}$, the VCO begins to oscillate. Plate-to-body bias voltages $V_R$ and $V_{RF}$ are controlled in the manner described above in connection with the general circuitry of FIG. 22. Accordingly, the VCO of FIG. 23a provides an oscillator signal (not specifically indicated) from the drain of FET Q1 or Q2 at oscillator frequency $f_O$ given by Eq. 42.

Body voltage $V_B$ can be varied from low supply voltage $V_{LL}$ almost all the way up to high supply voltage $V_{HH}$, i.e., to within amount $V_Y$ of voltage $V_{HH}$, in the VCO of FIG. 22. Amount $V_Y$ here is typically 0.1 V but can be higher or lower, e.g., substantially all the way down to zero. End-range values $V_{Rmax}$ and $V_{Rmin}$ of gate-to-body voltage $V_R$ or $V_{RF}$ respectively are $V_Y-V_F$ and $V_{HH}-V_{LL}-V_F$ where $V_F$ again is 0.6-0.7 V, typically 0.7 V.

Figure 23B:
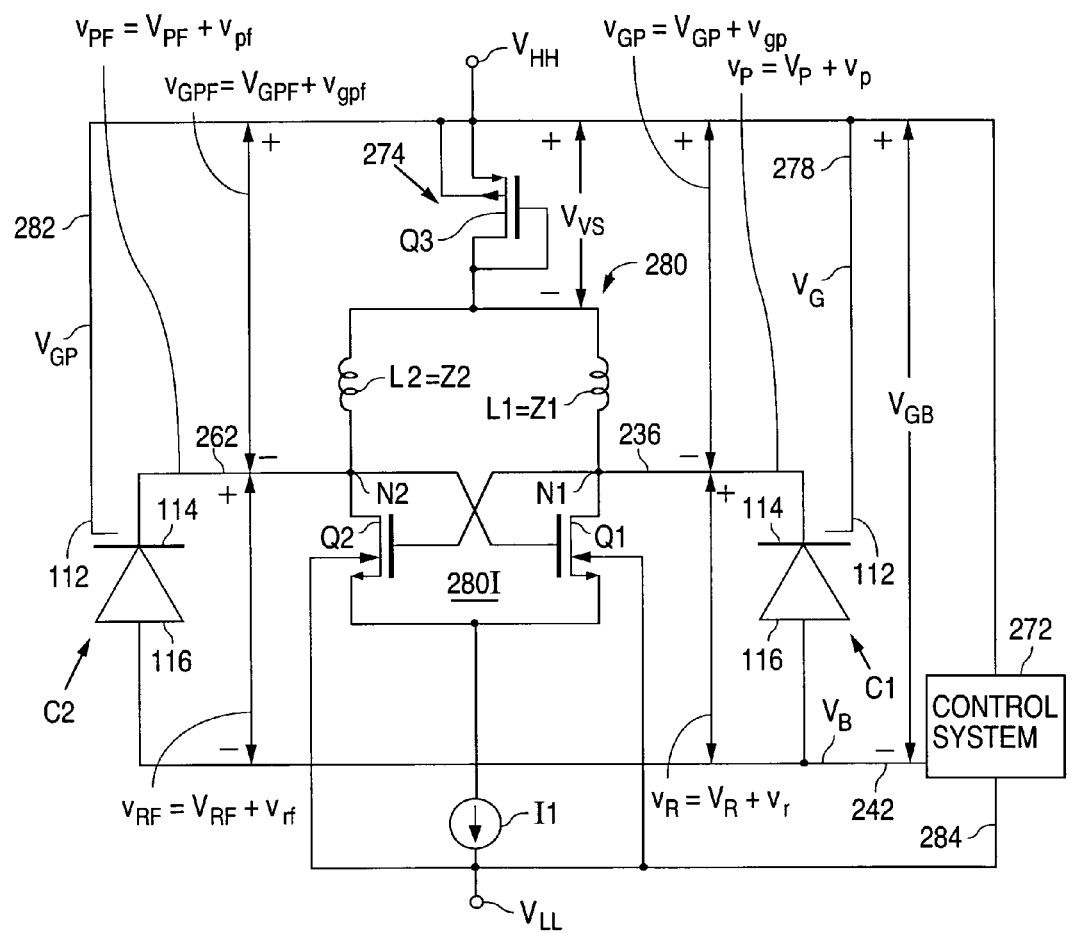

FIG. 23b depicts another VCO implementation of the circuitry of FIG. 22. Except as described below, the VCO of FIG. 23 contains varactors C1 and C2, FETs Q1 and Q2, inductors L1 and L2, and current source I1 configured and operable the same as in the VCO of FIG. 23a. Hence, internal circuitry 280I again consists of FETs Q1 and Q2 and current source I1, while impedance components Z1 and Z2 are implemented with inductors L1 and L2.

In place of diode D2, voltage setter 274 is implemented with a level-shifting p-channel enhancement-mode insulated-gate FET Q3 in the VCO of FIG. 23b. The source of FET Q3 is connected to the $V_{HH}$ high voltage supply. The drain and gate electrode of FET Q3 are connected together and to the interconnected upper ends of inductors L1 and L2.

FET Q3 and current source I1 together set setter voltage $V_{VS}$ at substantially a fixed value. The magnitude of voltage $V_{VS}$ is controlled by adjusting the width-to-length ratio of FET Q3 or/and the magnitude of current $I_S$ flowing through current source I1. Raising the Q3 width-to-length ratio reduces voltage $V_{VS}$, and vice versa. Raising supply current $I_S$ raises voltage $V_{VS}$, and vice versa. Voltage $V_{VS}$ can readily be set at a suitable value in a range extending from as low as zero-point gate threshold $V_{T0}$ to as high as $3V_{T0}$. Voltage $V_{VS}$ is normally somewhat greater than gate threshold voltage $V_{T0}$. For example, when threshold voltage $V_{T0}$ is 0.45 V, a typical value for voltage $V_{VS}$ is 0.6 V. Except for voltage $V_{VS}$ here potentially being less than the $V_F$ implementation of voltage $V_{VS}$ in the VCO of FIG. 23a, voltage $V_{VS}$ is employed in the same way in the VCO of FIG. 23b as in the VCO of FIG. 23a.

The C1 and C2 capacitance signal paths in the general circuitry of FIG. 22 are, in the VCO of FIG. 23a or 23b, extended to be a pair of inductance-capacitance signal paths which respectively include inductors L1 and L2. The comments presented above about the C1 and C2 capacitance signal paths in the general circuitry of FIG. 18 being transformed into a pair of inductance-capacitance signal paths in the VCO of FIG. 19a or 19b apply directly to transforming the capacitance signal paths of FIG. 22 into two inductance-capacitance signal paths in the VCO of FIG. 23a or 23b. Accordingly, varactor C1 and inductor L1 form an oscillatory inductive-capacitive combination in the VCO of FIG. 23a or 23b. Varactor C2 and inductor 12 likewise form an oscillatory inductive-capacitive combination in the VCO of FIG. 23a or 23b.

Varactor Development and Manufacture

In developing an implementation of the present gate-enhanced junction varactor, e.g., an implementation intended for use in an integrated circuit, either an n-channel version or a p-channel version of the varactor is first selected. The selection can be made by an individual such as a circuit designer or by a machine such as a computer. The selection is typically made with the objective of obtaining at least a specified ratio of maximum-to-minimum varactor capacitance.

Assume that an n-channel version of the present varactor is selected. To facilitate the following development/manufacturing description, let the components and characteristics of the n-channel junction varactor be identified by the reference symbols previously defined. The selection of the present n-channel junction varactor is made with the understanding that plate region 102 occupies lateral plate area $A_P$ along upper semiconductor surface 106, that the varactor has a minimum capacitance $C_{Vmin}$ dependent on plate area $A_P$, that inversion layer 130 occupies lateral inversion area $A_I$ along upper surface 106, and that the varactor has a maximum capacitance $C_{Vmax}$ dependent on inversion area $A_I$ in combination with plate area $A_P$.

More particularly, the varactor selection is normally made with the understanding that minimum varactor capacitance $C_{Vmin}$ is approximately proportional to plate area $A_P$ while maximum varactor capacitance $C_{Vmax}$ is approximately proportional to an accumulative combination of inversion area $A_I$ and plate area $A_P$. These relationships can be generally seen by multiplying areal capacitance values $C_{VAmax}$ and $C_{VAmin}$ of Eqs. 14 and 21 by total capacitive area $A_I + A_P$ to respectively produce:

$$C_{Vmax} = K_{SC}\varepsilon_0 \left( \frac{A_P}{t_{dJmin}} + \frac{A_I}{t_{dsmin}} \right) \quad (46)$$

$$C_{Vmin} = \frac{K_{SC}\varepsilon_0 A_P}{t_{dJmax}} \quad (47)$$

Inversion area $A_I$ and plate area $A_P$ are then adjusted, e.g., using Eqs. 46 and 47 or refined versions of Eqs. 46 and 47, to control maximum capacitance $C_{Vmax}$ and minimum capacitance $C_{Vmin}$.

The ratio of inversion area $A_I$ to plate area $A_P$ is adjusted to achieve at least a specified ratio of maximum capacitance $C_{Vmax}$ to minimum capacitance $C_{Vmin}$. Using Eqs. 46 and 47, the $C_{Vmax}/C_{Vmin}$ ratio is the same as the $C_{VAmax}/C_{VAmin}$ areal ratio of Eq. 22 and thus is approximately:

$$\frac{C_{Vmax}}{C_{Vmin}} = \left( \frac{t_{dJmax}}{t_{dJmin}} \right) + \left( \frac{A_I}{A_P} \right) \left( \frac{t_{dJmax}}{t_{dsmin}} \right) \quad (48)$$

Eq. 48 can be employed to provide a first-order estimate of the $A_I/A_P$ area ratio needed to achieve at least a specified value of the $C_{Vmax}/C_{Vmin}$ capacitance ratio. The estimate can then be refined, as needed, using empirical data based on examination of previously fabricated and/or computer simulated gate-enhanced junction varactors of the invention.

In the course of adjusting areas $A_I$ and $A_P$, including setting the $A_I/A_P$ ratio, appropriate lateral dimensions for the n-channel varactor are determined. The varactor is then laid out according to those lateral dimensions using a suitable set of semiconductor design rules appropriate to a semiconductor manufacturing process to be used later in fabricating the varactor.

Figure 24:
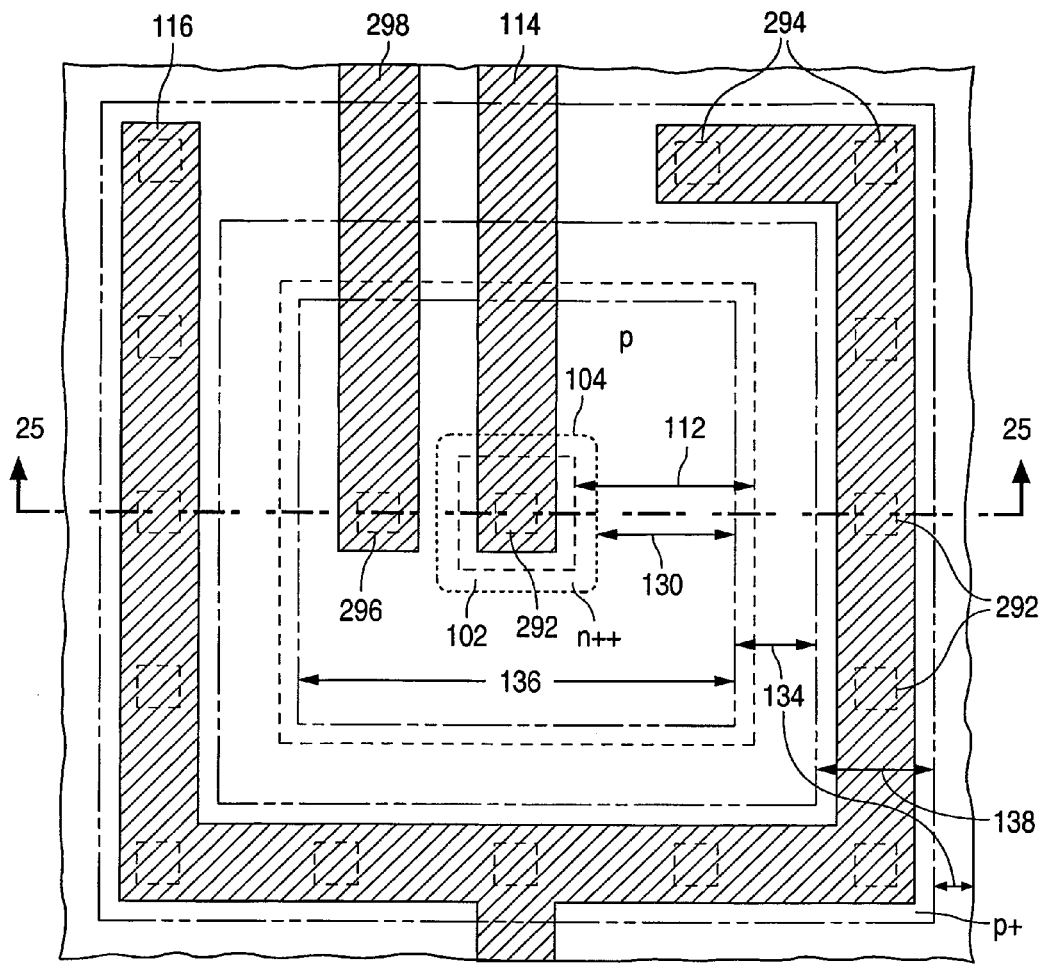
FIG. 24 is a layout (plan) view of a silicon-gate implementation of the gate-enhanced junction varactor of FIGS. 8a and 8b according to the invention.
Figure 25:
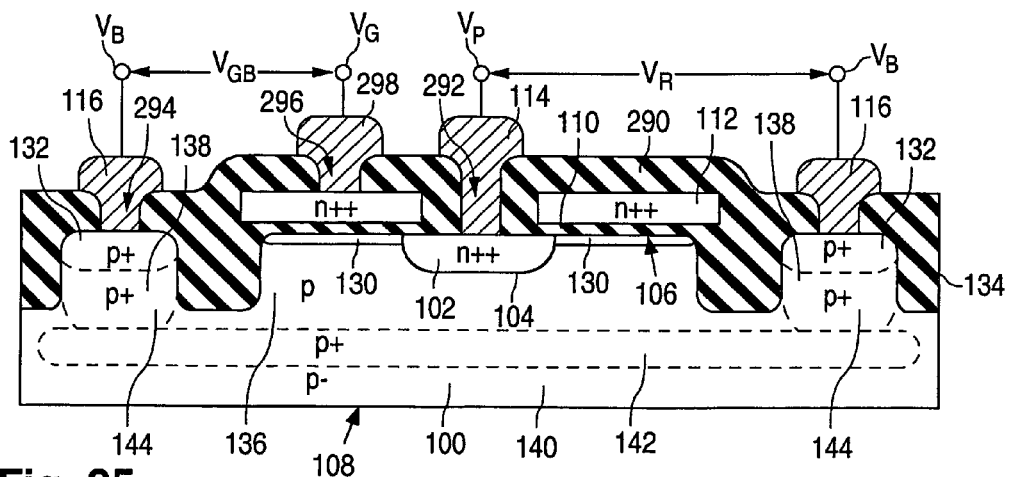
FIG. 25 is a cross-sectional side view of the gate-enhanced junction varactor of FIG. 24. The cross section of FIG. 25 is taken through plane 25-25 in FIG. 24.

FIG. 24 illustrates a layout, in accordance with the invention, of one preferred implementation of the n-channel junction varactor of FIG. 8. FIG. 25 depicts a cross section of the n-channel varactor of FIG. 24 taken along a vertical plane extending through plate region 102. The varactor of FIGS. 24 and 25 contains components 132, 134, 136, 138, 140, 142, and 144 as generally described above in connection with the n-channel junction varactor implementation of FIG. 9b. Gate electrode 112 here consists of n++ polysilicon.

Inversion layer 130 (when present) in the varactor of FIGS. 24 and 25 is shaped generally like a square annulus as viewed generally perpendicular to upper semiconductor surface 106 (or lower semiconductor surface 108). Layer 130 fully laterally surrounds plate region 102. Within semiconductor island 136, body region 100 thus fully laterally surrounds, and extends below all of, plate region 102. Field insulating region 134 laterally adjoins body region 100 in island 136 but is spaced apart from plate region 102. Gate electrode 112 is of a square annular shape similar to that of inversion layer 130.

In the layout of FIG. 24, the lateral dimensions of plate region 102 in the horizontal and vertical directions of the figure are typically chosen in accordance with the minimum feature size (minimum dimension) of the layout design rules. Accordingly, plate area $A_P$ is of the minimum value that can be achieved for area $A_P$ with that set of design rules. This facilitates achieving a high $A_I/A_P$ area ratio and thus a high $C_{Vmax}/C_{Vmin}$ varactor capacitance ratio.

A layer 290 of dielectric material overlies field insulating region 134 and semiconductor islands 136 and 138 above gate electrode 112 in the varactor of FIGS. 24 and 25. Plate electrode 114 contacts plate region 102 through a plate contact opening 292 extending through dielectric layer 290. Body electrode 116 contacts body contact portion 132 of body region 100 through a group, fourteen in the exemplary layout of FIG. 24, of body contact openings 294 extending through layer 290. Body contact openings 294 are distributed relatively uniformly across the lateral area occupied by body contact portion 132 to provide uniform electrical connection to body region 100. A gate contact opening 296 extends through layer 290. An electrical conductive gate line 298, typically consisting of the same metallic material as plate electrode 114 and body electrode 116, contacts gate electrode 112 through gate contact opening 296.

Figure 26:
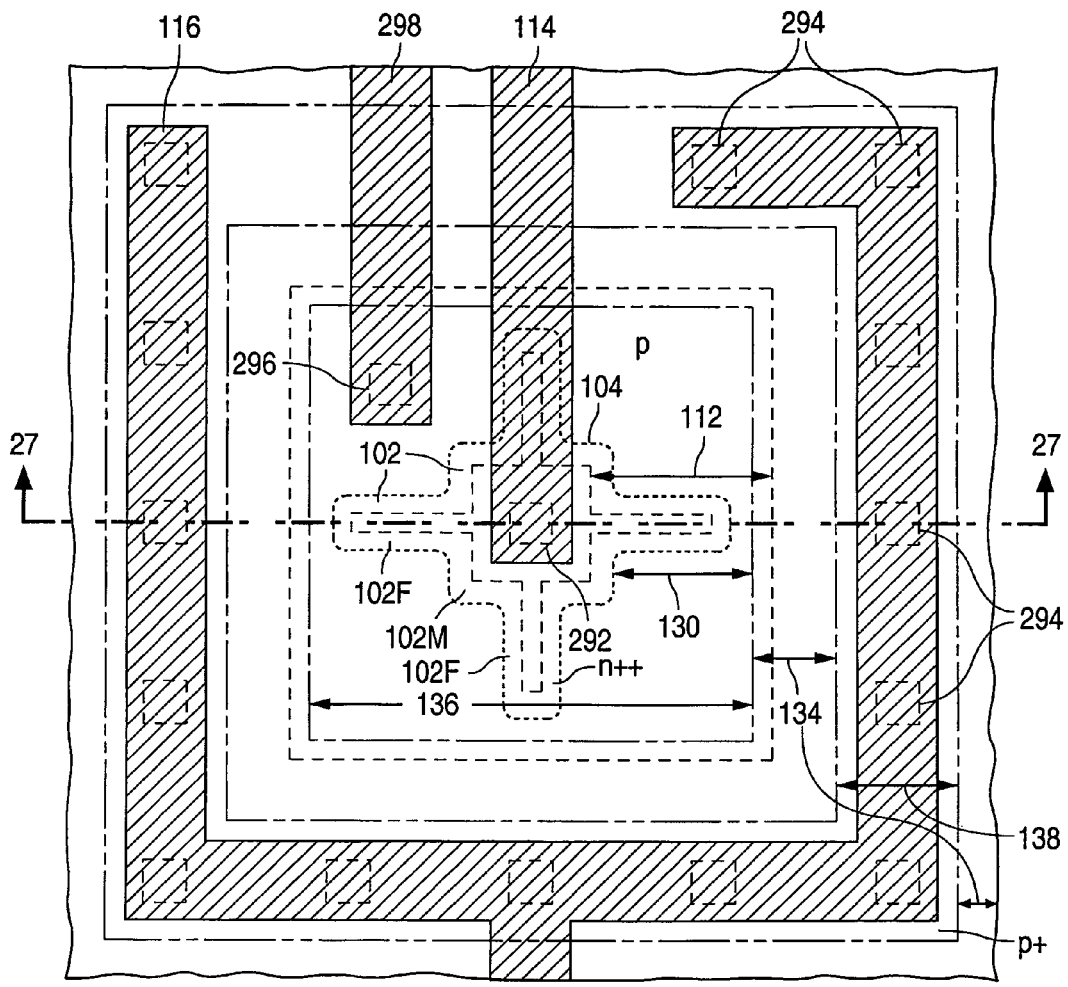
FIG. 26 is a layout view of another silicon-gate implementation of the gate-enhanced junction varactor of FIGS. 8a and 8b according to the invention.
Figure 27:
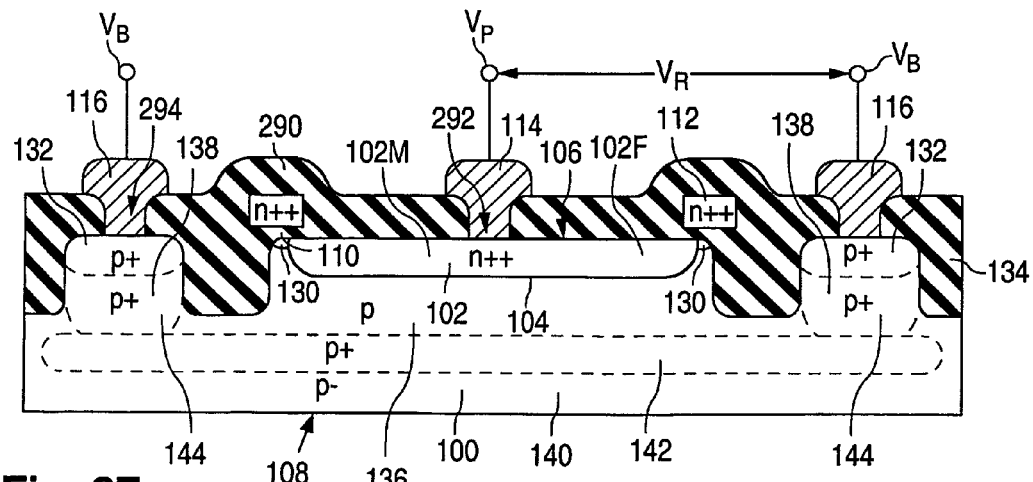
FIG. 27 is a cross-section side view of the gate-enhanced junction varactor of FIG. 26. The cross section of FIG. 27 is taken through plane 27-27 in FIG. 26.

FIG. 26 depicts a layout, in accordance with the invention of another preferred implementation of the n-channel varactor of FIG. 8. The layout of FIG. 26 is directed toward improving the varactor's quality factor. FIG. 27 illustrates a cross section of the n-channel varactor of FIG. 26 taken along a vertical plane extending through plate region 102. Except as indicated below, the varactor of FIGS. 26 and 27 is arranged the same as the varactor of FIGS. 24 and 25.

In the varactor of FIGS. 26 and 27, plate region 102 consists of a main plate portion 102M and one or more, normally at least two, finger portions 102F which are continuous with, and extend laterally away from, main plate portion 102M. As viewed generally perpendicular to upper semiconductor surface 106, main plate portion 102M is roughly square shaped in the exemplary layout of FIG. 26. Nonetheless, plate portion 102M can have other lateral shapes. For example, plate portion 102M can be rectangular, octagonal, hexagonal, circular, and so on as viewed perpendicular to upper surface 106.

Each finger portion 102F extends into semiconductor material that would otherwise form part of body region 100 in semiconductor island 136. Accordingly, each finger portion 102F meets body region 100 to form part of p-n junction 104. When there are two or more finger portions 102F in the varactor, portions 102F are distributed laterally around main plate portion 102M, typically in a relatively uniform manner.

The exemplary layout of FIG. 26 has four finger portions 102F. The varactor of FIGS. 26 and 27 can have more than four finger portions 102F.

As represented in FIG. 26, each finger portion 102F is normally of lesser average lateral dimension in the direction perpendicular to the length of that portion 102F than is main plate portion 102M in that direction. The lateral dimension (or width) of each finger portion 102F in the direction perpendicular to the length of that portion 102F can vary along the length of that portion 102F. Although FIG. 26 illustrates the exemplary situation in which finger portions 102F are straight as viewed perpendicular to upper semiconductor surface 106, one or more of portions 102F can be curved as so viewed. In the multiple-finger situation, finger portions 102F can be of different lengths.

The layout of FIG. 26 provides a tradeoff between quality factor and the minimum achievable value of minimum capacitance $C_{Vmin}$, and thus the maximum achievable value of the $C_{Vmax}/C_{Vmin}$ varactor capacitance ratio, relative to the layout of FIG. 24. The lateral dimension of each finger portion 102F perpendicular to the length of the portion 102F can be chosen in accordance with the minimum feature size of the layout design rules. Nonetheless, because plate region 102 consists of main plate portion 102M and at least one finger portion 102F, the minimum achievable value of plate area $A_P$ is greater in the layout of FIG. 26 than in the layout of FIG. 24. On the other hand, the presence of one or more finger portions 102F improves the quality factor of the layout of FIG. 26 compared to that of FIG. 24.

Inversion layer 130 is shaped like an annulus in the layout of FIG. 26. Due, however, to the presence of finger portions 102F, a slit extends laterally into the inside boundary of layer 130 at the location of each portion 102F. In the layout of FIG. 26, gate electrode 112 is of an annular shape similar to that of inversion layer 130. Due to the presence of one of finger portions 102F, the positioning of gate contact opening 296 and gate line 298 is shifted in the layout of FIG. 26 relative to the layout of FIG. 24.

The present n-channel junction varactor, such as that of FIGS. 24 and 25 or that of FIGS. 26 and 27, is fabricated according to a suitable manufacturing process, typically one having a capability for providing n-channel insulated-gate FETs and thus invariably also p-n diodes, in accordance with the selected layout. The fabrication operation can, for example, be performed according to the semiconductor manufacturing process described in Bulucea et al, U.S. patent application Ser. No. 09/540,442, filed 32 Mar. 2000, the contents of which are incorporated by reference herein.

Briefly stated, fabrication of the present n-channel junction varactor typically entails doping a semiconductor body to achieve the various doped regions such as plate region 102 and body region 100, providing field insulating region 134, forming gate dielectric layer 110, and providing electrodes 112, 114, and 116. Operations analogous and, in some instances, complementary to the preceding operations are performed when the selected varactor is a p-channel version of the present gate-enhanced junction varactor.

Variations

While the invention has been described with respect to particular embodiments, this description is solely for the purpose of illustration and is not to be construed as limiting the scope of the invention claimed below. For example, the semiconductor material occupied by inversion layer 130 or 180 can be doped to change the value of zero-point gate threshold voltage $V_{T0}$ or general gate threshold voltage $V_T$ at which layer 130 or 180 forms when plate-to-body voltage $V_R$ is zero or non-zero value $V_{Ri}$. When the present gate-enhanced junction varactor is an n-channel varactor as generally shown in FIG. 8, the semiconductor material occupied by layer 130 can be provided with additional p-type dopant to raise the value of gate threshold voltage $V_{T0}$ or $V_T$. The operating range for gate-to-body voltage $V_{GB}$ is then shifted upward by an amount corresponding to the increase in threshold voltage $V_{T0}$ or $V_T$.

When the present gate-enhanced junction varactor is a p-channel varactor as generally shown in FIG. 10, the semiconductor material occupied by inversion layer 130 can be provided with additional n-type dopant to lower the value of gate threshold voltage $V_{T0}$ or $V_T$ to obtain a similar operational change. Various modifications and applications may thus be made by those skilled in the art without departing from the true scope and spirit of the present invention as defined in the appended claims.

I claim:

1. A structure comprising:
    a varactor comprising:
        (a) a plate region and a body region of a semiconductor body, the body region being of a first conductivity type, the plate region being of a second conductivity type opposite to the first conductivity type, the plate and body regions meeting each other to form a p-n junction;
        (b) a plate electrode and a body electrode respectively connected to the plate and body regions, the plate electrode being at a plate-to-body bias voltage relative to the body electrode;
        (c) a dielectric layer situated over the semiconductor body and contacting the body region; and
        (d) a gate electrode situated over the dielectric layer at least where the dielectric layer contacts material of the body region, the gate electrode being at a gate-to-body bias voltage relative to the body electrode, the gate-to-body voltage being maintained approximately constant at a non-zero value as the plate-to-body voltage is varied; and
    componentry for maintaining the gate-to-body voltage approximately constant at the non-zero value.

2. A structure as in claim 1 wherein the plate and body regions extend to a primary surface of the semiconductor body.

3. A structure as in claim 2 wherein the plate region occupies a lateral plate area along the primary surface, the varactor has a minimum capacitance dependent on the plate area, an inversion layer that meets the plate region selectively appears and disappears in the body region below the gate electrode under control of the plate and body electrodes, the inversion layer occupies a lateral inversion area along the primary surface, and the varactor has a maximum capacitance dependent on the inversion area in combination with the plate area.

4. A structure as in claim 2 wherein the body region substantially laterally surrounds, and extends below substantially all of, the plate region.

5. A structure as in claim 4 wherein the plate region comprises a main plate portion and at least one finger portion continuous with the main plate portion, extending laterally away from the main plate portion, and meeting the body region therealong.

6. A structure as in claim 1 wherein an inversion layer that meets the plate region selectively appears and disappears in the body region below the gate electrode as the plate-to-body voltage is varied during operation of the varactor.

7. A structure as in claim 1 further including electronic circuitry having a capacitance signal path for receiving the varactor to enable the circuitry to perform an electronic function dependent on the varactor, the plate and body electrodes being situated in the capacitance signal path.

8. A structure as in claim 7 wherein the gate electrode is situated outside the capacitance signal path.

9. A structure as in claim 7 wherein the circuitry includes an inductor situated in the capacitance signal path with the plate and body electrodes to form an oscillatory inductive-capacitive combination whereby the capacitance signal path is an inductance-capacitance signal path.

10. A structure as in claim 9 wherein the gate electrode is situated outside the inductance-capacitance signal path.

11. A structure as in claim 1 wherein a surface depletion region of the body region extends along the dielectric layer below the gate electrode and is spaced apart from a body contact portion of the body region, the body contact portion contacting the body electrode and being more heavily doped than the surface depletion region.

12. A structure comprising:
    a varactor comprising:
        (a) a plate region and a body region of a semiconductor body, the body region being of a first conductivity type, the plate region being of a second conductivity type opposite to the first conductivity type, the plate and body regions meeting each other to form a p-n junction;
        (b) a plate electrode and a body electrode respectively connected to the plate and body regions, the plate electrode being at a plate-to-body bias voltage relative to the body electrode;
        (c) a dielectric layer situated over the semiconductor body and contacting the body region; and
        (d) a gate electrode situated over the dielectric layer at least where the dielectric layer contacts material of the body region, the gate electrode being at a gate-to-body bias voltage relative to the body electrode, the gate-to-body voltage differing from the plate-to-body voltage, the gate-to-body voltage varying as a function of the plate-to-body voltage as the plate-to-body voltage is varied during operation of the varactor to cause an inversion layer that meets the plate region to selectively appear and disappear in the body region below the gate electrode; and
    componentry for causing the gate-to-body voltage to vary as a function of the plate-to-body voltage.

13. A structure as in claim 12 wherein the componentry causes the gate-to-body voltage to vary approximately linearly with the plate-to-body voltage.

14. A structure as in claim 12 wherein the componentry causes the gate-to-body voltage to differ by approximately a constant non-zero amount from the plate-to-body voltage.

15. A structure as in claim 12 wherein the plate and body regions extend to a primary surface of the semiconductor body.

16. A structure as in claim 15 wherein the plate region occupies a lateral plate area along the primary surface, the varactor has a minimum capacitance dependent on the plate area, an inversion layer that meets the plate region occurs in the body region under control of the plate and gate electrodes, the inversion layer occupies a lateral inversion area along the primary surface, and the varactor has a maximum capacitance dependent on the inversion area in combination with the plate area.

17. A structure as in claim 15 wherein the body region substantially laterally surrounds, and extends below substantially all of, the plate region.

49

18. A structure as in claim 17 wherein the plate region comprises a main plate portion and at least one finger portion continuous with the main plate portion, extending laterally away from the main plate portion, and meeting the body region therealong.

19. A structure as in claim 12 further including electronic circuitry having a capacitance signal path for receiving the varactor to enable the circuitry to perform an electronic function dependent on the varactor, the plate and body electrodes being situated in the capacitance signal path.

20. A structure as in claim 19 wherein the gate electrode is situated outside the capacitance signal path.

21. A structure as in claim 19 wherein the circuitry includes an inductor situated in the capacitance signal path with the plate and body electrodes to form an oscillatory inductive-capacitive combination whereby the capacitance signal path is an inductance-capacitance signal path.

22. A structure as in claim 21 wherein the gate electrode is situated outside the inductance-capacitance signal path.

23. A structure as in claim 12 wherein a surface depletion region of the body region extends along the dielectric layer below the gate electrode and is spaced apart from a body contact portion of the body region, the body contact portion contacting the body electrode and being more heavily doped than the surface depletion region.

24. A structure comprising a varactor which comprises:
a plate region and a body region of a semiconductor body, the body region being of a first conductivity type, the plate region being of a second conductivity type opposite to the first conductivity type, the plate and body regions extending to a primary surface of the semiconductor body and meeting each other to form a p-n junction, the plate region comprising a main plate portion and a plurality of finger portions continuous with the main plate portion, extending laterally away from the main plate portion, and meeting the body region therealong, at least two of the finger portions extending longitudinally non-parallel to one another;
a dielectric layer situated over the semiconductor body and contacting the plate region; and
a gate electrode situated over the dielectric layer at least where the dielectric layer contacts material of the body region.

25. A structure as in claim 24 wherein each finger portion is of lesser average dimension in the lateral direction perpendicular to that finger portion than is the main plate portion in that direction.

26. A structure as in claim 24 wherein the body region substantially laterally surrounds, and extends below substantially all of, the plate region including each finger portion.

27. A structure as in claim 24 further including a field insulating region extending into the semiconductor body along its primary surface, the field insulating region laterally adjoining the body region.

28. A structure as in claim 27 wherein the field insulating region laterally surrounds a semiconductor island substantially fully occupied by material of the plate and body regions.

29. A structure as in claim 24 wherein two of the finger portions extend longitudinally largely perpendicular to each other.

30. A structure as in claim 24 wherein there are at least four finger portions.

31. A structure as in claim 24 wherein the varactor further includes a plate electrode and a body electrode respectively connected to the plate and body regions, an inversion layer that meets the plate region selectively appearing and disappearing in the body region below the gate electrode as a plate-to-body bias voltage applied between the plate and the body electrodes is varied during operation of the structure.

32. A structure comprising:
a varactor comprising (a) a plate region and a body region of a semiconductor body, (b) a plate electrode and a body electrode respectively connected to the plate and body regions, (c) a dielectric layer situated over the semiconductor body and contacting the body region, and (d) a gate electrode situated over the dielectric layer at least where the dielectric layer contacts material of the body region, the body region being of a first conductivity type, the plate region being of a second conductivity type opposite to the first conductivity type, the plate and body regions meeting each other to form a p-n junction, a surface depletion region of the body region extending along the dielectric layer below the gate electrode and being spaced apart from a body contact portion of the body region, the body contact portion contacting the body electrode and being more heavily doped than the surface depletion region, the plate region comprising a main plate portion and at least one finger portion continuous with the main plate portion, extending laterally away from the main plate portion, and meeting the body region therealong; and
electronic circuitry having a capacitance signal path for receiving the varactor to enable the circuitry to perform an electronic function dependent on the varactor, the plate and body electrodes being situated in the capacitance signal path.

33. A structure as in claim 32 wherein each finger portion is of lesser average dimension in the lateral direction perpendicular to that finger portion than is the main plate portion in that direction.

34. A structure as in claim 32 wherein there are at least two finger portions.

35. A structure as in claim 34 wherein at least two of the finger portions extend longitudinally non-parallel to another.

36. A structure as in claim 32 wherein there are at least four finger portions.

37. A structure as in claim 32 wherein an inversion layer that meets the plate region selectively appears and disappears in the body region below the gate electrode as a plate-to-body bias voltage applied between the plate and body electrodes is varied during operation of the varactor.

38. A structure as in claim 32 wherein the gate electrode is situated outside the capacitance signal path.

39. A structure as in claim 32 wherein the circuitry includes an inductor situated in the capacitance signal path with the plate and body electrodes to form an oscillatory inductive-capacitive combination whereby the capacitance signal path is an inductance-capacitance signal path.

40. A structure as in claim 39 wherein the gate electrode is situated outside the inductance-capacitance signal path.

41. A structure as in claim 32 wherein the plate region is a substantially unitary region.

42. A structure comprising:
a varactor comprising (a) a plate region and a body region of a semiconductor body, (b) a plate electrode and a body electrode respectively connected to the plate and body regions, (c) a dielectric layer situated over the semiconductor body and contacting the body region, and (d) a gate electrode situated over the dielectric layer at least where the dielectric layer contacts material of the body region, the body region being of a first conductivity type, the plate region being of a second conductivity type opposite to the first conductivity type, the plate and body regions meeting each other to form a p-n junction and extending to a primary surface of the semiconductor body, a surface depletion region of the body region extending along the dielectric layer below the gate electrode and being spaced apart from a body contact portion of the body region, the body contact portion contacting the body electrode and being more heavily doped than the surface depletion region; and a field insulating region extending into the semiconductor body along the primary surface to define a semiconductor island laterally surrounded by the field insulating region and substantially fully occupied by material of the plate and body regions.

43. A structure as in claim 42 wherein the body contact portion extends up to the primary surface.

44. A structure as in claim 42 wherein the body contact portion occupies at least part of a further semiconductor island laterally surrounded by the field insulating region such that material of the body region extends continuously between the semiconductor islands.

45. A structure as in claim 42 wherein the plate region comprises a main plate portion and at least one finger portion continuous with the main plate portion, extending laterally away from the main plate portion, and meeting the body region therealong.

46. A structure as in claim 45 wherein each finger portion is of lesser average dimension in the lateral direction perpendicular to that finger portion than is the main plate portion in that direction.

47. A structure as in claim 45 wherein there are at least two finger portions.

48. A structure as in claim 42 wherein an inversion layer that meets the plate region selectively appears and disappears in the body region below the gate electrode as a plate-to-body bias voltage applied between the plate and body electrodes is varied during operation of the varactor.

49. A structure as in claim 42 wherein the plate region is a substantially unitary region.

50. A structure as in claim 42 wherein the body region substantially laterally surrounds, and extends below substantially all of, the plate region.

* * * * *